United States Patent
Long et al.

(10) Patent No.: US 12,416,831 B2
(45) Date of Patent: Sep. 16, 2025

(54) BACKLIGHT STRUCTURE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Chunping Long, Beijing (CN); Jian Xu, Beijing (CN); Heling Zhu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/850,525

(22) PCT Filed: Sep. 19, 2023

(86) PCT No.: PCT/CN2023/119785
§ 371 (c)(1),
(2) Date: Sep. 24, 2024

(87) PCT Pub. No.: WO2024/061232
PCT Pub. Date: Mar. 28, 2024

(65) Prior Publication Data
US 2025/0216717 A1   Jul. 3, 2025

(30) Foreign Application Priority Data

Sep. 21, 2022   (CN) .......................... 202211146615.6

(51) Int. Cl.
*G02F 1/00*       (2006.01)
*G02F 1/1335*     (2006.01)
*G02F 1/13357*    (2006.01)

(52) U.S. Cl.
CPC .. *G02F 1/133603* (2013.01); *G02F 1/133607* (2021.01)

(58) Field of Classification Search
None
See application file for complete search history.

(56) References Cited

U.S. PATENT DOCUMENTS 9,666,105 B2   5/2017 Cox et al.
2007/0152135 A1*   7/2007 Watanabe ......... G02F 1/133603
                                              250/208.1

(Continued)

FOREIGN PATENT DOCUMENTS

CN   106875879 A   6/2017
CN   108563068 A   9/2018

(Continued)

OTHER PUBLICATIONS

The First Chinese Office Action; dated Nov. 1, 2022; Appln. No. 202211146615.6.

(Continued)

*Primary Examiner* — Gerald J Sufleta, II

(57) ABSTRACT

A backlight structure and a display device are provided. The backlight structure includes a barrier wall pattern and light-emitting units. The barrier wall pattern includes openings and a barrier wall surrounding the openings, the openings are configured to define light regions; and the light-emitting units are distributed in the light regions. The backlight structure includes a central region and an edge region, each light region is provided with at least three light-emitting units, centers of M light-emitting units, closest to vertex angles of the light region are sequentially connected to form an M-sided polygon, and a distance between a center of the M-sided polygon and a center of the light region is less than 10% of a pitch of the light region, and an included angle (Continued)

between each of the first direction and the second direction and each side of the M-sided polygon is greater than 0 degrees.

20 Claims, 22 Drawing Sheets

(56) References Cited

U.S. PATENT DOCUMENTS

| | | | |
|---|---|---|---|
| 2007/0159849 A1* | 7/2007 | Sakai | G02F 1/133605 362/612 |
| 2010/0231804 A1 | 9/2010 | Hisakawa | |
| 2014/0334144 A1* | 11/2014 | Matsuura | G02F 1/133603 362/231 |
| 2015/0359067 A1* | 12/2015 | Kurita | G02F 1/133603 315/151 |
| 2018/0128458 A1* | 5/2018 | Fukasawa | F21K 9/64 |
| 2019/0146278 A1* | 5/2019 | Son | G02F 1/133606 349/64 |
| 2021/0088713 A1* | 3/2021 | Chen | G02B 6/0068 |
| 2021/0233969 A1* | 7/2021 | Sun | H10K 59/122 |
| 2021/0404628 A1* | 12/2021 | Jin | G02F 1/133607 |
| 2022/0066266 A1* | 3/2022 | Ota | F21V 9/30 |
| 2022/0113465 A1 | 4/2022 | Chen et al. | |
| 2024/0219771 A1* | 7/2024 | Wang | G02F 1/133606 |

FOREIGN PATENT DOCUMENTS

| | | |
|---|---|---|
| CN | 108572481 A | 9/2018 |
| CN | 108803136 A | 11/2018 |
| CN | 109116631 A | 1/2019 |
| CN | 109166906 A | 1/2019 |
| CN | 106097900 B | 4/2019 |
| CN | 110275349 A | 9/2019 |
| CN | 113972196 A | 1/2022 |
| CN | 114005850 A | 2/2022 |
| CN | 114373854 A | 4/2022 |
| CN | 115047678 A | 9/2022 |
| KR | 100819657 B1 | 3/2008 |
| TW | M405521 U | 6/2011 |
| TW | 201231860 A | 8/2012 |
| TW | 1518952 B | 1/2016 |
| TW | 1660018 B | 5/2019 |
| TW | 1696018 B | 6/2020 |
| TW | 1750466 B | 12/2021 |
| TW | 202209710 A | 3/2022 |
| TW | 1771680 B | 7/2022 |
| WO | 2021/051347 A1 | 3/2021 |

OTHER PUBLICATIONS

The First Taiwanese Office Action: Appln. No. 112125237; dated May 30, 2024.
The International Search Report and Written Opinion both mailed Nov. 21, 2023; PCT/CN2023/119785.
The Extended European Search Report dated Jun. 4, 2025; Appln. No. 23867519.3.

* cited by examiner

BACKLIGHT STRUCTURE AND DISPLAY DEVICE

The present application is a National Stage of International Application No. PCT/CN2023/119785, filed Sep. 19, 2023, which claims priority to and the benefit of Chinese Patent Application No. 202211146615.6, filed Sep. 21, 2022, the entireties of which are hereby incorporated herein by reference.

TECHNICAL FIELD

Embodiments of the present disclosure relate to a backlight structure and a display device.

BACKGROUND

Display devices used widely at present include thin-film transistor liquid crystal display (TFT-LCD) devices, which have the advantages of long life, high display brightness, high contrast, and wide color gamut.

Mini light-emitting diodes (Mini LEDs) can be used as backlights of the thin film transistor liquid crystal display devices. When a Mini LED used as a backlight is combined with a conventional liquid crystal display panel, by controlling brightness of the Mini LED to enable it to match gray scale presented by the display panel, a liquid crystal display device may have a high contrast ratio comparable to that of an organic light-emitting diode display device.

SUMMARY

Embodiments of the present disclosure provide a backlight structure and a display device.

An embodiment of the present disclosure provides a backlight structure, which includes a substrate and a barrier wall pattern and a plurality of light-emitting units located on the substrate. The barrier wall pattern includes a plurality of openings arrayed along a first direction and a second direction and a barrier wall surrounding the openings, the plurality of openings is configured to define a plurality of light regions, and the first direction intersects the second direction; and the plurality of light-emitting units is distributed in the plurality of light regions. The substrate includes a central region and an edge region surrounding the central region, each light region at least in the central region is provided with at least three light-emitting units, centers of M light-emitting units, closest to vertex angles of the light region, among the at least three light-emitting units are sequentially connected to form an M-sided polygon, and a distance between a center of the M-sided polygon and a center of the light region is less than 10% of a pitch of the light region, and an included angle between the first direction and each side of the M-sided polygon and an included angle between the second direction and each side of the M-sided polygon are both greater than 0 degrees.

For example, according to an embodiment of the present disclosure, a ratio of lengths of different sides of the M-sided polygon is 0.9 to 1.1, and a ratio of the pitch of the light region to a side length of the M-sided polygon is 1.7 to 2.3.

For example, according to an embodiment of the present disclosure, the pitch of the light region is P, each of at least some of the light regions includes N light-emitting units, where N≥M, a distance from a center of an i-th light-emitting unit to a vertex angle of the light region is $L_i$, i takes a value in the range from 1 to N, and $L_i$, P, and N satisfy:
$8.5 \geq P \times (1/L_1 + 1/L_2 + \ldots + 1/L_N) \geq 6.3$.

For example, according to an embodiment of the present disclosure, a light intensity distribution I of the light-emitting unit satisfies: $I = I_0 \cos m\alpha$, $I_0$ is the light intensity distribution along a direction of a normal perpendicular to a light exit surface of the light-emitting unit, $\alpha$ is an included angle between a light-emitting direction of the light-emitting unit and the normal, $m = (-\ln 2)/(\ln \cos \alpha_{1/2})$, $\alpha_{1/2}$ is an included angle between the light-emitting direction and the normal when the light intensity is reduced to half of the light intensity corresponding to the normal direction, and a light ray emitted by the light-emitting unit has an optical path of h in the normal direction; and each of the at least some of the light regions includes N light-emitting units, where N≥M, a distance from a center of an i-th light-emitting unit to a vertex angle of the light region is $L_i$, i takes a value in the range from 1 to N, and $L_i$, h, and N satisfy:

$$0.5 \geq \{\cos m \times [(\pi/2) - (h/L_1)] + \cos m \times [(\pi/2) - (h/L_2)] + \ldots + \cos m \times [(\pi/2) - (h/L_N)]\} \geq 0.23.$$

For example, according to an embodiment of the present disclosure, a ratio of a light intensity at an edge position of the light region to a light intensity at a center position of the light region is not less than 0.5.

For example, according to an embodiment of the present disclosure, each of the at least some of the light regions includes at least four light-emitting units, the at least four light-emitting units are arranged to form the M-sided polygon, and an included angle between one of the first direction and the second direction and at least one side of the M-sided polygon is 12 to 18 degrees.

For example, according to an embodiment of the present disclosure, each of the at least some of the light regions is in the shape of a first square, each of the at least some of the light regions includes at least four light-emitting units, the M-sided polygon is a second square, and an included angle between a diagonal of the first square and a diagonal of the second square is 12 to 18 degrees.

For example, according to an embodiment of the present disclosure, at least some of the light regions are in the shape of a rectangle, and two adjacent sides of the rectangle extend along the first direction and the second direction, respectively.

For example, according to an embodiment of the present disclosure, the light-emitting units disposed in each light region are electrically connected, and the barrier wall includes a shading material.

For example, according to an embodiment of the present disclosure, the light-emitting unit includes a light-emitting diode chip and an encapsulation structure configured to encapsulate the light-emitting diode chip, and there is a spacing between encapsulation structures of adjacent light-emitting units.

For example, according to an embodiment of the present disclosure, a maximum size of the light-emitting unit in a direction parallel to the substrate is not greater than 500 μm.

For example, according to an embodiment of the present disclosure, the at least four light-emitting units include four light-emitting units, and centers of the four light-emitting units are sequentially connected to form the second square.

For example, according to an embodiment of the present disclosure, the at least four light-emitting units include five light-emitting units, and centers of four light-emitting units, located at outermost edges, of the five light-emitting units are sequentially connected to form the second square.

For example, according to an embodiment of the present disclosure, each of the at least some of the light regions includes three light-emitting units, centers of the three light-emitting units are sequentially connected to form a triangle, and an included angle between one of the first direction and the second direction and one side of the triangle is less than 5 degrees.

For example, according to an embodiment of the present disclosure, a thickness of the barrier wall is greater than a height of the light-emitting unit in a direction perpendicular to the substrate.

For example, according to an embodiment of the present disclosure, the thickness of the barrier wall is 200 to 400 μm and the height of the light-emitting unit is 50 to 100 μm.

For example, according to an embodiment of the present disclosure, the thickness of the barrier wall is 250 to 270 μm, a width of the barrier wall is 350 to 500 μm, and the height of the light-emitting unit is 80 to 100 μm.

For example, according to an embodiment of the present disclosure, the backlight structure further includes: a flat adhesive, located between the barrier wall and each light-emitting unit, and between two adjacent light-emitting units. A thickness of the flat adhesive is not less than the height of the light-emitting unit and is less than the thickness of the barrier wall, an orthographic projection, on the substrate, of a surface of one side of the flat adhesive close to the substrate is completely located in an orthographic projection, on the substrate, of a surface of one side of the flat adhesive away from the substrate.

For example, according to an embodiment of the present disclosure, a cross section of the flat adhesive intercepted by a plane where a line connecting centers of the two adjacent light-emitting units is located is in the shape of a trapezoid, a length of a first base side of the trapezoid away from the substrate is greater than a length of a second base side of the trapezoid close to the substrate, a distance between endpoints, close to each other, of an orthographic projection of the first base side and an orthographic projection of the second base side on the substrate is 17 to 32 μm, and the plane is perpendicular to the substrate.

For example, according to an embodiment of the present disclosure, the substrate is provided with thermally conductive adhesive on a side away from the light-emitting units, and the thermally conductive adhesive is provided with at least one hole.

For example, according to an embodiment of the present disclosure, the backlight structure further includes: a light diffusion structure, located on a side of the light-emitting unit away from the substrate. The light diffusion structure includes at least one layer of a diffusion film, and the diffusion film has a thickness of 0.05 to 0.2 mm.

For example, according to an embodiment of the present disclosure, the backlight structure further includes: a color conversion structure, located on a side of the light diffusion structure away from the light-emitting units. The color conversion structure includes a color conversion film configured to convert first color light into second color light, the first color light includes blue light, and the second color light includes at least one of red light and green light.

For example, according to an embodiment of the present disclosure, the color conversion structure further includes a prism located on a side of the color conversion film away from the light-emitting units.

For example, according to an embodiment of the present disclosure, the backlight structure further includes: a prism structure located on a side of the color conversion structure away from the light-emitting units. The prism structure includes at least one prism layer, and the prism layer has a thickness of 0.05 to 0.2 mm.

Another embodiment of the present disclosure provides a backlight structure, which includes a substrate and a barrier wall pattern and a plurality of light-emitting units located on the substrate. The barrier wall pattern includes a plurality of openings arrayed along a first direction and a second direction and a barrier wall surrounding the openings, the plurality of openings is configured to define a plurality of light regions, and the first direction intersects the second direction; and the plurality of light-emitting units is distributed in the plurality of light regions. At least three light-emitting units are disposed in each of at least some light regions, centers of M light-emitting units of the at least three light-emitting units closest to vertex angles of the light region are sequentially connected to form an M-sided polygon, a distance between a center of the M-sided polygon and a center of the light region is less than 10% of a pitch of the light region, a ratio of lengths of different sides of the M-sided polygon is 0.9 to 1.1, and a ratio of the pitch of the light region to a side length of the M-sided polygon is 1.7 to 2.3; and at least one side of the M-sided polygon is parallel to at least one of the first direction and the second direction.

For example, according to an embodiment of the present disclosure, each of the at least some of the light regions includes N light-emitting units, where N≥M, a distance from a center of an i-th light-emitting unit to a vertex angle of the light region is $L_i$, i takes a value in the range from 1 to N, and $L_i$, P, and N satisfy: $8.5 \geq P \times (1/L_1 + 1/L_2 + \ldots + 1/L_N) \geq 6.3$.

For example, according to an embodiment of the present disclosure, a light intensity distribution I of the light-emitting unit satisfies: $I = I_0 \cos m\alpha$, $I_0$ is the light intensity distribution along a direction of a normal perpendicular to a light exit surface of the light-emitting unit, $\alpha$ is an included angle between a light-emitting direction of the light-emitting unit and the normal, $m = (-\ln 2)/(\ln \cos \alpha_{1/2})$, $\alpha_{1/2}$ is an included angle between the light-emitting direction and the normal when the light intensity is reduced to half of the light intensity corresponding to the normal direction, and a light ray emitted by the light-emitting unit has an optical path of h in the normal direction; and each of the at least some of the light regions includes N light-emitting units, where N≥M, a distance from a center of an i-th light-emitting unit to a vertex angle of the light region is $L_i$, i takes a value in the range from 1 to N, and $L_i$, h, and N satisfy:

$$0.5 \geq (\cos m \times [(\pi/2) - (h/L_1)] + \cos m \times [(\pi/2) - (h/L_2)] + \ldots + \cos m \times [(\pi/2) - (h/L_N)] \geq 0.23.$$

For example, according to an embodiment of the present disclosure, a ratio of a light intensity at an edge position of the light region to a light intensity at a center position of the light region is not less than 0.5.

For example, according to an embodiment of the present disclosure, each of the at least some of the light regions includes at least four light-emitting units, the at least four light-emitting units are arranged to form the M-sided polygon, and an included angle between one of the first direction and the second direction and at least one side of the M-sided polygon is 0 degrees.

For example, according to an embodiment of the present disclosure, each of the at least some of the light regions is in the shape of a first square, each of the at least some of the light regions includes at least four light-emitting units, the M-sided polygon is a second square, and an included angle between a diagonal of the first square and a diagonal of the second square is 0 degrees.

For example, according to an embodiment of the present disclosure, the at least four light-emitting units include four light-emitting units, and centers of the four light-emitting units are sequentially connected to form the second square.

For example, according to an embodiment of the present disclosure, each of the at least some of the light regions includes three light-emitting units, centers of the three light-emitting units are sequentially connected to form a triangle, and one side of the triangle extends in either the first direction or the second direction.

For example, according to an embodiment of the present disclosure, the light-emitting units disposed in each light region are electrically connected, and the barrier wall includes a shading material.

For example, according to an embodiment of the present disclosure, the light-emitting unit includes a light-emitting diode chip and an encapsulation structure configured to encapsulate the light-emitting diode chip, and there is a spacing between encapsulation structures of adjacent light-emitting units.

For example, according to an embodiment of the present disclosure, a maximum size of the light-emitting unit in a direction parallel to the substrate is not greater than 500 μm.

For example, according to an embodiment of the present disclosure, at least some of the light regions are in the shape of a rectangle, and two adjacent sides of the rectangle extend along the first direction and the second direction, respectively.

For example, according to an embodiment of the present disclosure, a thickness of the barrier wall is 250 to 270 μm, a width of the barrier wall is 350 to 500 μm, and a height of the light-emitting unit is 80 to 100 μm.

For example, according to an embodiment of the present disclosure, the backlight structure further includes: a flat adhesive, located between the barrier wall and each light-emitting unit, and between two adjacent light-emitting units. A thickness of the flat adhesive is not less than the height of the light-emitting unit and is less than the thickness of the barrier wall, an orthographic projection, on the substrate, of a surface of one side of the flat adhesive close to the substrate is completely located in an orthographic projection, on the substrate, of a surface of one side of the flat adhesive away from the substrate.

For example, according to an embodiment of the present disclosure, a cross section of the flat adhesive intercepted by a plane where a line connecting centers of the two adjacent light-emitting units is located is in the shape of a trapezoid, a length of a first base side of the trapezoid away from the substrate is greater than a length of a second base side of the trapezoid close to the substrate, a distance between endpoints, close to each other, of an orthographic projection of the first base side and an orthographic projection of the second base side on the substrate is 17 to 32 μm, and the plane is perpendicular to the substrate.

Another embodiment of the present disclosure provides a display device, which includes: a display panel, and a backlight structure as mentioned above. The display panel is located on a light exit side of the backlight structure.

BRIEF DESCRIPTION OF DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
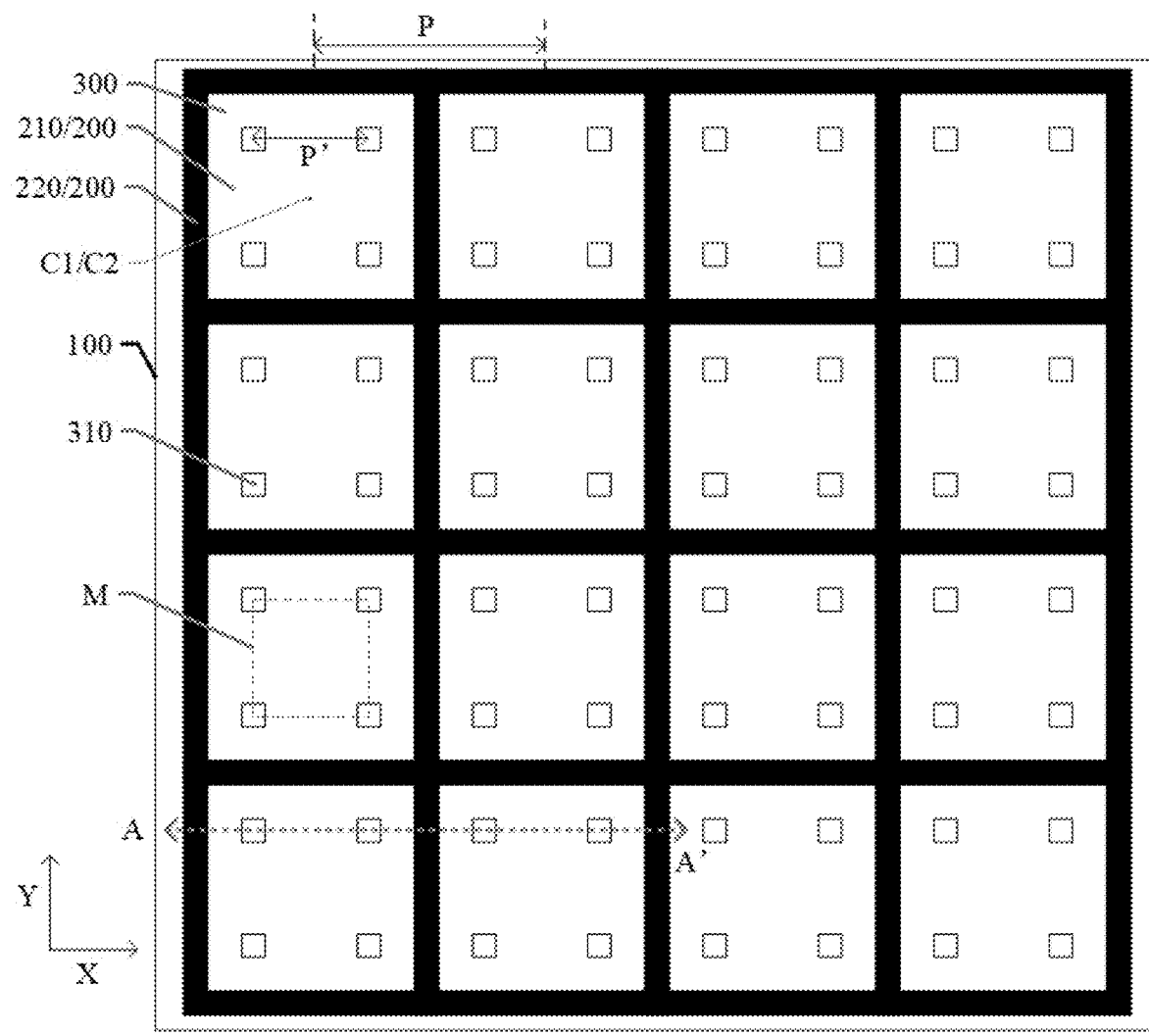
FIG. 1 is a schematic diagram of a partial planar structure of a backlight structure according to an example of an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

The features "parallel", "perpendicular" and "same" used in the embodiments of the present disclosure all include features such as "parallel", "perpendicular" and "same" in the strict sense, and the cases having certain errors, such as "approximately parallel", "approximately perpendicular", "approximately the same" or the like, taking into account measurements and errors associated with the measurement of a particular quantity (e.g., limitations of the measurement system), and indicate being within an acceptable range of deviation for a particular value as determined by one of ordinary skill in the art. For example, "approximately" may indicate being within one or more standard deviations, or within 10% or 5% of the stated value. In the case that the quantity of a component is not specifically indicated below in the embodiments of the present disclosure, it means that the component may be one or more, or may be understood as at least one. "At least one" means one or more, and "plurality" means at least two.

The present disclosure provides a backlight structure and a display device. The backlight structure includes a substrate, and a barrier wall pattern and a plurality of light-emitting units that are located on the substrate. The barrier wall pattern includes a plurality of openings arrayed along a first direction and a second direction and a barrier wall surrounding the openings, the plurality of openings is configured to define a plurality of light regions; and the plurality of light-emitting units is distributed in the plurality of light regions. The substrate includes a central region and an edge region surrounding the central region, each light region at least in the central region is provided with at least three light-emitting units, centers of M light-emitting units, closest to vertex angles of the light region, among the at least three light-emitting units are sequentially connected to form an M-sided polygon, a distance between a center of the M-sided polygon and a center of the light region is less than 10% of a pitch of the light region, and an included angle between the first direction and each side of the M-sided polygon and an included angle between the second direction and each side of the M-sided polygon are both greater than 0 degrees.

In the backlight structure provided in the present disclosure, the setting of the included angle between each side of the M-sided polygon and the first direction and the included angle between each side of the M-sided polygon and the second direction is conducive to improving the light emitting uniformity.

The present disclosure further provides another backlight structure. The backlight structure includes a substrate, and a barrier wall pattern and a plurality of light-emitting units that are located on the substrate. The barrier wall pattern includes a plurality of openings arrayed along a first direction and a second direction and a barrier wall surrounding the openings, the plurality of openings is configured to define a plurality of light regions; and the plurality of light-emitting units is distributed in the plurality of light regions. At least three light-emitting units are disposed in each of at least some light regions, centers of M light-emitting units of the at least three light-emitting units closest to vertex angles of the light region are sequentially connected to form an M-sided polygon, a distance between a center of the M-sided polygon and a center of the light region is less than 10% of a pitch of the light region, a ratio of lengths of different sides of the M-sided polygon is 0.9 to 1.1, and a ratio of the pitch of the light region to a side length of the M-sided polygon is 1.7 to 2.3; and at least one side of the M-sided polygon is parallel to at least one of the first direction and the second direction.

In the backlight structure provided in the present disclosure, the setting of a relationship between the side length of the M-sided polygon and the pitch of the light region, the setting of a relationship between the center of the M-sided polygon and the center of the light region, and at least one side of the M-sided polygon being parallel to at least one of the first direction and the second direction are conducive to improving the light emitting uniformity.

The following describes, with reference to the accompanying drawings, the backlight structure and the display device provided in embodiments of the present disclosure.

FIG. 1 is a schematic diagram of a partial planar structure of a backlight structure according to an example of an embodiment of the present disclosure. As shown in FIG. 1, the backlight structure includes a substrate 100, and a barrier wall pattern 200 and a plurality of light-emitting units 310 that are located on the substrate 100. The barrier wall pattern 200 includes a plurality of openings 210 arrayed along a first direction and a second direction and a barrier wall 220 surrounding the openings 210, the plurality of openings 210 is configured to define a plurality of light regions 300, and the first direction intersects the second direction. The plurality of light-emitting units 310 is distributed in the plurality of light regions 300. At least three light-emitting units 310 are disposed in each of at least some of the light regions 300, centers of M light-emitting units 310 of the at least three light-emitting units 310 closest to vertex angles of the light region 300 are sequentially connected to form an M-sided polygon, a distance between the center C1 of the M-sided polygon and the center C2 of the light region is less than 10% of the pitch P of the light region 300, a ratio of lengths of different sides of the M-sided polygon is 0.9 to 1.1, and a ratio of the pitch P of the light region 300 to a side length P' of the M-sided polygon is 1.7 to 2.3; and at least one side of the M-sided polygon is parallel to at least one of the first direction and the second direction.

According to the present disclosure, the setting of a relationship between the side length of the M-sided polygon and the pitch of the light region, the setting of a relationship between the center of the M-sided polygon and the center of the light region, and at least one side of the M-sided polygon being parallel to at least one of the first direction and the second direction are conducive to improving the light emitting uniformity.

For example, one of the first direction and the second direction is a direction X shown in FIG. 1, and the other of the first direction and the second direction may be a direction Y shown in FIG. 1. This embodiment of the present disclosure is schematically described with the first direction being the direction X and the second direction being the direction Y.

For example, the first direction is perpendicular to the second direction.

For example, an included angle between the first direction and the second direction may be 80 to 110 degrees, or 85 to 100 degrees, or 88 to 92 degrees. This embodiment of the present disclosure is not limited thereto, and the first direction may be interchanged with the second direction.

For example, as shown in FIG. 1, the plurality of openings 210 corresponds to the plurality of light regions 300 one by one, and each of the openings 210 is used to define one light region 300.

For example, the number of the light-emitting units 310 distributed in different light regions 300 may be the same or different.

For example, this embodiment of the present disclosure schematically shows the same number of light-emitting units distributed in different light regions, and the light-emitting units in different light regions are arranged in the same shape, thus improving the light emitting uniformity of the backlight structure.

For example, as shown in FIG. 1, the plurality of light regions 300 is evenly distributed, and the plurality of light-emitting units 310 located on the substrate 100 is evenly distributed.

For example, the number of light-emitting units 310 distributed in some of the light regions 300 in a region in the substrate 100 is the same, and the number of light-emitting units 310 distributed in some of the light regions 300 in another region in the substrate 100 is different. The positions of the two regions described above may be set according to the product requirements, for example, one of the regions may be located in a central region of the substrate, and the other region may be an edge region of the substrate; or one of the regions may be located in the edge region of the substrate, and the other region may be located in the central region of the substrate; or both the two regions are located in different edge regions of the substrate.

For example, as shown in FIG. 1, M is not greater than the number of light-emitting units 310 disposed in each light region 300. For example, the M-sided polygon may be a triangle, a quadrilateral, a hexagon, or the like, and this embodiment of the present disclosure is not limited thereto.

For example, as shown in FIG. 1, at least three light-emitting units 310 are disposed in each light region 300 of all the light regions 300.

For example, each light region 300 may be provided with three light-emitting units 310, or four light-emitting units 310, or five light-emitting units 310, or six light-emitting units 310, or the like.

For example, as shown in FIG. 1, the light region 300 may be in the shape of a polygon, such as a triangle, a quadrilateral, a hexagon, or the like.

The center of the light-emitting unit refers to a geometric center of the light-emitting unit, for example, an orthographic projection of the geometric center on the substrate coincides with the center of a two-dimensional plane of an orthographic projection of the light-emitting unit on the substrate. The centers of the M light-emitting units sequentially connected may refer to the centers of the M light-emitting units being connected clockwise or counterclockwise.

For example, as shown in FIG. 1, the pitch P of the light region 300 may be a length of a line connecting centers of adjacent light regions 300 arranged in the first direction, or a length of a line connecting centers of adjacent light regions 300 arranged in the second direction. For example, the ratio of the pitch of the light region 300 in the first direction to the pitch of the light region 300 in the second direction is 0.9 to 1.1, e.g., the pitches of the light regions 300 in the two directions may be equal.

For example, as shown in FIG. 1, the distance between the center C1 of the M-sided polygon and the center C2 of the light region 300 is less than 9.5% of the pitch P of the light region 300. For example, the distance between the center C1 of the M-sided polygon and the center C2 of the light region 300 is less than 9% of the pitch P of the light region 300. For example, the distance between the center C1 of the M-sided polygon and the center C2 of the light region 300 is less than 8.5% of the pitch P of the light region 300. For example, the distance between the center C1 of the M-sided polygon and the center C2 of the light region 300 is less than 8% of the pitch P of the light region 300. For example, the distance between the center C1 of the M-sided polygon and the center C2 of the light region 300 is less than 7.5% of the pitch P of the light region 300. For example, the distance between the center C1 of the M-sided polygon and the center C2 of the light region 300 is less than 7% of the pitch P of the light region 300. For example, the distance between the center C1 of the M-sided polygon and the center C2 of the light region 300 is less than 6.5% of the pitch P of the light region 300. For example, the distance between the center C1 of the M-sided polygon and the center C2 of the light region 300 is less than 6% of the pitch P of the light region 300. For example, the distance between the center C1 of the M-sided polygon and the center C2 of the light region 300 is less than 5.5% of the pitch P of the light region 300. For example, the distance between the center C1 of the M-sided polygon and the center C2 of the light region 300 is less than 5% of the pitch P of the light region 300. For example, the distance between the center C1 of the M-sided polygon and the center C2 of the light region 300 is less than 4.5% of the pitch P of the light region 300. For example, the distance between the center C1 of the M-sided polygon and the center C2 of the light region 300 is less than 4% of the pitch P of the light region 300. For example, the distance between the center C1 of the M-sided polygon and the center C2 of the light region 300 is less than 3.5% of the pitch P of the light region 300. For example, the distance between the center C1 of the M-sided polygon and the center C2 of the light region 300 is less than 3% of the pitch P of the light region 300. For example, the distance between the center C1 of the M-sided polygon and the center C2 of the light region 300 is less than 2.5% of the pitch P of the light region 300. For example, the distance between the center C1 of the M-sided polygon and the center C2 of the light region 300 is less than 2% of the pitch P of the light region 300. For example, the distance between the center C1 of the M-sided polygon and the center C2 of the light region 300 is less than 1.5% of the pitch P of the light region 300. For example, the distance between the center C1 of the M-sided polygon and the center C2 of the light region 300 is less than 1% of the pitch P of the light region 300. For example, the distance between the center C1 of the M-sided polygon and the center C2 of the light region 300 is less than 0.5% of the pitch P of the light region 300.

For example, as shown in FIG. 1, the center C1 of the M-sided polygon coincides with the center C2 of the light region 300.

For example, as shown in FIG. 1, the ratio of the lengths of different sides of the M-sided polygon is 0.98 to 1.08.

For example, the ratio of the lengths of different sides of the M-sided polygon is 0.96 to 1.04.

For example, the ratio of the lengths of different sides of the M-sided polygon is 0.95 to 1.05. For example, the ratio of the lengths of different sides of the M-sided polygon is 0.92 to 1.02.

For example, as shown in FIG. 1, all sides of the M-sided polygon are equal in length and are P'.

For example, as shown in FIG. 1, the ratio of the pitch P of the light region 300 to the side length P' of the M-sided polygon is 1.7 to 2.3. For example, the ratio of the pitch P of the light region 300 to the side length P' of the M-sided polygon is 1.65 to 2.25. For example, the ratio of the pitch P of the light region 300 to the side length P' of the M-sided polygon is 1.7 to 2.2. For example, the ratio of the pitch P of the light region 300 to the side length P' of the M-sided polygon is 1.75 to 2.15. For example, the ratio of the pitch P of the light region 300 to the side length P' of the M-sided polygon is 1.8 to 2.1. For example, the ratio of the pitch P of the light region 300 to the side length P' of the M-sided polygon is 1.85 to 2.05. For example, the ratio of the pitch P of the light region 300 to the side length P' of the M-sided polygon is 1.9 to 2.

For example, as shown in FIG. 1, the pitch P of the light region 300 is two times the side length P' of the M-sided polygon.

For example, as shown in FIG. 1, at least one side of the M-sided polygon is parallel to at least one of the first direction and the second direction.

For example, the M-sided polygon only includes sides parallel to the first direction, or the M-sided polygon only includes sides parallel to the second direction, or the M-sided polygon includes sides parallel to the first direction as well as sides parallel to the second direction.

Figure 2A:
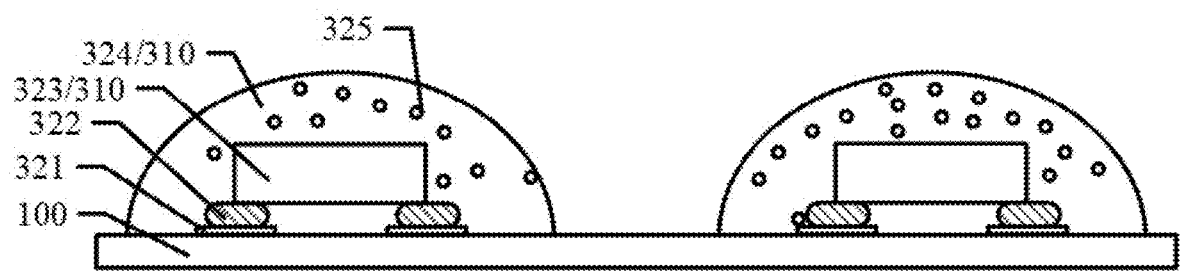
FIG. 2A and FIG. 2B are schematic diagrams of light-emitting units in different examples.
Figure 2B:
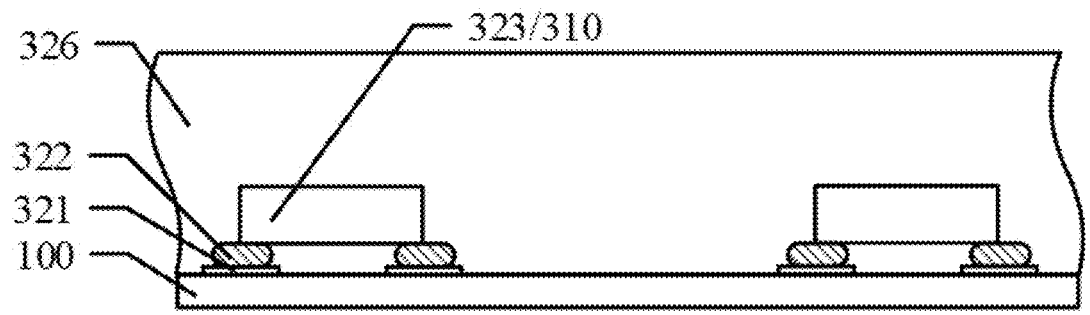
Figure 3A:
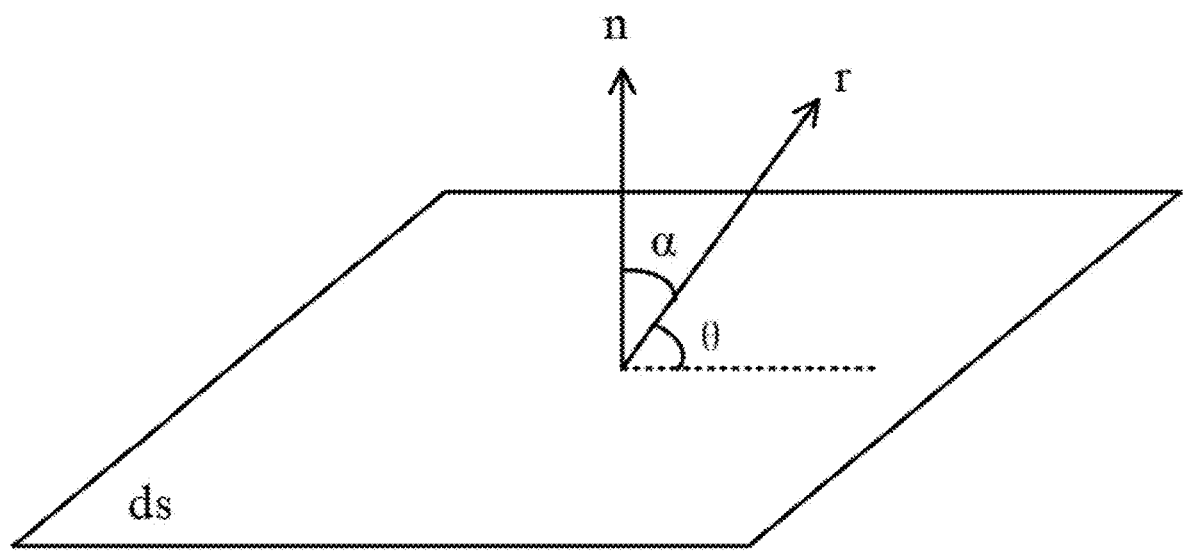
FIG. 3A is a schematic diagram of equivalent luminescence of a Lambertian emitter.
Figure 3B:
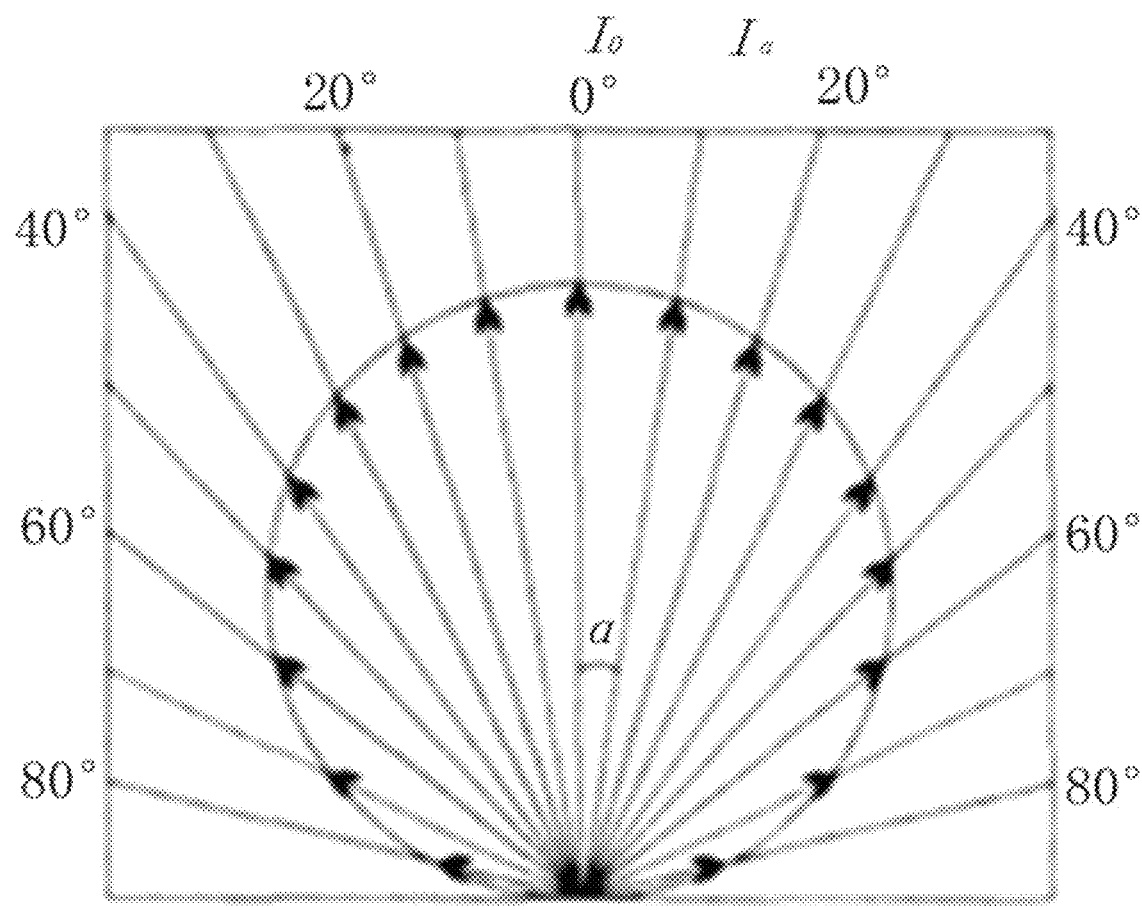
FIG. 3B is a schematic diagram of a light-emitting angle and light intensity distribution of a Lambertian emitter.

FIG. 2A and FIG. 2B are schematic diagrams of light-emitting units in different examples. FIG. 3A is a schematic diagram of the equivalent luminescence of a Lambertian emitter. FIG. 3B is a schematic diagram of a light-emitting angle and light intensity distribution of a Lambertian emitter.

For example, as shown in FIGS. 3A to 3B, if the light intensity of an extended light source is $dI \propto \cos m\alpha$, i.e., its brightness is independent of the direction, this type of emitter is called a cosine emitter, or a Lambertian (J. H. Lambert) emitter, and the above mentioned law of emitting luminous flux in accordance with the law of $\cos \alpha$ is referred to as Lambert's cosine law. dI in the formula is the light intensity of each surface element dS of the extended light surface along a certain direction r, and $\alpha$ is an included angle between the light emitting direction r of the light source and a normal n.

The light intensity distribution satisfies: $I_\alpha = I_0 \cos m\alpha$, $I_0$ is the light intensity distribution along a direction of a normal perpendicular to a light source surface, $m=(-\ln 2)/(\ln \cos \alpha_{1/2})$, i.e., m is determined by $\alpha_{1/2}$, where $\alpha_{1/2}$ is defined as an included angle between the light emitting direction and the normal n when the light intensity is reduced to half of the light intensity corresponding to the normal direction, and $\alpha_{1/2}$ takes a value in a range of 40 to 80 degrees, for the example, $\alpha_{1/2}$ may take a value in a range of 48 to 75 degrees, or in a range of 46 to 78 degrees, or in a range of 45 to 76 degrees. That is, if the light intensity of a light ray emitted in the direction of the normal n is set to 1, the light intensity of the emitted light ray having the included angle of $\alpha_{1/2}$ with the normal n is ½, while the light ray emitted in a direction at an angle greater than $\alpha_{1/2}$ with the normal n has a smaller light intensity. That is, although the Lambertian emitter can theoretically emit an infinite number of light rays, the light rays at different angles with the normal n have different light intensities.

In some examples, as shown in FIG. 2A, the light-emitting unit 310 includes a light-emitting diode chip 323 and an encapsulation structure 324 configured to encapsulate the light-emitting diode chip 323, and there is a spacing between the encapsulation structures 324 of adjacent light-emitting units 310.

For example, as shown in FIG. 2A, the light-emitting unit 310 includes the encapsulated light-emitting diode chip. The light-emitting diode chip 323 may be a sub-millimeter light-emitting diode chip (miniLED). A size of an unencapsulated light-emitting diode chip 323 in a direction perpendicular to the substrate 100 may be 70 μm to 180 μm, and the maximum size of the unencapsulated light-emitting diode chip 323 in a direction parallel to the direction of the substrate 100 may be not greater than 500 μm.

For example, the encapsulated light-emitting diode chip is the light-emitting unit 310, and the maximum size in the direction parallel to the substrate 100 and the thickness of the encapsulated light-emitting diode chip 323 are greater than the corresponding parameters of the unencapsulated light-emitting diode chip 323.

For example, as shown in FIG. 2A, a single light-emitting diode chip 323 may be encapsulated as a stand-alone device to form the light-emitting unit 310 before being disposed at a corresponding position on the backlight structure, and is fixedly connected to a pad on the substrate 100.

Because the unencapsulated light-emitting diode chip can be considered as a Lambertian emitter, after the light-emitting diode chip is encapsulated, a light ray emitted at an angle ranging from $+\alpha_{1/2}$ to $-\alpha_{1/2}$ can be emitted, whereas a light ray emitted at an angle in a range other than $+\alpha_{1/2}$ to $-\alpha_{1/2}$ is basically confined to the stand-alone device due to total reflection. At this time, an included angle θ between an utmost-edge light ray of light rays emitted by the light-emitting unit 310 and the substrate 100 may be a complement angle of $\alpha_{1/2}$.

For example, as shown in FIG. 2A, the light-emitting unit 310 or the light-emitting diode chip 323 is connected to a pad 321 on the substrate 100 by a solder metal 322.

For example, the solder metal 322 may include solder tin.

For example, as shown in FIG. 2A, the encapsulation structure 324 may be doped with a color conversion material 325.

For example, the color conversion material 325 may include a fluorescent powder material or a quantum dot material.

For example, the color conversion material 325 may include a material capable of converting blue light to white light.

For example, the color conversion material 325 may include a material capable of converting blue light to red light and green light. Certainly, this embodiment of the present disclosure is not limited thereto, and the encapsulated structure may be doped with the color conversion material.

For example, as shown in FIG. 2A, the light-emitting diode chip 323 may be encapsulated after being disposed at a corresponding position on the substrate 100.

For example, a transparent material, such as transparent silicone, can be used to encapsulate each light-emitting diode chip by means of screen printing or dot printing to form the encapsulation structure 324. According to the different shapes of the encapsulation structure 324, the light-emitting angle of the light-emitting diode chip 323 can be modulated, thereby changing the light-emitting angle of the light-emitting unit 310.

For example, as shown in FIG. 2A, a surface of the encapsulation structure 324 away from the substrate 100 may be a curved surface, and the light-emitting angle of the utmost-edge light ray of the light rays emitted by the light-emitting unit 310 is slightly greater than $\alpha_{1/2}$ of the light-emitting diode chip 323. If the value of $\alpha_{1/2}$ is in the range of 40 to 65 degrees, the value of the light-emitting angle of the utmost-edge light ray of the light rays emitted by the light-emitting unit 310 may be in a range of 50 to 70 degrees.

For example, the encapsulation structure 324 may have any desired size in the direction perpendicular to the substrate 100. For example, the size of the encapsulation structure 324 in the direction perpendicular to the substrate 100 may be less than 0.5 mm. For example, the size of the encapsulation structure 324 in the direction perpendicular to the substrate 100 may be between 0.1 and 0.4 mm. For example, the size of the encapsulation structure 324 in the direction perpendicular to the substrate 100 may be between 0.2 and 0.4 mm. For example, the size of the encapsulation structure 324 in the direction perpendicular to the substrate 100 may be less than 0.3 mm. For example, the size of the encapsulation structure 324 in the direction perpendicular to the substrate 100 may be between 0.25 and 0.35 mm. For example, the size of the encapsulation structure 324 in the direction perpendicular to the substrate 100 may be between 0.15 and 0.25 mm. For example, the size of the encapsulation structure 324 in the direction perpendicular to the substrate 100 may be about 0.2 mm. For example, the size of the encapsulation structure 324 in the direction perpendicular to the substrate 100 may be about 0.3 mm.

For example, the maximum size of the encapsulation structure 324 in the direction parallel to the substrate 100 may be between 0.3 and 2.5 mm. For example, the maximum size of the encapsulation structure 324 in the direction parallel to the substrate 100 may be between 0.3 and 2.5 mm. For example, the maximum size of the encapsulation structure 324 in the direction parallel to the substrate 100 may be between 0.3 and 0.7 mm. For example, the maximum size of the encapsulation structure 324 in the direction parallel to the substrate 100 may be between 0.8 and 0.9 mm. For example, the maximum size of the encapsulation structure 324 in the direction parallel to the substrate 100 may be greater than 0.5 mm. For example, the maximum size of the encapsulation structure 324 in the direction parallel to the substrate 100 may be greater than 1.0 mm. For example, the maximum size of the encapsulation structure 324 in the direction parallel to the substrate 100 may be greater than 2.0 mm. For example, the maximum size of the encapsulation structure 324 in the direction parallel to the substrate 100 may be less than 2.0 mm.

For example, a ratio of the maximum size of the encapsulation structure 324 in the direction parallel to the substrate 100 to its size in the direction perpendicular to the substrate 100 may be greater than 3. For example, the ratio of the maximum size of the encapsulation structure 324 in the direction parallel to the substrate 100 to its size in the direction perpendicular to the substrate 100 may be between 4 and 6. For example, the ratio of the maximum size of the encapsulation structure 324 in the direction parallel to the substrate 100 to its size in the direction perpendicular to the substrate 100 may be less than 10.

For example, after being encapsulated as a stand-alone device, a geometric center of the light-emitting diode chip in an orthographic projection of the light-emitting diode chip on the substrate may coincide with a geometric center of an orthographic projection of the stand-alone device on the substrate. Without limitation, however, the geometric center of the orthographic projection of the light-emitting diode chip on the substrate may also be offset with respect to the geometric center of the orthographic projection of the stand-alone device on the substrate; a height of the light-emitting unit 310 in the direction perpendicular to the substrate 100 is a height of the encapsulated light-emitting diode chip.

For example, as shown in FIG. 2A, a size of the light-emitting unit 310 in the direction perpendicular to the substrate 100 is not greater than 200 μm. For example, the size of the light-emitting unit 310 in the direction perpendicular to the substrate 100 is not greater than 180 μm. For example, the size of the light-emitting unit 310 in the direction perpendicular to the substrate 100 is not greater than 160 μm. For example, the size of the light-emitting unit 310 in the direction perpendicular to the substrate 100 is not greater than 150 μm. For example, the size of the light-emitting unit 310 in the direction perpendicular to the substrate 100 is not greater than 140 μm. For example, the size of the light-emitting unit 310 in the direction perpendicular to the substrate 100 is not greater than 130 μm. For example, the size of the light-emitting unit 310 in the direction perpendicular to the substrate 100 is not greater than 120 μm. For example, the size of the light-emitting unit 310 in the direction perpendicular to the substrate 100 is not greater than 110 μm. For example, the size of the light-emitting unit 310 in the direction perpendicular to the substrate 100 is not greater than 100 μm. The size of the light-emitting unit 310 in the direction perpendicular to the substrate 100 is the height of the light-emitting unit 310.

In some examples, as shown in FIG. 2A, the height of the light-emitting unit 310 is 50 to 100μ m.

In some examples, as shown in FIG. 2A, the height of the light-emitting unit 310 is 80 to 100 μm.

For example, the height of the light-emitting unit 310 is 55 to 95 μm. For example, the height of the light-emitting unit 310 is 60 to 90 μm. For example, the height of the light-emitting unit 310 is 70 to 85 μm. For example, the height of the light-emitting unit 310 is 75 to 80 μm.

In some examples, as shown in FIGS. 1 to 2A, the maximum size of the light-emitting unit 310 in the direction parallel to the substrate 100 is not greater than 500 μm. For example, the maximum size of the light-emitting unit 310 in the direction parallel to the substrate 100 is not greater than 450 μm. For example, the maximum size of the light-emitting unit 310 in the direction parallel to the substrate 100 is not greater than 400 μm. For example, the maximum size of the light-emitting unit 310 in the direction parallel to the substrate 100 is not greater than 350 μm. For example, the maximum size of the light-emitting unit 310 in the direction parallel to the substrate 100 is not greater than 330 μm. For example, the maximum size of the light-emitting unit 310 in the direction parallel to the substrate 100 is not greater than 300 μm. For example, the maximum size of the light-emitting unit 310 in the direction parallel to the substrate 100 is not greater than 280 μm.

For example, as shown in FIG. 1, a size of the light-emitting unit 310 in at least one of the first direction and the second direction is not greater than 250 μm. For example, the size of the light-emitting unit 310 in at least one of the first direction and the second direction is not greater than 240 μm. For example, the size of the light-emitting unit 310 in at least one of the first direction and the second direction is not greater than 230 μm. For example, the size of the light-emitting unit 310 in at least one of the first direction and the second direction is not greater than 220 μm. For example, the light-emitting unit 310 has a size of 219 μm in both the first direction and the second direction.

The shape of the light-emitting unit described above may refer to the shape of the orthographic projection of the light-emitting unit on the substrate.

For example, the light-emitting unit may be in the shape of a quadrilateral, such as a rectangle, and the maximum size of the light-emitting unit in the direction parallel to the substrate may be a length of a diagonal of the quadrilateral.

For example, the light-emitting unit may be in the shape of an oval, and the maximum size of the light-emitting unit in the direction parallel to the substrate may be a length of a long axis of the oval.

For example, the light-emitting unit may be in the shape of a circle, and the maximum size of the light-emitting unit in the direction parallel to the substrate may be a diameter.

For example, as shown in FIG. 2B, the light-emitting unit 310 may also only include the unencapsulated light-emitting diode chip 323, and the maximum size of the unencapsulated light-emitting diode chip 323 in the direction parallel to the substrate 100 may be not greater than 500 μm.

For example, the light-emitting unit 310 is the unencapsulated light-emitting diode chip 323. The light-emitting diode chip 323 is a sub-millimeter inorganic light-emitting diode (miniLED). The unencapsulated light-emitting diode chip 323 may have a thickness of 70 μm to 180 μm, and the maximum size of the unencapsulated light-emitting diode chip 323 in the direction parallel to the substrate 100 is not greater than 500 μm.

For example, the unencapsulated light-emitting diode chip 323 may be equivalent to a Lambertian emitter. Since a light ray emitted by the unencapsulated light-emitting diode chip 323 and having an included angle greater than $\alpha_{1/2}$ with the normal n has a small light intensity and is outside the scope of the present disclosure, this embodiment of the present disclosure defines a light ray emitted by the unencapsulated light-emitting diode chip 323 and having the included angle of $\alpha_{1/2}$ with the normal n as the utmost-edge light ray of the unencapsulated light-emitting diode chip 323, i.e., the utmost-edge light ray of the light-emitting unit 310.

For example, as shown in FIG. 2B, a protective layer 326 is disposed on a side of the plurality of light-emitting units 310 away from the substrate 100.

For example, in order to prevent the light-emitting diode chip 323 from being scratched or bumped in subsequent processes, e.g., the process of placing an optical film on the substrate 100 or transportation, a plurality of light-emitting diode chips 323 may be uniformly protected using the protective layer 326.

For example, the plurality of light-emitting diode chips 323 may share the same protective layer 326. For example, the protective layer 326 may be made of a transparent material, such as transparent silicone. For example, the protective layer 326 may fill the light regions.

For example, a surface of the protective layer 326 away from the substrate 100 may be a nearly flat surface, thereby improving the yield of the display device.

For example, to reduce the total reflection of light emitted from the light-emitting diode chip 323 within the protective layer 326, the refractive index of the protective layer 326 may be between the refractive index of the light-emitting diode chip 323 and the refractive index of a material (e.g., air) adjacent to the protective layer 326.

For example, the refractive index of the protective layer 326 may be between 1.2 and 1.6. For example, the refractive index of the protective layer 326 may be between 1.3 and 1.4. For example, the refractive index of the protective layer 326 is less than 1.4. For example, the refractive index of the protective layer 326 may be less than 1.5. For example, the refractive index of the protective layer 326 may be greater than 1.1. For example, the refractive index of the protective layer 326 may be greater than 1.2. For example, the refractive index of the protective layer 326 may be greater than 1.3. For example, the refractive index of the protective layer 326 may be about 1.35. For example, the protective layer 326 may cover all of the unencapsulated light-emitting diode chips 323 on the substrate 100, and the protective layer 326 may have a flat or slightly bumpy upper surface. For example, the thickness of the protective layer 326 is slightly greater than the thickness of the unencapsulated light-emitting diode chip 323.

Figure 4:
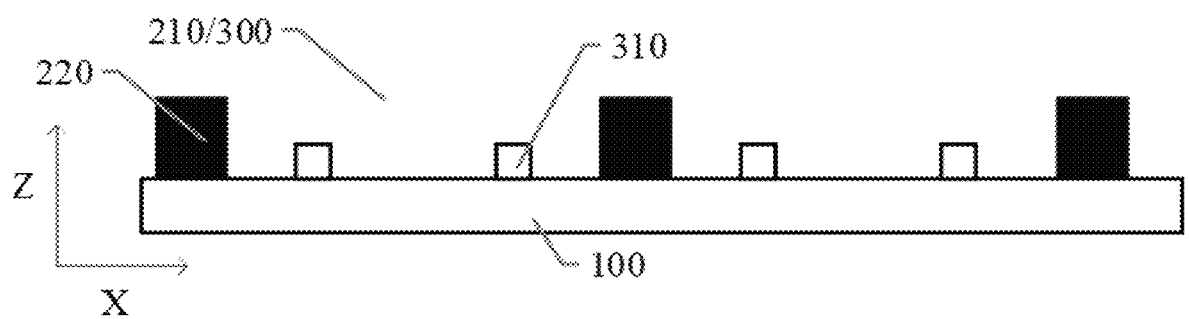
FIG. 4 is a schematic diagram of a partial cross-sectional structure cut along line AA' shown in FIG. 1 according to an example of an embodiment of the present disclosure.

FIG. 4 is a schematic diagram of a partial cross-sectional structure cut along line AA' shown in FIG. 1 according to an example of an embodiment of the present disclosure.

In some examples, as shown in FIG. 4, the thickness of the barrier wall 220 is greater than the height of the light-emitting unit 310 in a direction perpendicular to the substrate 100.

In some examples, as shown in FIG. 4, the thickness of the barrier wall 220 is 200 to 400 μm and the height of the light-emitting unit 310 is 50 to 100 μm.

The thickness of the barrier wall 220 described above refers to the size of the barrier wall 220 in the direction perpendicular to the substrate 100.

In some examples, as shown in FIG. 4, the thickness of the barrier wall 220 is 250 to 270 μm.

For example, the thickness of the barrier wall 220 may be 210 to 390 μm. For example, the thickness of the barrier wall 220 may be 220 to 370 μm. For example, the thickness of the barrier wall 220 may be 230 to 350 μm. For example, the thickness of the barrier wall 220 may be 235 to 320 μm. For example, the thickness of the barrier wall 220 may be 240 to 300 μm. For example, the thickness of the barrier wall 220 may be 245 to 280 μm.

In some examples, as shown in FIG. 4, the barrier wall 220 has a width of 350 to 500 μm. The width of the barrier wall 220 refers to the size of the barrier wall 220 between two adjacent light regions 300 in the first direction, or the size of the barrier wall 220 between two adjacent light regions 300 in the second direction.

For example, as shown in FIG. 4, the width of the barrier wall 220 may be 370 to 480 μm. For example, the width of the barrier wall 220 may be 350 to 450 μm. For example, the width of the barrier wall 220 may be 360 to 440 μm. For example, the width of the barrier wall 220 may be 370 to 430 μm. For example, the width of the barrier wall 220 may be 380 to 420 μm. For example, the width of the barrier wall 220 may be 390 to 410 μm. For example, the width of the barrier wall 220 may be 400 μm.

In some examples, as shown in FIG. 1 and FIG. 4, the barrier wall 220 includes a shading material.

For example, the material of the barrier wall 220 may include black resin.

In some examples, the light-emitting units 310 disposed in each light region 300 are electrically connected as shown in FIG. 1. For example, a plurality of light-emitting units 310 in each light region 300 is connected in series. For example, the plurality of light-emitting units 310 in each light region 300 is connected in parallel.

In the backlight structure of the present disclosure, each light region is surrounded by a circle of barrier wall capable of shading, which is conducive to reducing the chance of crosstalk of light rays between different light regions and improves the halo phenomenon.

In some examples, as shown in FIG. 1, at least some of the light regions 300 are in the shape of a rectangle, and two adjacent sides in the rectangle extend in the first direction and the second direction, respectively.

For example, all of the light regions 300 are in the shape of a rectangle.

For example, different light regions 300 have the same shape and are of the same size. Certainly, this embodiment of the present disclosure is not limited thereto. The substrate may be divided into a plurality of regions according to product requirements, the sizes of the light regions in different regions may be different, and the sizes of the light regions in the same region are the same.

Figure 5:
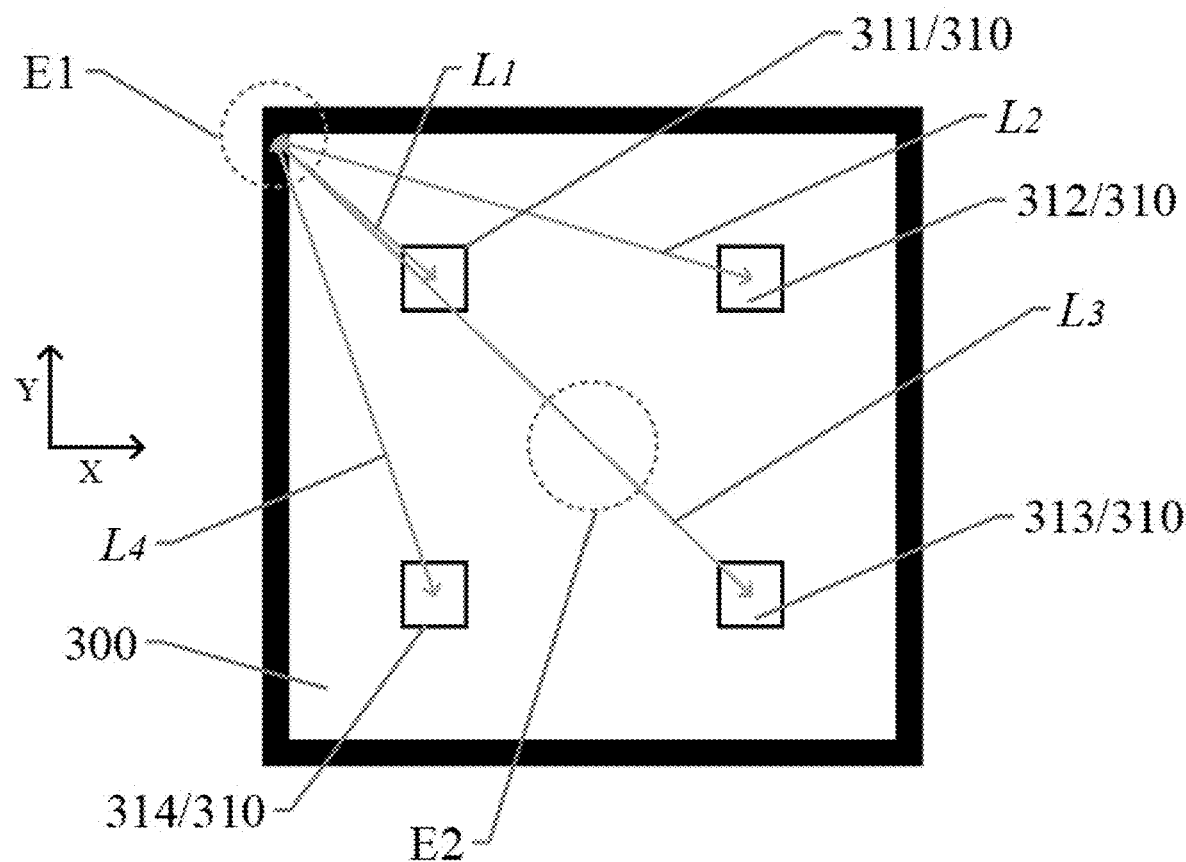
FIG. 5 is a schematic diagram of light-emitting units in one of light regions shown in FIG. 1.

FIG. 5 is a schematic diagram of light-emitting units in one of light regions shown in FIG. 1. FIG. 5 schematically illustrates one light region including four light-emitting units, in which an M-sided polygon is a quadrilateral.

For example, as shown in FIG. 5, the light region 300 may be in the shape of a square, and the M-sided polygon formed by a line of centers of the four light-emitting units 310 located in the light region 300 is a square.

For example, using $I\alpha=I_0 \cos m\alpha$ as equation 1 and $m=(-\ln 2)/(\ln\cos \alpha_{1/2})$ as equation 2, the range of $\alpha_{1/2}$ may be from 45° to 75°, e.g., it may be 60°, and accordingly, $m_{min}=0.5$ and $m_{max}=2$ can be obtained. For example, a vertical component of an emergent optical path of a light-emitting unit, e.g., an optical path of h in the direction of the normal n shown in FIG. 3A, may be 100 to 350 μm. For example, h may be 120 to 330 μm. For example, h may be 150 to 300 μm. For example, h may be 170 to 280 μm. For example, h may be 200 to 250 μm. The h is equal to the height difference between the height of the barrier wall and the height of the light-emitting unit, e.g., h is a vertical height difference from a surface of one side of the light-emitting unit away from the substrate to the highest point of the barrier wall.

For example, as shown in FIG. 5, if the pitch of the light region 300 is P and a distance between the center of a light-emitting unit 314 and the center of a light-emitting unit 313 is P/2, for example, $L_2$, $L_4$ and P satisfy $L_2=L_4=[(3\times P/4)^2+(P/4)^2]^{1/2}=(10)^{1/2}\times P/4$; $L_1$ and P satisfy: $L_1=(2)^{1/2}\times P/4$; and $L_3$ and P satisfy: $L_3=3\times(2)^{1/2}\times P/4$. The $L_1$, $L_2$, $L_3$, and La refer to horizontal distances from the center of a corresponding light-emitting unit 310 to a vertex angle of the light region, respectively.

For example, as shown in FIGS. 3A and 5, θ is a complementary angle of α, i.e., θ=90°−α, and tan θ=h/L, then cos mα=sin m[(π/2)−α]. For example, $\alpha_{1/2}$ of the light-emitting unit 310, such as the encapsulated light-emitting diode chip may be 60°, then m≈1.

For example, since the order of magnitude of h is micrometer and the order of magnitude of L is micron, and L>>h, θ is very small; at this time, tan θ≈θ=h/L, α is close to 90°, and cos α=sin θ∼tan θ=h/L. Because m≈1, cos mα=sin (90°−mα)≈sin[m×(90°−α)]≈sin(m×θ)≈m×sin θ≈m×h/L. Therefore, the light intensity $I_1=I_0 \cos(m\alpha_1)+I_0 \cos(m\alpha_2)+ \ldots +I_0 \cos(m\alpha_N)\approx I_0\times m\times h/L_1+I_0\times m\times h/L_2+ \ldots +I_0\times m\times h/L_N=I_0\times m\times h\times(1/L_1+1/L_2+ \ldots +1/L_N)$, N takes a value of the number of the light-emitting units in the light region, and N may be 4 as shown in FIG. 5.

The above relation equation 1: $I_1=I_0\times m\times h\times(1/L_1+1/L_2+ \ldots +1/L_N)$ may also be expressed as $$I_1 = I_0 \times m \times h \times \sum_{i=1}^{i=N} \frac{1}{L_i}.$$

The above relation equation 1 represents a summation relation equation for the corresponding values of N light-emitting units in the light region.

The $L_2$, $L_4$, $L_1$, and $L_3$ may be substituted into the above equations to obtain $I_1\approx I_0\times m\times h/[2\times(10)^{1/2}\times P/4+(2)^{1/2}\times P/4+3\times(2)^{1/2}\times P/4]=6.3\times I_0\times m\times h/P$.

For example, in an area E2 shown in FIG. 5, the light intensity is $I_2\approx 4\times I_0\times m\times h/[(2)^{1/2}\times P/4]=11.3\times I_0\times m\times h/P$.

For example, $I_1/I_2=0.56$.

In some examples, as shown in FIG. 5, a ratio of light intensity at the edge position of the light region 300, such as the area E1, to light intensity at the center position of the light region 300, such as an area E2, is not less than 0.5.

For example, the ratio of the light intensity at the edge position of the light region 300 to the light intensity at the center position of the light region 300 is not less than 0.55. For example, the ratio of the light intensity at the edge position of the light region 300 to the light intensity at the center position of the light region 300 is not less than 0.6. For example, the ratio of the light intensity at the edge position of the light region 300 to the light intensity at the center position of the light region 300 is not less than 0.65. For example, the ratio of the light intensity at the edge position of the light region 300 to the light intensity at the center position of the light region 300 is not less than 0.7. For example, the ratio of the light intensity at the edge position of the light region 300 to the light intensity at the center position of the light region 300 is not less than 0.75. For example, the ratio of the light intensity at the edge position of the light region 300 to the light intensity at the center position of the light region 300 is not less than 0.8. For example, the ratio of the light intensity at the edge position of the light region 300 to the light intensity at the center position of the light region 300 is not less than 0.85. For example, the ratio of the light intensity at the edge position of the light region 300 to the light intensity at the center position of the light region 300 is not less than 0.9.

In some examples, as shown in FIG. 5, $I_0$, m, and h in the relation equation 1 may be regarded as constants, each light region 300 of at least some of the light regions 300 includes N light-emitting units, where N≥M, a distance from the center of an i-th light-emitting unit 310 to a vertex angle of the light region 300 is $L_i$, i takes a value in a range of 1 to N, and $L_i$, P, and N satisfy: $8.5\geq P\times(1/L_1+1/L_2+ \ldots +1/L_N)\geq 6.3$, where $P\times(1/L_1+1/L_2+ \ldots +1/L_N)$ can be used as an approximate reference value for the unitless relative light intensity at the edge position. The $1/L_1+1/L_2+ \ldots +1/L_N$ represents the sum of reciprocals of $L_N$ of the N light-emitting units.

For example, $8.3\geq P\times(1/L_1+1/L_2+ \ldots +1/L_N)\geq 6.5$. For example, $8.1\geq P\times(1/L_1+1/L_2+ \ldots +1/L_N)\geq 6.6$. For example, $8.2\geq P\times(1/L_1+1/L_2+ \ldots +1/L_N)\geq 6.7$. For example, $8\geq P\times(1/L_1+1/L_2+ \ldots +1/L_N)\geq 6$. For example, $7.9\geq P\times(1/L_1+1/L_2+ \ldots +1/L_N)\geq 6.9$. For example, $7.8\geq P\times(1/L_1+1/L_2+ \ldots +1/L_N)\geq 7$. For example, $7.7\geq P\times(1/L_1+1/L_2+ \ldots +1/L_N)\geq 6.8$. For example, $7.5\geq P\times(1/L_1+1/$ $L_2+ \ldots +1/L_N) \geq 7.1$. For example, $7.6 \geq P \times (1/L_1+1/L_2+ \ldots +1/L_N) \geq 7.2$. For example, $7.4 \geq P \times (1/L_1+1/L_2+ \ldots +1/L_N) \geq 7.3$.

The vertex angle of the light region described above may refer to the area E1 shown in FIG. 5.

The above relation equation of $8.5 \geq P \times (1/L_1+1/L_2+ \ldots +1/L_N) \leq 6.3$ may also be expressed as $$8.5 \geq P \times \sum_{i=1}^{i=N} \frac{1}{L_i} \geq 6.3,$$

where $$Q = P \times \sum_{i=1}^{i=N} \frac{1}{L_i}.$$

The above relation equation represents a summation relation equation for the corresponding values of N light-emitting units in the light region.

For example, as shown in FIG. 5, the light region 300 includes four light-emitting units, the distance from the center of the i-th light-emitting unit 310 to the vertex angle of the light region 300 is $L_i$, and i takes a value in a range of 1 to 4, and $L_i$, P, and N satisfy: $8.5 \geq P \times (1/L_1+1/L_2+1/L_3+1/L_4) \geq 6.3$. For example, $P \times (1/L_1+1/L_2+1/L_3+1/L_4)=6.3$.

For example, as shown in FIG. 1, the ratio of the pitch of the light region 300 to the side length of the quadrilateral is 1.7 to 2.3. For example, the ratio of the pitch of the light region 300 to the side length of the quadrilateral is 1.65 to 2.25. For example, the ratio of the pitch of the light region 300 to the side length of the quadrilateral is 1.7 to 2.2. For example, the ratio of the pitch of the light region 300 to the side length of the quadrilateral is 1.75 to 2.15. For example, the ratio of the pitch of the light region 300 to the side length of the quadrilateral is 1.8 to 2.1. For example, the ratio of the pitch of the light region 300 to the side length of the quadrilateral is 1.85 to 2.05. For example, the ratio of the pitch of the light region 300 to the side length of the quadrilateral is 1.9 to 2.

In some examples, as shown in FIGS. 1 and 5, each of the at least some of the light regions 300 includes at least four light-emitting units 310, the at least four light-emitting units 310 are arranged to form an M-sided polygon, and an included angle between one of the first direction and the second direction and at least one side of the M-sided polygon is 0 degrees.

For example, as shown in FIG. 1, at least some of the light regions 300 are in the shape of a square.

In some examples, as shown in FIG. 1, each light region 300 of the at least some of the light regions 300 is in the shape of a first square, each light region 300 of the at least some of the light region 300 includes at least four light-emitting units 310, and the centers of the four light-emitting units 310, closest to four vertex angles of the light region 300, among the at least four light-emitting units 310 are sequentially connected to form a second square, and an included angle between a diagonal of the first square and a diagonal of the second square is 0 degrees.

For example, the diagonal of the first square may coincide with the diagonal of the second square.

In some examples, as shown in FIG. 1, the at least four light-emitting units 310 include four light-emitting units 311, 312, 313, and 314, and the centers of the four light-emitting units 311, 312, 313, and 314 are sequentially connected to form the second square.

For example, an included angle between each of two sides of the second square and the first direction is 0 degrees, and an included angle between each of two other sides of the second square and the second direction is 0 degrees.

For example, as shown in FIG. 1, the plurality of light-emitting units 310 in the light region 300 is evenly distributed.

For example, as shown in FIGS. 1 and 5, the pitch of the light region 300 is 4.46 mm, the pitch of the light-emitting unit 310 is 2.23 mm, and the size of the light-emitting unit 310 may be 0.22 mm×0.22 mm. For example, the number of light regions 300 may be 2,596, for example, the number of light regions 300 arranged in one of the first direction and the second direction may be 44, and the number of light regions 300 arranged in the other one of the first direction and the second direction may be 59. For example, the size of the substrate on which the light regions 300 are disposed may be 263 mm×196 mm.

For example, the total thickness of a light plate formed by the substrate 100, the light-emitting units 310, and the barrier wall pattern 200 may be 0.27 mm.

In some examples, as shown in FIGS. 1, 3A, and 5, the light intensity distribution I of the light-emitting units 310 satisfies $I=I_0 \cos m\alpha$, $I_0$ is the light intensity distribution in the direction of the normal perpendicular to a light exit surface of the light-emitting unit 310, a is the included angle between the light emitting direction of the light-emitting unit 310 and the normal, $m=(-\ln 2)/(\ln \cos \alpha_{1/2})$, $\alpha_{1/2}$ is the included angle between the light emitting direction and the normal when the light intensity is reduced to half of the light intensity corresponding to the normal direction, and the optical path of a light ray emitted by the light-emitting unit 310 in the normal direction is h; each of the at least some of the light regions 300 includes N light-emitting units 310, where N≥M, and the distance between the center of the i-th light-emitting unit 310 and the vertex angle of the light region 300 is $L_i$, i takes a value in a range of 1 to N, and $L_i$, h, and N satisfy: $0.5 \geq \cos m \times [(\pi/2)-(h/L_1)]+\cos m \times [(\pi/2)-(h/L_2)]+ \ldots +\cos m \times [(\pi/2)-(h/L_N)] \geq 0.23$.

For example, as shown in FIGS. 3A and 5, in the case that the light-emitting unit 310 has a small emergent light angle θ, $\tan \theta \approx \theta = h/L$. $\tan \theta \approx \theta = h/L$ as well as $\alpha = (\pi/2)-\theta$ are substituted into the formula $\cos m\alpha$ to obtain $\cos m\alpha = \cos m \times [(\pi/2)-\theta] \approx \cos m \times [(\pi/2)-(h/L)]$. Thus, the light intensity in the area E1 shown in FIG. 5 is obtained as $I_1=I_0 \times \cos m \times [(\pi/2)-(h/L_1)]+I_0 \times \cos m \times [(\pi/2)-(h/L_2)]+ \ldots +I_0 \times \cos m \times [(\pi/2)-(h/L_N)]$, N takes a value of the number of the light-emitting units in the light region, and N may be 4 shown in FIG. 5, then $I_1=I_0 \times \cos m \times [(\pi/2)-(h/L_1)]+I_0 \times \cos m \times [(\pi/2)-(h/L_2)]+I_0 \times \cos m \times [(\pi/2)-(h/L_3)]+I_0 \times \cos \times [(\pi/2)-(h/L_4)]$.

The above relation equation 2: $I_1=I_0 \times \cos m \times [(\pi/2)-(h/L_1)]+I_0 \times \cos m \times [(\pi/2)-(h/L_2)]+ \ldots +I_0 \times \cos m \times [(\pi/2)-(h/L_N)]$ may also be expressed as $$I_1 = I_0 \times S = I_0 \times \sum_{i=1}^{i=N} \cos m \left( \frac{\pi}{2} - \frac{h}{L_i} \right),$$

where, $$S = \sum_{i=1}^{i=N} \cos m \left( \frac{\pi}{2} - \frac{h}{L_i} \right),$$

where m is approximately equal to 1. The above relation equation 2 represents a summation relation equation for the corresponding values of the N light-emitting units in the light region.

For example, taking the pitch of the light region 300 as 4.46 mm and the pitch of the light-emitting unit 310 as 2.23 mm as an example, then S=0.254002. The pitch of the light-emitting unit 310 may refer to the side length of the M-sided polygon.

For example, $0.48 \geq \cos m \times [(\pi/2)-(h/L_1)] + \cos m \times [(\pi/2)-(h/L_2)] + \ldots + \cos m \times [(\pi/2)-(h/L_N)] \geq 0.25$.

For example, $0.45 \geq \cos m \times [(\pi/2)-(h/L_1)] + \cos m \times [(\pi/2)-(h/L_2)] + \ldots + \cos m \times [(\pi/2)-(h/L_N)] \geq 0.27$.

For example, $0.42 \geq \cos m \times [(\pi/2)-(h/L_1)] + \cos m \times [(\pi/2)-(h/L_2)] + \ldots + \cos m \times [(\pi/2)-(h/L_N)] \geq 0.28$.

For example, $0.4 \geq \cos m \times [(\pi/2)-(h/L_1)] + \cos m \times [(\pi/2)-(h/L_2)] + \ldots + \cos m \times [(\pi/2)-(h/L_N)] \geq 0.3$.

For example, $0.38 \geq \cos m \times [(\pi/2)-(h/L_1)] + \cos m \times [(\pi/2)-(h/L_2)] + \ldots + \cos m \times [(\pi/2)-(h/L_N)] \geq 0.32$.

For example, $0.36 \geq \cos m \times [(\pi/2)-(h/L_1)] + \cos m \times [(\pi/2)-(h/L_2)] + \ldots + \cos m \times [(\pi/2)-(h/L_N)] \geq 0.35$.

FIGS. 6 to 9 are schematic diagrams of the distribution of light-emitting units in one light region according to various examples of an embodiment of the present disclosure.

Figure 6:
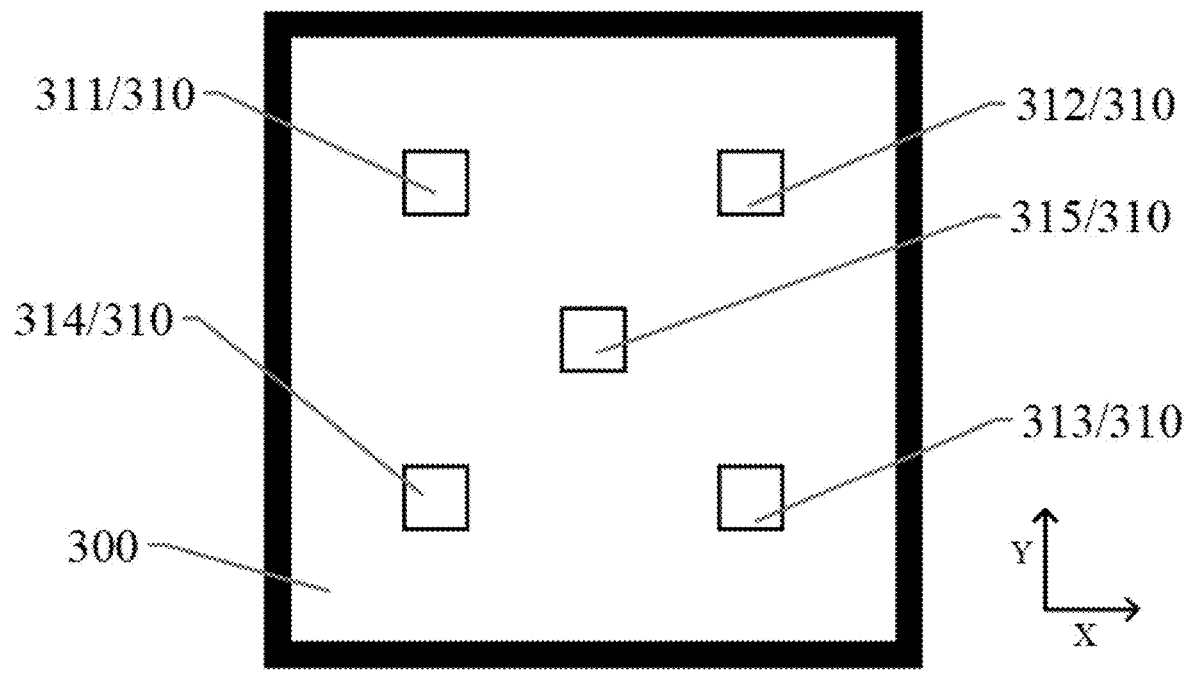
FIGS. 6 to 9 are schematic diagrams of the distribution of light-emitting units in one light region according to various examples of an embodiment of the present disclosure.

For example, at least one light region 300 in the example shown in FIG. 6 includes five light-emitting units 311, 312, 313, 314, and 315. Centers of the four light-emitting units 311, 312, 313, and 314 are sequentially connected to form a quadrilateral, or the five light-emitting units 311, 312, 313, 314, and 315 are arranged to form a quadrilateral. An included angle between at least one of the first direction and the second direction and at least one side of the quadrilateral is 0 degrees.

The four light-emitting units 311, 312, 313, and 314 may be the four light-emitting units located outermost, or may be the four light-emitting units closest to vertex angles of the light region.

For example, as shown in FIG. 6, the light region 300 includes five light-emitting units. A distance from the center of an i-th light-emitting unit 310 to a vertex angle of the light region 300 is $L_i$, i takes a value in the range of 1 to 5, and $L_i$, P, and N satisfy: $8.5 \geq P \times (1/L_1 + 1/L_2 + 1/L_3 + 1/L_4 + 1/L_5) \geq 6.3$.

For example, $8.3 \geq P \times (1/L_1 + 1/L_2 + 1/L_3 + 1/L_4 + 1/L_5) \geq 6.5$.
For example, $8.1 \geq P \times (1/L_1 + 1/L_2 + 1/L_3 + 1/L_4 + 1/L_5) \geq 6.6$.
For example, $8.2 \geq P \times (1/L_1 + 1/L_2 + 1/L_3 + 1/L_4 + 1/L_5) \geq 6.7$.
For example, $8 \geq P \times (1/L_1 + 1/L_2 + 1/L_3 + 1/L_4 + 1/L_5) \geq 6$.
For example, $7.9 \geq P \times (1/L_1 + 1/L_2 + 1/L_3 + 1/L_4 + 1/L_6) \geq 6.9$.
For example, $7.8 \geq P \times (1/L_1 + 1/L_2 + 1/L_3 + 1/L_4 + 1/L_5) \geq 7$.
For example, $7.7 \geq P \times (1/L_1 + 1/L_2 + 1/L_3 + 1/L_4 + 1/L_5) \geq 6.8$.
For example, $7.5 \geq P \times (1/L_1 + 1/L_2 + 1/L_3 + 1/L_4 + 1/L_5) \geq 7.1$.
For example, $7.6 \geq P \times (1/L_1 + 1/L_2 + 1/L_3 + 1/L_4 + 1/L_5) \geq 7.2$.
For example, $7.4 \geq P \times (1/L_1 + 1/L_2 + 1/L_3 + 1/L_4 + 1/L_5) \geq 7.3$.

For example, as shown in FIG. 6, a ratio of the pitch of the light region 300 to a side length of the quadrilateral is 1.7 to 2.3. For example, the ratio of the pitch of the light region 300 to the side length of the quadrilateral is 1.65 to 2.25. For example, the ratio of the pitch of the light region 300 to the side length of the quadrilateral is 1.7 to 2.2. For example, the ratio of the pitch of the light region 300 to the side length of the quadrilateral is 1.75 to 2.15. For example, the ratio of the pitch of the light region 300 to the side length of the quadrilateral is 1.8 to 2.1. For example, the ratio of the pitch of the light region 300 to the side length of the quadrilateral is 1.85 to 2.05. For example, the ratio of the pitch of the light region 300 to the side length of the quadrilateral is 1.9 to 2.

For example, as shown in FIG. 6, the five light-emitting units 311, 312, 313, 314, and 315 may be evenly distributed. For example, the light-emitting unit 315 may be located at the center of the quadrilateral formed by the four light-emitting units 311, 312, 313, and 314.

For example, as shown in FIG. 6, the quadrilateral formed by connecting the centers of the four light-emitting units 311, 312, 313, and 314 sequentially may be a rectangle.

For example, the quadrilateral formed by connecting the centers of the four light-emitting units 311, 312, 313, and 314 sequentially may be a square.

For example, an included angle between each of two sides of the quadrilateral and the first direction is 0 degrees, and an included angle between each of the other two sides of the quadrilateral and the second direction is 0 degrees.

For example, as shown in FIG. 6, the light region 300 is in the shape of the first square, the quadrilateral formed by connecting the centers of the four light-emitting units 311, 312, 313, and 314 sequentially may be the second square, and an included angle between a diagonal of the first square and a diagonal of the second square is 0 degrees. For example, the diagonal of the first square may coincide with the diagonal of the second square.

For example, as shown in FIG. 6, the pitch of the light region 300 is 4.46 mm, the pitch of the light-emitting unit 310 is 2.23 mm, and the size of the light-emitting unit 310 may be 0.22 mm×0.22 mm. For example, the number of light regions 300 may be 2,596, for example, the number of light regions 300 arranged in one of the first direction and the second direction may be 44, and the number of light regions 300 arranged in the other one of the first direction and the second direction may be 59. For example, the size of the substrate on which the light regions 300 are disposed may be 263 mm×196 mm.

For example, parameters such as the size and material of the barrier wall and the size of the light-emitting units in the example shown in FIG. 6 may be the same as the corresponding parameters in the above example and will not be repeated herein.

Figure 7:
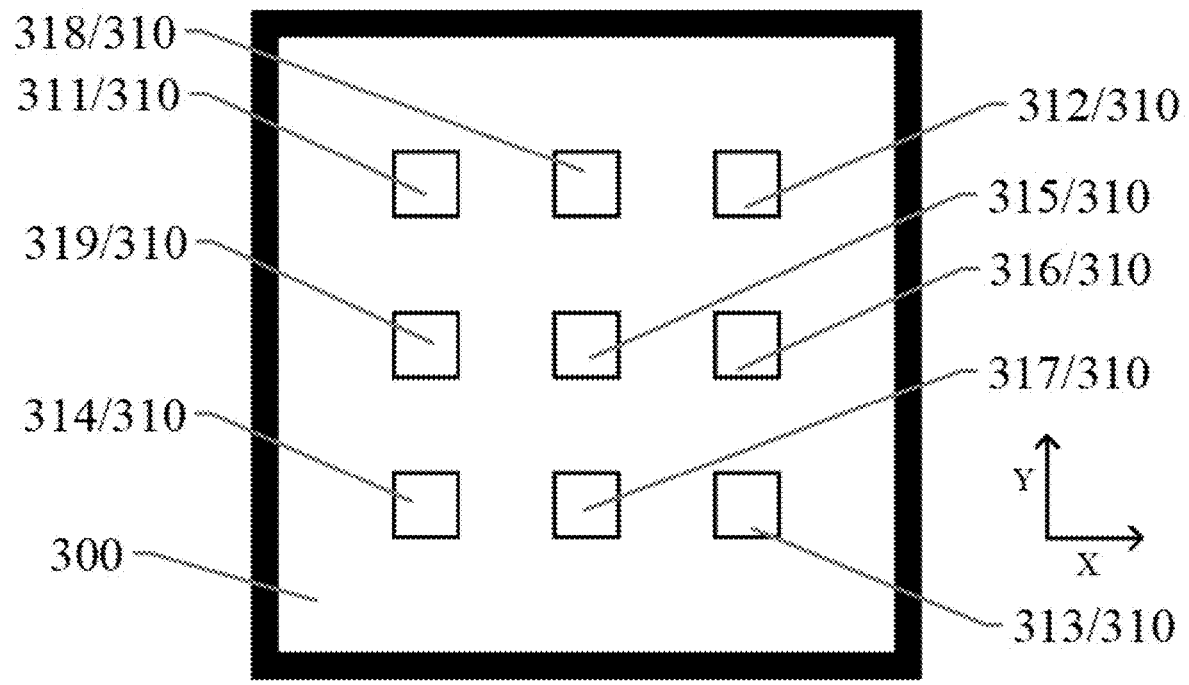

For example, the at least one light region 300 in the example shown in FIG. 7 includes nine light-emitting units 311, 312, 313, 314, 315, 316, 317, 318, and 319, centers of the four light-emitting units 311, 312, 313, and 314 are sequentially connected to form a quadrilateral, or the nine light-emitting units 311, 312, 313, 314, 315, 316 317, 318, and 319 are arranged to form a quadrilateral, and an included angle between at least one of the first direction and the second direction and at least one side of the quadrilateral is 0 degrees. The four light-emitting units 311, 312, 313, and 314 may be the four light-emitting units located outermost, or may be the four light-emitting units closest to vertex angles of the light region.

For example, as shown in FIG. 7, the light region 300 includes nine light-emitting units, and a distance from the center of an i-th light-emitting unit 310 to a vertex angle of the light region 300 is $L_i$, where i takes a value in the range of 1 to 9, and $L_i$, P, and N satisfy: $8.5 \geq P \times (1/L_1 + 1/L_2 + 1/L_3 + 1/L_4 + 1/L_5 + 1/L_6 + 1/L_7 + 1/L_8 + 1/L_9) \geq 6.3$.

For example, $8.3 \geq P \times (1/L_1 + 1/L_2 + 1/L_3 + 1/L_4 + 1/L_5 + 1/L_6 + 1/L_7 + 1/L_8 + 1/L_9) \geq 6.5$.

For example, $8.1 \geq P \times (1/L_1 + 1/L_2 + 1/L_3 + 1/L_4 + 1/L_5 + 1/L_6 + 1/L_7 + 1/L_8 + 1/L_9) \geq 6.6$.

For example, $8.2 \geq P \times (1/L_1 + 1/L_2 + 1/L_3 + 1/L_4 + 1/L_5 + 1/L_6 + 1/L_7 + 1/L_8 + 1/L_9) \geq 6.7$.

For example, $8 \geq P \times (1/L_1 + 1/L_2 + 1/L_3 + 1/L_4 + 1/L_5 + 1/L_6 + 1/L_7 + 1/L_8 + 1/L_9) \geq 6$.

For example, $7.9 \geq P \times (1/L_1+1/L_2+1/L_3+1/L_4+1/L_5+1/L_6+1/L_7+1/L_8+1/L_9) \geq 6.9$.

For example, $7.8 \geq P \times (1/L_1+1/L_2+1/L_3+1/L_4+1/L_5+1/L_6+1/L_7+1/L_8+1/L_9) \geq 7$.

For example, $7.7 \geq P \times (1/L_1+1/L_2+1/L_3+1/L_4+1/L_5+1/L_6+1/L_7+1/L_8+1/L_9) \geq 6.8$.

For example, $7.5 \geq P \times (1/L_1+1/L_2+1/L_3+1/L_4+1/L_5+1/L_6+1/L_7+1/L_8+1/L_9) \geq 7.1$.

For example, $7.6 \geq P \times (1/L_1+1/L_2+1/L_3+1/L_4+1/L_5+1/L_6+1/L_7+1/L_8+1/L_9) \geq 7.2$.

For example, $7.4 \geq P \times (1/L_1+1/L_2+1/L_3+1/L_4+1/L_5+1/L_6+1/L_7+1/L_8+1/L_9) \geq 7.3$.

For example, as shown in FIG. 7, the ratio of the pitch of the light region 300 to the side length of the quadrilateral is 1.7 to 2.3. For example, the ratio of the pitch of the light region 300 to the side length of the quadrilateral is 1.65 to 2.25. For example, the ratio of the pitch of the light region 300 to the side length of the quadrilateral is 1.7 to 2.2. For example, the ratio of the pitch of the light region 300 to the side length of the quadrilateral is 1.75 to 2.15. For example, the ratio of the pitch of the light region 300 to the side length of the quadrilateral is 1.8 to 2.1. For example, the ratio of the pitch of the light region 300 to the side length of the quadrilateral is 1.85 to 2.05. For example, the ratio of the pitch of the light region 300 to the side length of the quadrilateral is 1.9 to 2.

For example, as shown in FIG. 7, the nine light-emitting units 311, 312, 313, 314, 315, 316, 317, 318, and 319 may be evenly distributed. For example, the light-emitting unit 315 may be located at the center of the quadrilateral formed of the four light-emitting units 311, 312, 313, and 314.

For example, as shown in FIG. 7, the light-emitting unit 318 may be located between the light-emitting unit 311 and the light-emitting unit 312, the light-emitting unit 319 may be located between the light-emitting unit 311 and the light-emitting unit 314, the light-emitting unit 317 may be located between the light-emitting unit 313 and the light-emitting unit 314, and the light-emitting unit 316 may be located between the light-emitting unit 312 and the light-emitting unit 313.

For example, four sides of the quadrilateral pass through the centers of the light-emitting units 318, 319, 317, and 316, respectively.

For example, the centers of the light-emitting units 318, 319, 317, and 316 may be the centers of the four sides of the quadrilateral, respectively.

For example, as shown in FIG. 7, the quadrilateral formed by connecting the centers of the four light-emitting units 311, 312, 313, and 314 sequentially may be a rectangle.

For example, the quadrilateral formed by connecting the centers of the four light-emitting units 311, 312, 313, and 314 sequentially may be a square.

For example, an included angle between two sides of the quadrilateral and the first direction is 0 degrees, and an included angle between the other two sides of the quadrilateral and the second direction is 0 degrees.

For example, as shown in FIG. 7, the light region 300 is in the shape of the first square, the quadrilateral formed by connecting the centers of the four light-emitting units 311, 312, 313, and 314 sequentially may be the second square, and an included angle between a diagonal of the first square and a diagonal of the second square is 0 degrees. For example, the diagonal of the first square may coincide with the diagonal of the second square.

For example, as shown in FIG. 7, the pitch of the light region 300 is 4.46 mm, the pitch of the light-emitting unit 310 is 2.23 mm, and the size of the light-emitting unit 310 may be 0.22 mm×0.22 mm. For example, the number of light regions 300 may be 2,596, for example, the number of light regions 300 arranged in one of the first direction and the second direction may be 44, and the number of light regions 300 arranged in the other one of the first direction and the second direction may be 59. For example, the size of the substrate on which the light regions 300 are disposed may be 263 mm×196 mm.

For example, parameters such as the size and material of the barrier wall and the size of the light-emitting units in the example shown in FIG. 7 may be the same as the corresponding parameters in the above example and will not be repeated herein.

Figure 8:
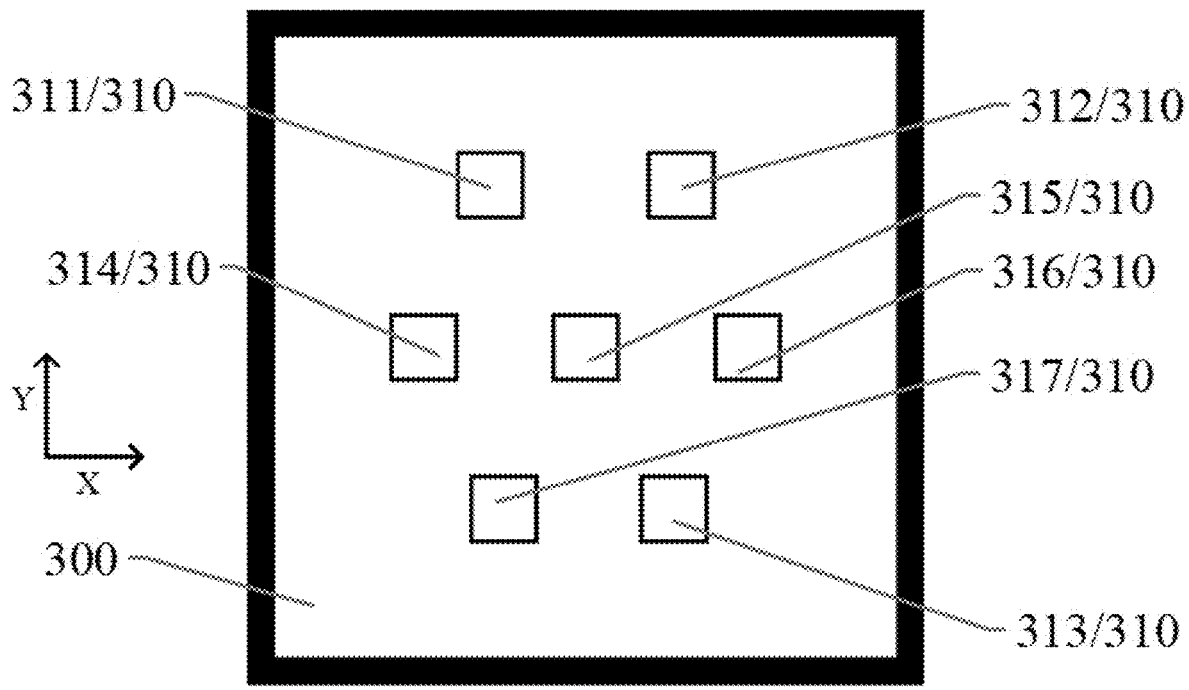

For example, the at least one light region 300 in the example shown in FIG. 8 includes seven light-emitting units 311, 312, 313, 314, 315, 316, and 317, centers of the six light-emitting units 311, 312, 313, 314, 316, and 317 are sequentially connected to form hexagon, or the seven light-emitting units 311, 312, 313, 314, 315, 316 and 317 are arranged to form a hexagon, and an included angle between at least one of the first direction and the second direction and at least one side of the hexagon is 0 degrees. The six light-emitting units 311, 312, 313, 314, 316, and 317 may be the six light-emitting units located outermost, or may be the six light-emitting units closest to vertex angles of the light region.

For example, as shown in FIG. 8, the light region 300 includes seven light-emitting units, and a distance from the center of an i-th light-emitting unit 310 to vertex angles of the light region 300 is $L_i$, where i takes a value in the range of 1 to 7, and $L_i$, P, and N satisfy: $8.5 \geq P \times (1/L_1+1/L_2+1/L_3+1/L_4+1/L_5+1/L_6+1/L_7) \geq 6.3$.

For example, $8.3 \geq P \times (1/L_1+1/L_2+1/L_3+1/L_4+1/L_5+1/L_6+1/L_7) \geq 6.5$.

For example, $8.1 \geq P \times (1/L_1+1/L_2+1/L_3+1/L_4+1/L_5+1/L_6+1/L_7) \geq 6.6$.

For example, $8.2 \geq P \times (1/L_1+1/L_2+1/L_3+1/L_4+1/L_5+1/L_6+1/L_7) \geq 6.7$.

For example, $8 \geq P \times (1/L_1+1/L_2+1/L_3+1/L_4+1/L_5+1/L_6+1/L_7) \geq 6$.

For example, $7.9 \geq P \times (1/L_1+1/L_2+1/L_3+1/L_4+1/L_5+1/L_6+1/L_7) \geq 6.9$.

For example, $7.8 \geq P \times (1/L_1+1/L_2+1/L_3+1/L_4+1/L_5+1/L_6+1/L_7) \geq 7$.

For example, $7.7 \geq P \times (1/L_1+1/L_2+1/L_3+1/L_4+1/L_5+1/L_6+1/L_7) \geq 6.8$.

For example, $7.5 \geq P \times (1/L_1+1/L_2+1/L_3+1/L_4+1/L_5+1/L_6+1/L_7) \geq 7.1$.

For example, $7.6 \geq P \times (1/L_1+1/L_2+1/L_3+1/L_4+1/L_5+1/L_6+1/L_7) \geq 7.2$.

For example, $7.4 \geq P \times (1/L_1+1/L_2+1/L_3+1/L_4+1/L_5+1/L_6+1/L_7) \geq 7.3$.

For example, as shown in FIG. 8, a ratio of the pitch of the light region 300 to a side length of the hexagon is 1.7 to 2.3. For example, the ratio of the pitch of the light region 300 to the side length of the hexagon is 1.65 to 2.25. For example, the ratio of the pitch of the light region 300 to the side length of the hexagon is 1.7 to 2.2. For example, the ratio of the pitch of the light region 300 to the side length of the hexagon is 1.75 to 2.15. For example, the ratio of the pitch of the light region 300 to the side length of the hexagon is 1.8 to 2.1. For example, the ratio of the pitch of the light region 300 to the side length of the hexagon is 1.85 to 2.05. For example, the ratio of the pitch of the light region 300 to the side length of the hexagon is 1.9 to 2.

For example, as shown in FIG. 8, the seven light-emitting units 311, 312, 313, 314, 315, 316, and 317 may be evenly distributed. For example, the light-emitting unit 315 may be located in the center of the hexagon formed by the six light-emitting units 311, 312, 313, 314, 316, and 317.

For example, as shown in FIG. 8, the hexagon may be a regular hexagon.

For example, as shown in FIG. 8, an included angle between each of two sides of the hexagon and the first direction or the second direction is 0 degrees.

For example, parameters such as the size and material of the barrier wall and the size of the light-emitting units in the example shown in FIG. 8 may be the same as the corresponding parameters in the above example and will not be repeated herein.

Certainly, this embodiment of the present disclosure is not limited thereto, and the number of the light-emitting units in the light region may also be six, such as by removing the light-emitting unit 315 located in the very center in FIG. 8. The number of the light-emitting units in the light region may be set according to the needs of the backlight structure and the needs of the display panel.

Figure 9:
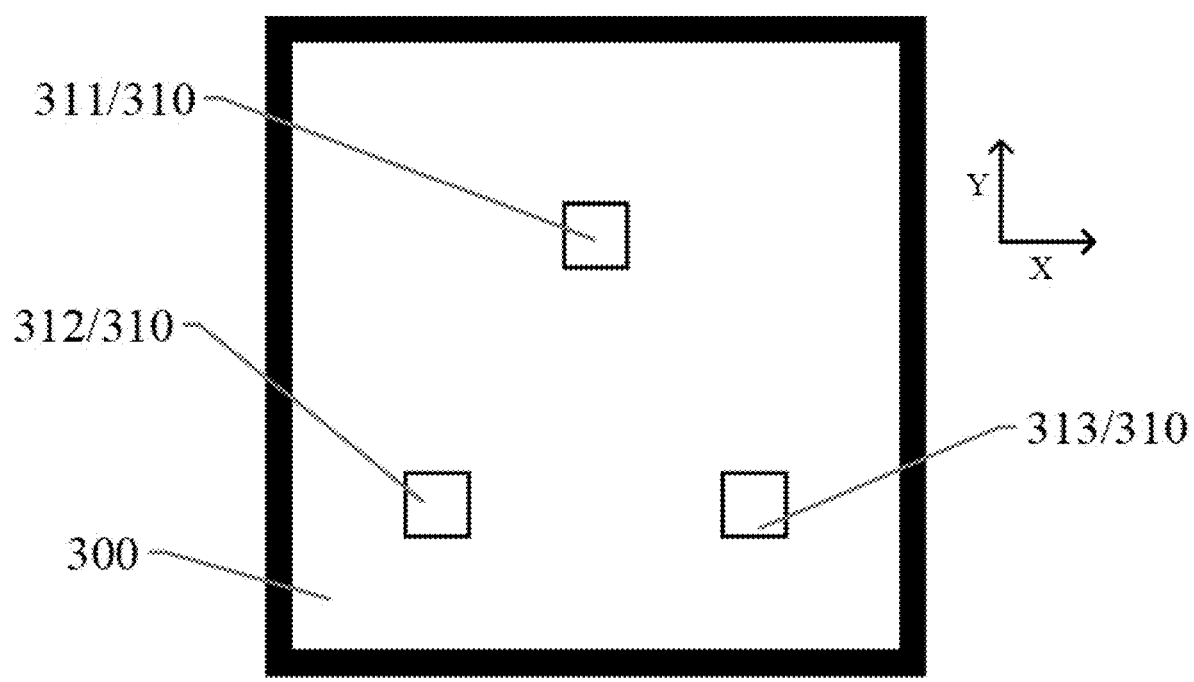

For example, at least one light region 300 in the example shown in FIG. 9 includes three light-emitting units 311, 312, and 313, centers of the three light-emitting units 311, 312, and 313 are connected to form a triangle, and an included angle between at least one of the first direction and the second direction and at least one side of the triangle is 0 degrees. The three light-emitting units 311, 312, and 313 may be three light-emitting units located outermost.

For example, as shown in FIG. 9, the light region 300 includes three light-emitting units, and a distance from the center of an i-th light-emitting unit 310 to a vertex angle of the light region 300 is $L_i$, where i takes a value in the range of 1 to 3, and $L_i$, P, and N satisfy: $8.5 \geq P \times (1/L_1 + 1/L_2 + 1/L_3) \geq 6.3$.

For example, $8.3 \geq P \times (1/L_1 + 1/L_2 + 1/L_3) \geq 6.5$. For example, $8.1 \geq P \times (1/L_1 + 1/L_2 + 1/L_3) \geq 6.6$. For example, $8.2 \geq P \times (1/L_1 + 1/L_2 + 1/L_3) \geq 6.7$. For example, $8 \geq P \times (1/L_1 + 1/L_2 + 1/L_3) \geq 6$. For example, $7.9 \geq P \times (1/L_1 + 1/L_2 + 1/L_3) \geq 6.9$. For example, $7.8 \geq P \times (1/L_1 + 1/L_2 + 1/L_3) \geq 7$. For example, $7.7 \geq P \times (1/L_1 + 1/L_2 + 1/L_3) \geq 6.8$. For example, $7.5 \geq P \times (1/L_1 + 1/L_2 + 1/L_3) \geq 7.1$. For example, $7.6 \geq P \times (1/L_1 + 1/L_2 + 1/L_3) \geq 7.2$. For example, $7.4 \geq P \times (1/L_1 + 1/L_2 + 1/L_3) \geq 7.3$.

For example, as shown in FIG. 9, a ratio of the pitch of the light region 300 to a side length of the triangle is 1.7 to 2.3. For example, the ratio of the pitch of the light region 300 to the side length of the triangle is 1.65 to 2.25. For example, the ratio of the pitch of the light region 300 to the side length of the triangle is 1.7 to 2.2. For example, the ratio of the pitch of the light region 300 to the side length of the triangle is 1.75 to 2.15. For example, the ratio of the pitch of the light region 300 to the side length of the triangle is 1.8 to 2.1. For example, the ratio of the pitch of the light region 300 to the side length of the triangle is 1.85 to 2.05. For example, the ratio of the pitch of the light region 300 to the side length of the triangle is 1.9 to 2.

For example, as shown in FIG. 9, the three light-emitting units 311, 312, and 313 may be evenly distributed.

For example, as shown in FIG. 9, the triangle may be an equilateral triangle.

For example, as shown in FIG. 9, an included angle between one side of the triangle and the first direction or the second direction is 0 degrees.

Certainly, this embodiment of the present disclosure is not limited thereto, and the triangle may have an included angle of 0 degrees between one side and the first direction and an included angle of 0 degrees between the other side and the second direction.

For example, as shown in FIG. 9, the pitch of the light region 300 is 4.8 mm, the pitch of the light-emitting unit 310 is 2.6 mm, and the size of the light-emitting unit 310 may be 0.219 mm×0.219 mm.

For example, parameters such as the size and material of the barrier wall and the size of the light-emitting units in the example shown in FIG. 9 may be the same as the corresponding parameters in the above example and will not be repeated herein.

Figure 10:
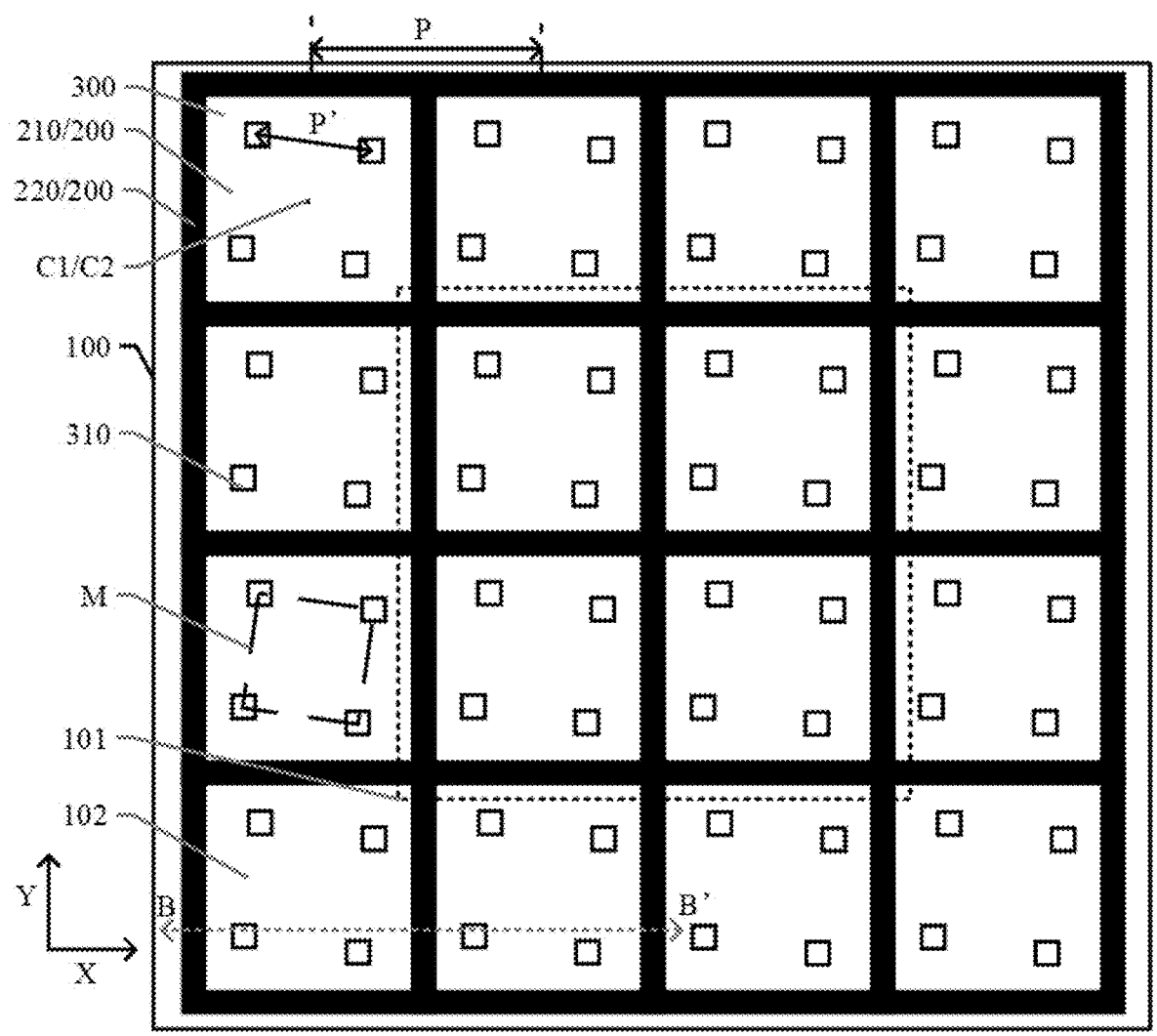
FIG. 10 is a schematic diagram of a partial planar structure of a backlight structure according to another example of an embodiment of the present disclosure.

FIG. 10 is a schematic diagram of a partial planar structure of a backlight structure according to another example of an embodiment of the present disclosure. As shown in FIG. 10, the backlight structure includes a substrate 100, and a barrier wall pattern 200 and a plurality of light-emitting units 310 that are located on the substrate 100. The barrier wall pattern 200 includes a plurality of openings 210 arrayed along a first direction and a second direction and a barrier wall 220 surrounding the openings 210, the plurality of openings 210 is configured to define a plurality of light regions 300, and the first direction intersects the second direction. The plurality of light-emitting units 310 is distributed in the plurality of light regions 300. The substrate 100 includes a central region 101 and an edge region 102 surrounding the central region 101, each light region 300 at least in the central region 101 is provided with at least three light-emitting units 310, centers of M light-emitting units 310, closest to vertex angles of the light region 300, of the at least three light-emitting units 310 are sequentially connected to form an M-sided polygon, a distance between the center of the M-sided polygon and the center of the light region 300 is less than 10% of the pitch of the light region 300, and an included angle between the first direction and each side of the M-sided polygon and an included angle between the second direction and each side of the M-sided polygon are both greater than 0 degrees.

In the backlight structure provided in the present disclosure, the setting of the included angle between each side of the M-sided polygon and the first direction and the included angle between each side of the M-sided polygon and the second direction is conducive to improving the light emitting uniformity.

For example, one of the first direction and the second direction is a direction X shown in FIG. 10, and the other of the first direction and the second direction may be a direction Y shown in FIG. 10. This embodiment of the present disclosure is schematically described with the first direction being the direction X and the second direction being the direction Y.

For example, the first direction is perpendicular to the second direction. For example, an included angle between the first direction and the second direction may be 80 to 110 degrees, or 85 to 100 degrees, or 88 to 92 degrees. This embodiment of the present disclosure is not limited thereto, and the first direction may be interchanged with the second direction.

For example, as shown in FIG. 10, the included angle between the first direction and each side of the M-sided polygon as well as between the second direction and each side of the M-sided polygon is greater than 0.5 degrees. For example, the included angle between the first direction and each side of the M-sided polygon as well as between the second direction and each side of the M-sided polygon is greater than 1 degree. For example, the included angle between the first direction and each side of the M-sided polygon as well as between the second direction and each side of the M-sided polygon is greater than 2 degrees. For example, the included angle between the first direction and each side of the M-sided polygon as well as between the second direction and each side of the M-sided polygon is greater than 3 degrees. For example, the included angle between the first direction and each side of the M-sided polygon as well as between the second direction and each side of the M-sided polygon is greater than 4 degrees. For example, the included angle between the first direction and each side of the M-sided polygon as well as between the second direction and each side of the M-sided polygon is greater than 5 degrees. For example, the included angle between the first direction and each side of the M-sided polygon as well as between the second direction and each side of the M-sided polygon is greater than 5.5 degrees. For example, the included angle between the first direction and each side of the M-sided polygon as well as between the second direction and each side of the M-sided polygon is greater than 6 degrees. For example, the included angle between the first direction and each side of the M-sided polygon as well as between the second direction and each side of the M-sided polygon is greater than 6.5 degrees. For example, the included angle between the first direction and each side of the M-sided polygon as well as between the second direction and each side of the M-sided polygon is greater than 7 degrees. For example, the included angle between the first direction and each side of the M-sided polygon as well as between the second direction and each side of the M-sided polygon is greater than 8 degrees. For example, the included angle between the first direction and each side of the M-sided polygon as well as between the second direction and each side of the M-sided polygon is greater than 9 degrees. For example, the included angle between the first direction and each side of the M-sided polygon as well as between the second direction and each side of the M-sided polygon is greater than 10 degrees. For example, the included angle between the first direction and each side of the M-sided polygon as well as between the second direction and each side of the M-sided polygon is greater than 10.5 degrees. For example, the included angle between the first direction and each side of the M-sided polygon as well as between the second direction and each side of the M-sided polygon is greater than 11 degrees. For example, the included angle between the first direction and each side of the M-sided polygon as well as between the second direction and each side of the M-sided polygon is greater than 12 degrees.

For example, as shown in FIG. 10, the included angle between the first direction and one side of the M-sided polygon may be the same as the included angle between the second direction and another side of the M-sided polygon. Certainly, this embodiment of the present disclosure is not limited thereto, and the included angle between the first direction and one side of the M-sided polygon may be different from the included angle between the second direction and either side of the M-sided polygon.

For example, as shown in FIG. 10, the plurality of openings 210 corresponds to the plurality of light regions 300 one by one, and each of the openings 210 is used to define one light region 300.

For example, the number of the light-emitting units 310 distributed in different light regions 300 may be the same or different.

For example, the number of light-emitting units 310 distributed in some of the light regions 300 in a region on the substrate 100 is the same, and the number of light-emitting units 310 distributed in some of the light regions 300 in another region on the substrate 100 is different. The positions of the two regions described above may be set according to the product requirements, for example, one of the regions may be located in a central region of the substrate, and the other region may be an edge region of the substrate; or one of the regions may be located in the edge region of the substrate, and the other region may be located in the central region of the substrate; or both the two regions are located in different edge regions of the substrate.

For example, as shown in FIG. 10, a central region 101 of the substrate 100 may include at least one light region 300.

For example, the central region 101 may include two light regions 300, four light regions 300, or more light regions 300.

For example, an edge region 102 includes at least one circle of light regions 300 located at the edge, the at least one circle of light regions 300 includes two columns of light regions 300 located on either side of the central region 101 in a first direction and two rows of light regions 300 located on either side of the central region 101 in a second direction.

For example, as shown in FIG. 10, the number of light-emitting units 310 disposed in each of the light regions 300 located in the central region 101 and the edge region 102 respectively are the same. However, without limitation, the number of light regions included in the central region and the edge region respectively and the number of light-emitting units included in each light region may be set according to product requirements.

For example, as shown in FIG. 10, M is not greater than the number of light-emitting units 310 disposed in each light region 300. For example, the M-sided polygon may be a triangle, a quadrilateral, a hexagon, or the like. This embodiment of the present disclosure is not limited thereto.

For example, as shown in FIG. 10, at least three light-emitting units 310 are disposed in each light region 300 of all the light regions 300.

For example, each light region 300 may be provided with three light-emitting units 310, or four light-emitting units 310, or five light-emitting units 310, or six light-emitting units 310, or the like.

For example, as shown in FIG. 10, the light region 300 may be in the shape of a polygon, such as a triangle, a quadrilateral, a hexagon, or the like.

The center of the light-emitting unit refers to a geometric center of the light-emitting unit, for example, an orthographic projection of the geometric center on the substrate coincides with the center of a two-dimensional plane of an orthographic projection of the light-emitting unit on the substrate. Centers of the M light-emitting units sequentially connected may refer to the centers of the M light-emitting units being connected clockwise or counterclockwise.

For example, as shown in FIG. 10, the pitch P of the light region 300 may be the length of a line connecting centers of adjacent light regions 300 arranged in the first direction, or the length of a line connecting centers of adjacent light regions 300 arranged in the second direction.

For example, a ratio of the pitch of the light region 300 in the first direction to the pitch of the light region 300 in the second direction may be 0.9 to 1.1, e.g., the two pitches may be equal.

For example, as shown in FIG. 10, a distance between the center C1 of the M-sided polygon and the center C2 of the light region 300 is less than 9.5% of the pitch P of the light region 300. For example, the distance between the center C1 of the M-sided polygon and the center C2 of the light region 300 is less than 9% of the pitch P of the light region 300. For example, the distance between the center C1 of the M-sided polygon and the center C2 of the light region 300 is less than 8.5% of the pitch P of the light region 300. For example, the distance between the center C1 of the M-sided polygon and the center C2 of the light region 300 is less than 8% of the pitch P of the light region 300. For example, the distance between the center C1 of the M-sided polygon and the center C2 of the light region 300 is less than 7.5% of the pitch P of the light region 300. For example, the distance between the center C1 of the M-sided polygon and the center C2 of the light region 300 is less than 7% of the pitch P of the light region 300. For example, the distance between the center C1 of the M-sided polygon and the center C2 of the light region 300 is less than 6.5% of the pitch P of the light region 300. For example, the distance between the center C1 of the M-sided polygon and the center C2 of the light region 300 is less than 6% of the pitch P of the light region 300. For example, the distance between the center C1 of the M-sided polygon and the center C2 of the light region 300 is less than 5.5% of the pitch P of the light region 300. For example, the distance between the center C1 of the M-sided polygon and the center C2 of the light region 300 is less than 5% of the pitch P of the light region 300. For example, the distance between the center C1 of the M-sided polygon and the center C2 of the light region 300 is less than 4.5% of the pitch P of the light region 300. For example, the distance between the center C1 of the M-sided polygon and the center C2 of the light region 300 is less than 4% of the pitch P of the light region 300. For example, the distance between the center C1 of the M-sided polygon and the center C2 of the light region 300 is less than 3.5% of the pitch P of the light region 300. For example, the distance between the center C1 of the M-sided polygon and the center C2 of the light region 300 is less than 3% of the pitch P of the light region 300. For example, the distance between the center C1 of the M-sided polygon and the center C2 of the light region 300 is less than 2.5% of the pitch P of the light region 300. For example, the distance between the center C1 of the M-sided polygon and the center C2 of the light region 300 is less than 2% of the pitch P of the light region 300. For example, the distance between the center C1 of the M-sided polygon and the center C2 of the light region 300 is less than 1.5% of the pitch P of the light region 300. For example, the distance between the center C1 of the M-sided polygon and the center C2 of the light region 300 is less than 1% of the pitch P of the light region 300. For example, the distance between the center C1 of the M-sided polygon and the center C2 of the light region 300 is less than 0.5% of the pitch P of the light region 300.

For example, as shown in FIG. 10, the center C1 of the M-sided polygon coincides with the center C2 of the light region 300.

In some examples, as shown in FIG. 10, a ratio of lengths of different sides of the M-sided polygon is 0.9 to 1.1, and a ratio of the pitch P of the light region 300 to a side length of the M-sided polygon is 1.7 to 2.3.

For example, as shown in FIG. 10, the ratio of the lengths of different sides of the M-sided polygon is 0.98 to 1.08. For example, the ratio of the lengths of different sides of the M-sided polygon is 0.96 to 1.04. For example, the ratio of the lengths of different sides of the M-sided polygon is 0.95 to 1.05. For example, the ratio of the lengths of different sides of the M-sided polygon is 0.92 to 1.02.

For example, as shown in FIG. 10, all sides of the M-sided polygon are equal in length and are P'.

For example, the ratio of the pitch P of the light region 300 to the side length P' of the M-sided polygon is 1.65 to 2.25. For example, the ratio of the pitch P of the light region 300 to the side length P' of the M-sided polygon is 1.7 to 2.2. For example, the ratio of the pitch P of the light region 300 to the side length P' of the M-sided polygon is 1.75 to 2.15. For example, the ratio of the pitch P of the light region 300 to the side length P' of the M-sided polygon is 1.8 to 2.1. For example, the ratio of the pitch P of the light region 300 to the side length P' of the M-sided polygon is 1.85 to 2.05. For example, the ratio of the pitch P of the light region 300 to the side length P' of the M-sided polygon is 1.9 to 2.

For example, as shown in FIG. 10, the pitch P of the light region 300 is two times the side length P' of the M-sided polygon.

For example, the light-emitting units 310 shown in FIG. 10 satisfy the Lambert cosine law of the cosine emitter or the Lambertian emitter shown in FIGS. 3A to 3B.

In some examples, each of the light-emitting units 310 shown in FIG. 10 includes a light-emitting diode chip 323 and an encapsulation structure 324 configured to encapsulate the light-emitting diode chip 323, as shown in FIG. 2, and there is a spacing between the encapsulation structures 324 of adjacent light-emitting units 310.

For example, the light-emitting diode chip 323 may be a sub-millimeter light-emitting diode chip (miniLED), a size of an unencapsulated light-emitting diode chip 323 in a direction perpendicular to the substrate 100 may be 70 μm to 180 μm, and the maximum size of the unencapsulated light-emitting diode chip 323 in a direction parallel to the direction of the substrate 100 may be not greater than 500 μm.

For example, the encapsulated light-emitting diode chip is the light-emitting unit 310, and the maximum size in the direction parallel to the substrate 100 and the thickness of the encapsulated light-emitting diode chip 323 are greater than the corresponding parameters of the unencapsulated light-emitting diode chip 323.

For example, as shown in FIG. 2A, a single light-emitting diode chip 323 may be encapsulated as a stand-alone device to form the light-emitting unit 310 before being disposed at a corresponding position on the backlight structure, and is fixedly connected to a pad on the substrate 100.

Since the unencapsulated light-emitting diode chip can be considered as a Lambertian emitter, after the light-emitting diode chip is encapsulated, a light ray emitted at an angle ranging from $+\alpha_{1/2}$ to $-\alpha_{1/2}$ can be emitted, whereas a light ray emitted at an angle in a range other than $+\alpha 1/2$ to $-\alpha 1/2$ is basically confined to the stand-alone device due to total reflection. At this time, an included angle θ between an utmost-edge light ray of light rays emitted by the light-emitting unit 310 and the substrate 100 may be a complement angle of $\alpha_{1/2}$.

For example, as shown in FIG. 2A, the light-emitting unit 310 or the light-emitting diode chip 323 is connected to a pad 321 on the substrate 100 by a solder metal 322.

For example, the solder metal 322 may include solder tin.

For example, as shown in FIG. 2A, the encapsulation structure 324 may be doped with a color conversion material 325.

For example, the color conversion material 325 may include a fluorescent powder material or a quantum dot material.

For example, the color conversion material 325 may include a material capable of converting blue light to white light.

For example, the color conversion material 325 may include a material capable of converting blue light to red light and green light. Certainly, the encapsulation structure may not be doped with the color conversion material.

For example, as shown in FIG. 2A, the light-emitting diode chip 323 may be encapsulated after being disposed at a corresponding position on the substrate 100.

For example, a transparent material, such as transparent silicone, can be used to encapsulate each light-emitting diode chip by means of screen printing or dot printing to form the encapsulation structure 324. According to the different shapes of the encapsulation structure 324, the light-emitting angle of the light-emitting diode chip 323 can be modulated, thereby changing the light-emitting angle of the light-emitting unit 310.

For example, as shown in FIG. 2A, a surface of the encapsulation structure 324 away from the substrate 100 may be a curved surface, and the light-emitting angle of the utmost-edge light ray of the light rays emitted by the light-emitting unit 310 is slightly greater than $\alpha_{1/2}$ of the light-emitting diode chip 323. Assuming that the value of $\alpha_{1/2}$ is in the range of 40 to 65 degrees, the value of the light-emitting angle of the utmost-edge light ray of the light rays emitted by the light-emitting unit 310 may be in a range of 50 to 70 degrees.

For example, the encapsulation structure 324 may have any desired size in the direction perpendicular to the substrate 100. For example, the size of the encapsulation structure 324 in the direction perpendicular to the substrate 100 may be less than 0.5 mm. For example, the size of the encapsulation structure 324 in the direction perpendicular to the substrate 100 may be between 0.1 and 0.4 mm. For example, the size of the encapsulation structure 324 in the direction perpendicular to the substrate 100 may be between 0.2 and 0.4 mm. For example, the size of the encapsulation structure 324 in the direction perpendicular to the substrate 100 may be less than 0.3 mm. For example, the size of the encapsulation structure 324 in the direction perpendicular to the substrate 100 may be between 0.25 and 0.35 mm. For example, the size of the encapsulation structure 324 in the direction perpendicular to the substrate 100 may be between 0.15 and 0.25 mm. For example, the size of the encapsulation structure 324 in the direction perpendicular to the substrate 100 may be about 0.2 mm. For example, the size of the encapsulation structure 324 in the direction perpendicular to the substrate 100 may be about 0.3 mm.

For example, the maximum size of the encapsulation structure 324 in the direction parallel to the substrate 100 may be between 0.3 and 2.5 mm. For example, the maximum size of the encapsulation structure 324 in the direction parallel to the substrate 100 may be between 0.3 and 2.5 mm. For example, the maximum size of the encapsulation structure 324 in the direction parallel to the substrate 100 may be between 0.3 and 0.7 mm. For example, the maximum size of the encapsulation structure 324 in the direction parallel to the substrate 100 may be between 0.8 and 0.9 mm. For example, the maximum size of the encapsulation structure 324 in the direction parallel to the substrate 100 may be greater than 0.5 mm. For example, the maximum size of the encapsulation structure 324 in the direction parallel to the substrate 100 may be greater than 1.0 mm. For example, the maximum size of the encapsulation structure 324 in the direction parallel to the substrate 100 may be greater than 2.0 mm. For example, the maximum size of the encapsulation structure 324 in the direction parallel to the substrate 100 may be less than 2.0 mm.

For example, after being encapsulated as a stand-alone device, a geometric center of the light-emitting diode chip in an orthographic projection of the light-emitting diode chip on the substrate may coincide with a geometric center of an orthographic projection of the stand-alone device on the substrate. Without limitation, however, the geometric center of the orthographic projection of the light-emitting diode chip on the substrate may also be offset with respect to the geometric center of the orthographic projection of the stand-alone device on the substrate; a height of the light-emitting unit 310 in the direction perpendicular to the substrate 100 is a height of the encapsulated light-emitting diode chip.

For example, the maximum size of each light-emitting unit 310 in the direction perpendicular to the substrate 100 is not greater than 2 mm.

For example, as shown in FIG. 10, a size of the light-emitting unit 310 in a direction perpendicular to the substrate 100 is not greater than 200 µm. For example, the size of the light-emitting unit 310 in the direction perpendicular to the substrate 100 is not greater than 180 µm. For example, the size of the light-emitting unit 310 in the direction perpendicular to the substrate 100 is not greater than 160 µm. For example, the size of the light-emitting unit 310 in the direction perpendicular to the substrate 100 is not greater than 150 µm. For example, the size of the light-emitting unit 310 in the direction perpendicular to the substrate 100 is not greater than 140 µm. For example, the size of the light-emitting unit 310 in the direction perpendicular to the substrate 100 is not greater than 130 µm. For example, the size of the light-emitting unit 310 in the direction perpendicular to the substrate 100 is not greater than 120 µm. For example, the size of the light-emitting unit 310 in the direction perpendicular to the substrate 100 is not greater than 110 µm. For example, the size of the light-emitting unit 310 in the direction perpendicular to the substrate 100 is not greater than 100 µm. The size of the light-emitting unit 310 in the direction perpendicular to the substrate 100 refers to the height of the light-emitting unit 310.

In some examples, as shown in FIG. 2A, the height of the light-emitting unit 310 is 50 to 100 µm.

In some examples, as shown in FIG. 2A, the height of the light-emitting unit 310 is 80 to 100 µm.

For example, the height of the light-emitting unit 310 is 55 to 95 µm. For example, the height of the light-emitting unit 310 is 60 to 90 µm. For example, the height of the light-emitting unit 310 is 70 to 85 µm. For example, the height of the light-emitting unit 310 is 75 to 80 µm.

For example, as shown in FIG. 10, the light-emitting unit 310 has a maximum size not greater than 3 mm in a direction parallel to the substrate 100.

In some examples, as shown in FIG. 10, the maximum size of the light-emitting unit 310 in the direction parallel to the substrate 100 is not greater than 500 µm. For example, the maximum size of the light-emitting unit 310 in the direction parallel to the substrate 100 is not greater than 450 µm. For example, the maximum size of the light-emitting unit 310 in the direction parallel to the substrate 100 is not greater than 400 µm. For example, the maximum size of the light-emitting unit 310 in the direction parallel to the substrate 100 is not greater than 350 µm. For example, the maximum size of the light-emitting unit 310 in the direction parallel to the substrate 100 is not greater than 330 µm. For example, the maximum size of the light-emitting unit 310 in the direction parallel to the substrate 100 is not greater than 300 µm. For example, the maximum size of the light-emitting unit 310 in the direction parallel to the substrate 100 is not greater than 280 µm.

For example, as shown in FIG. 10, a size of the light-emitting unit 310 in at least one of the first direction and the second direction is not greater than 250 µm. For example, the size of the light-emitting unit 310 in at least one of the first direction and the second direction is not greater than 240 µm. For example, the size of the light-emitting unit 310 in at least one of the first direction and the second direction is not greater than 230 µm. For example, the size of the light-emitting unit 310 in at least one of the first direction and the second direction is not greater than 220 µm. For example, the light-emitting unit 310 has a size of 219 µm in both the first direction and the second direction.

The shape of the light-emitting unit described above may refer to the shape of the orthographic projection of the light-emitting unit on the substrate.

For example, the light-emitting unit may be in the shape of a quadrilateral, such as a rectangle, and the maximum size of the light-emitting unit in the direction parallel to the substrate may be a length of a diagonal of the quadrilateral.

For example, the light-emitting unit may be in the shape of an oval, and the maximum size of the light-emitting unit in the direction parallel to the substrate may be a length of a long axis of the oval.

For example, the light-emitting unit may be in the shape of a circle, and the maximum size of the light-emitting unit in the direction parallel to the substrate may be a diameter.

Certainly, this embodiment of the present disclosure is not limited thereto, and the light-emitting unit in the example shown in FIG. 10 may further include only the unencapsulated light-emitting diode chip 323, as shown in FIG. 2B. The maximum size of the unencapsulated light-emitting diode chip 323 in the direction parallel to the substrate 100 may be not greater than 500 µm.

Figure 11:
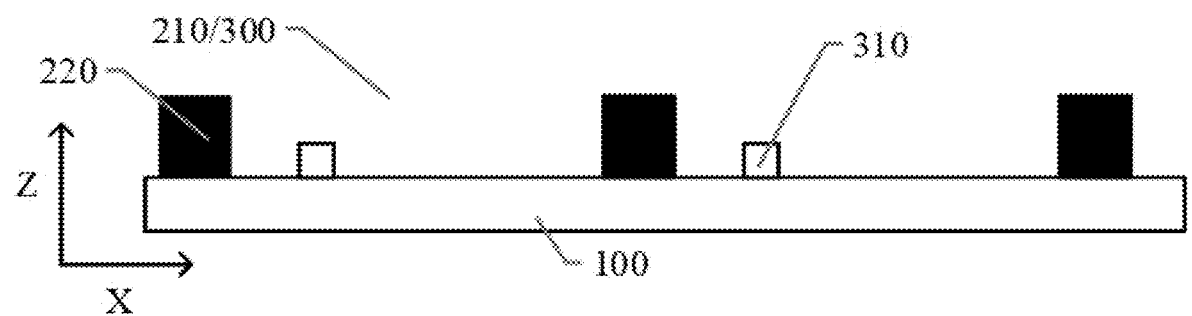
FIG. 11 is a schematic diagram of a partial cross-sectional structure cut along line BB' shown in FIG. 10 according to an example of an embodiment of the present disclosure.

FIG. 11 is a schematic diagram of a partial cross-sectional structure cut along line BB' shown in FIG. 10 according to an example of an embodiment of the present disclosure.

In some examples, as shown in FIG. 11, a thickness of the barrier wall 220 is greater than a height of the light-emitting unit 310 in a direction perpendicular to the substrate 100.

In some examples, as shown in FIG. 11, the thickness of the barrier wall 220 is 200 to 400 µm and the height of the light-emitting unit 310 is 50 to 100 µm. The thickness of the barrier wall 220 described above refers to the size of the barrier wall 220 in the direction perpendicular to the substrate 100.

In some examples, as shown in FIG. 11, the thickness of the barrier wall 220 is 250 to 270 µm.

For example, the thickness of the barrier wall 220 may be 210 to 390 µm. For example, the thickness of the barrier wall 220 may be 220 to 370 µm. For example, the thickness of the barrier wall 220 may be 230 to 350 µm. For example, the thickness of the barrier wall 220 may be 235 to 320 µm. For example, the thickness of the barrier wall 220 may be 240 to 300 µm. For example, the thickness of the barrier wall 220 may be 245 to 280 µm.

In some examples, as shown in FIG. 11, the barrier wall 220 has a width of 350 to 500 µm. The width of the barrier wall 220 refers to the size, in the first direction, of the barrier wall 220 between two adjacent light regions 300 in the first direction, or the size, in the second direction, of the barrier wall 220 between two adjacent light regions 300 in the second direction.

For example, as shown in FIG. 11, the barrier wall 220 has a width of 370 to 480 µm. For example, the width of the barrier wall 220 may be 350 to 450 µm. For example, the width of the barrier wall 220 may be 360 to 440 µm. For example, the width of the barrier wall 220 may be 370 to 430 µm. For example, the width of the barrier wall 220 may be 380 to 420 µm. For example, the width of the barrier wall 220 may be 390 to 410 µm. For example, the width of the barrier wall 220 may be 400 µm.

In some examples, as shown in FIG. 11, the barrier wall 220 includes a shading material. For example, the material of the barrier wall 220 may include black resin.

In some examples, as shown in FIG. 10, the light-emitting units 310 disposed in each light region 300 are electrically connected. For example, a plurality of light-emitting units 310 in each light region 300 is connected in series. For example, the plurality of light-emitting units 310 in each light region 300 is connected in parallel.

In the backlight structure of the present disclosure, each light region is surrounded by a circle of barrier wall capable of shading, which is conducive to reducing the crosstalk of light rays between different light regions and alleviate the halo phenomenon.

In some examples, as shown in FIG. 10, at least some of the light regions 300 are in the shape of a rectangle, and two adjacent sides in the rectangle extend in the first direction and the second direction, respectively.

For example, all of the light regions 300 are in the shape of a rectangle. For example, different light regions 300 have the same shape and are of the same size.

Certainly, this embodiment of the present disclosure is not limited thereto. The substrate may be divided into a plurality of regions according to product requirements, the sizes of the light regions in different regions may be different, and the sizes of the light regions in the same region are the same.

Figure 12:
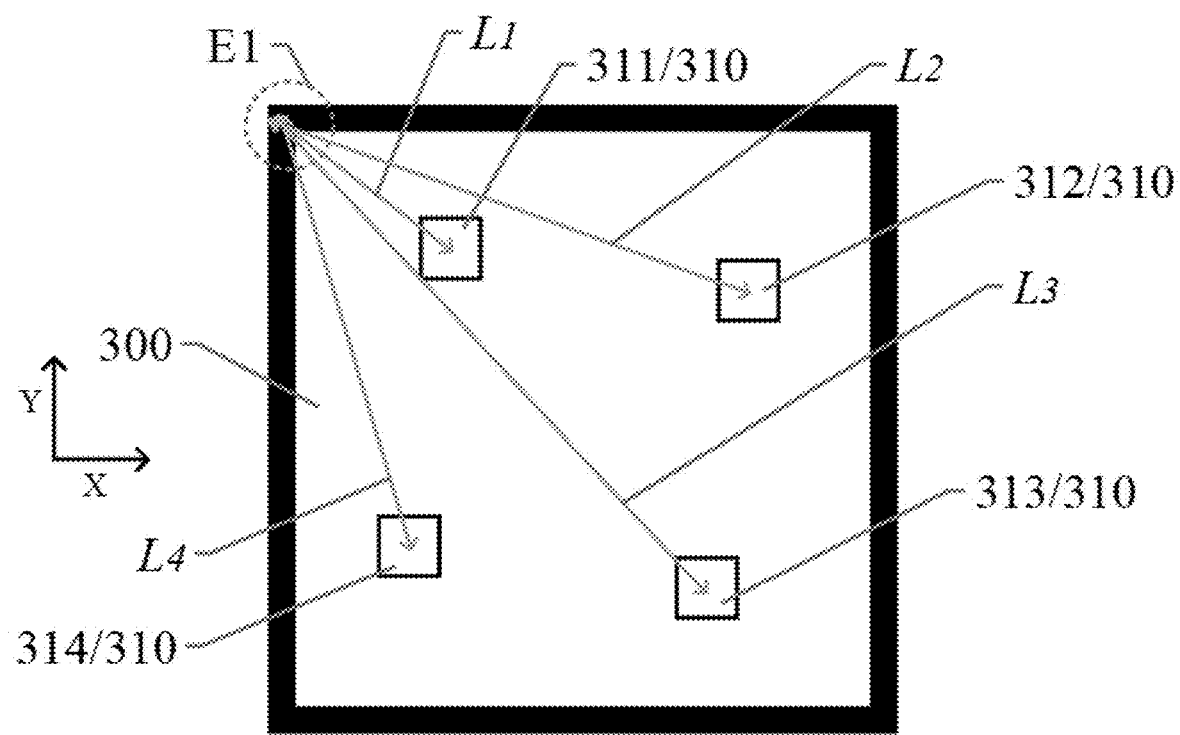
FIG. 12 is a schematic diagram of light-emitting units in one of light regions shown in FIG. 10.

FIG. 12 is a schematic diagram of light-emitting units in one of light regions shown in FIG. 10. One light region including four light-emitting units is schematically illustrated in the example shown in FIG. 12, in which an M-sided polygon is a quadrilateral.

For example, as shown in FIG. 12, the one light region 300 may be in the shape of a square, and the M-sided polygon formed by a line connecting centers of the four light-emitting units 310 located in the light region 300 may be a square.

For example, as shown in FIG. 12, the light intensity $I_1$ of an area E1 may be obtained from the relation equation $I_1=I_0 \times m \times h \times (1/L_1+1/L_2+ \ldots +1/L_N)$ based on the calculation shown in FIG. 5, where N takes a value of the number of light-emitting units in the light region, and N may be 4 as shown in FIG. 12.

In some examples, as shown in FIGS. 10 and 12, $I_0$, m, and h in the relation equation $I_1=I_0 \times m \times h \times (1/L_1+1/L_2+ \ldots +1/L_N)$ are considered as constants, each light region 300 of at least some light regions 300 includes N light-emitting units 310, where N≥M, and a distance from the center of an i-th light-emitting unit 310 to a vertex angle of the light region 300 is $L_i$, i takes a value in a range of 1 to N, and $L_i$, P, and N satisfy: $8.5 \geq P \times (1/L_1+1/L_2+ \ldots +1/L_N) \geq 6.3$, where $P \times (1/L_1+1/L_2+ \ldots +1/L_N)$ can be used as an approximate reference value for the unitless relative light intensity at the edge position.

For example, $8.3 \geq P \times (1/L_1+1/L_2+ \ldots +1/L_N) \geq 6.5$. For example $8.1 \geq P \times (1/L_1+1/L_2+ \ldots +1/L_N) \geq 6.6$. For example, $8.2 \geq P \times (1/L_1+1/L_2+ \ldots +1/L_N) \geq 6.7$. For example, $8 \geq P \times (1/L_1+1/L_2+ \ldots +1/L_N) \geq 6$. For example, $7.9 \geq P \times (1/L_1+1/L_2+ \ldots +1/L_N) \geq 6.9$. For example, $7.8 \geq P \times (1/L)+1/L_2+ \ldots +1/L_N) \geq 7$. For example, $7.7 \geq P \times (1/L_1+1/L_2+ \ldots +1/L_N) \geq 6.8$. For example, $7.5 \geq P \times (1/L_1+1/L_2+ \ldots +1/L_N) \geq 7.1$. For example, $7.6 \geq P \times (1/L_1+1/L_2+ \ldots +1/L_N) \geq 7.2$. For example, $7.4 \geq P \times (1/L_1+1/L_2+ \ldots +1/L_N) \geq 7.3$.

The vertex angle of the light region described above may refer to the area E1 shown in FIG. 12.

For example, as shown in FIG. 12, the light region 300 includes four light-emitting units, and a distance from the center of an i-th light-emitting unit 310 to a vertex angle of the light region 300 is $L_i$, where i takes a value in the range of 1 to 4, and $L_i$, P, and N satisfy: $8.5 \geq P \times (1/L_1 + 1/L_2 + 1/L_3 + 1/L_4) \geq 6.3$.

For example, as shown in FIG. 12, taking the pitch of the light region 300 as 4.46 mm and a side length of the quadrilateral as 2.23 mm as an example, the value of $L_1$ is 1.123379 μm, the value of $L_2$ is 3.363531 μm, the value of $L_3$ is 4.149638 μm, and the value of $L_4$ is 2.669986 μm. The parameters are substituted into $P \times (1/L_1 + 1/L_2 + \ldots + 1/L_N)$ to obtain $P \times (1/L_1 + 1/L_2 + 1/L_3 \ldots + 1/L_N) = 8.04$.

For example, as shown in FIGS. 10 and 12, the four light-emitting units 310 included in the light region 300 form a quadrilateral, and an included angle between one of the first direction and the second direction and at least one side of the quadrilateral is 12 degrees.

For example, as shown in FIG. 12, the light region 300 is in the shape of a first square, centers of the four light-emitting units 310 included in the light region 300 are sequentially connected to form a second square, and an included angle between a diagonal of the first square and a diagonal of the second square is 12 degrees.

According to this embodiment of the present disclosure, the light intensity in the edge region of the light region is increased by rotating the M-sided polygon formed by the light-emitting units in the light region so that neither side of the M-sided polygon is parallel to the first direction and the second direction.

In some examples, as shown in FIG. 12, a ratio of light intensity at the edge position of the light region 300, such as an area E1, to light intensity at the center position of the light region 300 is not less than 0.5.

For example, the ratio of the light intensity at the edge position of the light region 300 to the light intensity at the center position of the light region 300 is not less than 0.55. For example, the ratio of the light intensity at the edge position of the light region 300 to the light intensity at the center position of the light region 300 is not less than 0.6. For example, the ratio of the light intensity at the edge position of the light region 300 to the light intensity at the center position of the light region 300 is not less than 0.65. For example, the ratio of the light intensity at the edge position of the light region 300 to the light intensity at the center position of the light region 300 is not less than 0.7. For example, the ratio of the light intensity at the edge position of the light region 300 to the light intensity at the center position of the light region 300 is not less than 0.75. For example, the ratio of the light intensity at the edge position of the light region 300 to the light intensity at the center position of the light region 300 is not less than 0.8. For example, the ratio of the light intensity at the edge position of the light region 300 to the light intensity at the center position of the light region 300 is not less than 0.85. For example, the ratio of the light intensity at the edge position of the light region 300 to the light intensity at the center position of the light region 300 is not less than 0.9.

For example, as shown in FIGS. 10 and 12, a ratio of the pitch of the light region 300 to a side length of the quadrilateral is 1.7 to 2.3. For example, the ratio of the pitch of the light region 300 to the side length of the quadrilateral is 1.65 to 2.25. For example, the ratio of the pitch of the light region 300 to the side length of the quadrilateral is 1.7 to 2.2. For example, the ratio of the pitch of the light region 300 to the side length of the quadrilateral is 1.75 to 2.15. For example, the ratio of the pitch of the light region 300 to the side length of the quadrilateral is 1.8 to 2.1. For example, the ratio of the pitch of the light region 300 to the side length of the quadrilateral is 1.85 to 2.05. For example, the ratio of the pitch of the light region 300 to the side length of the quadrilateral is 1.9 to 2.

In some examples, as shown in FIGS. 10 and 12, at least some of the light regions 300 are in the shape of a rectangle, and two adjacent sides in the rectangle extend in the first direction and the second direction, respectively.

For example, all of the light regions 300 are in the shape of a rectangle.

For example, at least some of the light regions 300 are in the shape of a square.

In some examples, as shown in FIGS. 10, 3A, and 12, the light intensity distribution I of the light-emitting units 310 satisfies $I = I_0 \cos m\alpha$, $I_0$ is the light intensity distribution in the direction of the normal perpendicular to a light exit surface of the light-emitting unit 310, a is the included angle between the light emitting direction of the light-emitting unit 310 and the normal, $m = (-\ln 2)/(\ln \cos \alpha_{1/2})$, $\alpha_{1/2}$ is the included angle between the light emitting direction and the normal when the light intensity is reduced to half of the light intensity corresponding to the normal direction, and the optical path of the light ray emitted by the light-emitting unit 310 in the normal direction is h; each light region 300 of the at least some of the light regions 300 includes N light-emitting units 310, where N≥M, and the distance between the center of the i-th light-emitting unit 310 and the vertex angle of the light region 300 is $L_i$, i takes a value in a range of 1 to N, and $L_i$, h, and N satisfy: $0.5 \geq \cos m \times [(\pi/2) - (h/L_1)] + \cos m \times [(\pi/2) - (h/L_2)] + \ldots + \cos m \times [(\pi/2) - (h/L_N)] \geq 0.23$.

For example, as shown in FIGS. 10 and 12, in the case that the light-emitting unit 310 has a small emergent light angle θ, $\tan \theta \approx \theta = h/L$. $\tan \theta \approx \theta = h/L$ as well as $\alpha = (\pi/2) - \theta$ are substituted into the formula $\cos m\alpha$ to obtain $\cos m\alpha = \cos m \times [(\pi/2) - \theta] = \cos m \times [(\pi/2) - (h/L)]$. Thus, the light intensity in the area E1 shown in FIG. 12 is obtained as $I_1 = I_0 \times \cos m \times [(\pi/2) - (h/L_1)] + I_0 \times \cos m \times [(\pi/2) - (h/L_2)] + \ldots + I_0 \times \cos m \times [(\pi/2) - (h/L_N)]$, where N takes the value of the number of light-emitting units in the light region, and N may be 4 shown in FIG. 12, and then $I_1 = I_0 \times \cos m \times [(\pi/2) - (h/L_1)] + I_0 \times \cos m \times [(\pi/2) - (h/L_2)] + I_0 \times \cos m \times [(\pi/2) - (h/L_3)] + I_0 \times \cos m \times [(\pi/2) - (h/L_N)]$.

The above relation equation 2: $I_1 = I_0 \times \cos m \times [(\pi/2) - (h/L_1)] + I_0 \times \cos m \times [(\pi/2) - (h/L_2)] + \ldots + I_0 \times \cos m \times [(\pi/2) - (h/L_N)]$ may also be expressed as $I_1 = I_0 \times S$, where m is approximately equal to 1.

For example, taking the pitch of the light region 300 as 4.46 mm and the pitch of the light-emitting units 310 as 2.23 mm as an example, then S=0.285151.

For example, $0.48 \geq \cos m \times [(\pi/2) - (h/L_1)] + \cos m \times [(\pi/2) - (h/L_2)] + \ldots + \cos m \times [(\pi/2) - (h/L_N)] \geq 0.25$.

For example, $0.45 \geq \cos m \times [(\pi/2) - (h/L_1)] + \cos m \times [(\pi/2) - (h/L_2)] + \ldots + \cos m \times [(\pi/2) - (h/L_N)] \geq 0.27$.

For example, $0.42 \geq \cos m \times [(\pi/2) - (h/L_1)] + \cos m \times [(\pi/2) - (h/L_2)] + \ldots + \cos m \times [(\pi/2) - (h/L_N)] \geq 0.28$.

For example, $0.4 \geq \cos m \times [(\pi/2) - (h/L_1)] + \cos m \times [(\pi/2) - (h/L_2)] + \ldots + \cos m \times [(\pi/2) - (h/L_N)] \geq 0.3$.

For example, $0.38 \geq \cos m \times [(\pi/2) - (h/L_1)] + \cos m \times [(\pi/2) - (h/L_2)] + \ldots + \cos m \times [(\pi/2) - (h/L_N)] \geq 0.32$.

For example, $0.36 \geq \cos m \times [(\pi/2) - (h/L_1)] + \cos m \times [(\pi/2) - (h/L_2)] + \ldots + \cos m \times [(\pi/2) - (h/L_N)] \geq 0.35$.

In another example of the embodiment of the present disclosure, the included angle between each of the sides of the M-sided polygon shown in FIG. 12 and the first direction or the second direction is not changed, for example, the included angle is 12 degrees, and only the pitch of the light region 300 shown in FIG. 12 and the side length of the M-sided polygon formed by the light-emitting units 310 are adjusted, for example, the pitch of the light region 300 is adjusted to be 5.12 mm, the side length of the M-sided polygon is 2.56 μm, and then the value of $L_1$ is 1.162167 μm, the value of $L_2$ is 4.156017 μm, the value of $L_3$ is 5.113352 μm, and the value of $L_4$ is 3.43394 μm.

For example, the parameters are substituted into $P \times (1/L_1 + 1/L_2 + \ldots + 1/L_N)$ to obtain $P \times (1/L_1 + 1/L_2 + \ldots + 1/L_N) = 8.13$.

For example, the parameters are substituted into $S = \cos m \times [(\pi/2) - (h/L_1)] + \cos m \times [(\pi/2) - (h/L_2)] + \ldots + \cos m \times [(\pi/2) - (h/L_N)]$ to obtain: $S = 0.323765$.

In the backlight structure provided in the embodiment of the present disclosure, by rotating the M-sided polygon formed by the light-emitting units in the light region and adjusting the pitch of the light region and the side length of the M-sided polygon, it is beneficial to further improve the light intensity in the edge region of the light region.

FIGS. 13A to 13G are schematic diagrams of one light region according to another example of an embodiment of the present disclosure. FIG. 14 is a relationship diagram of relative light intensity at the edge position of the light region after an M-sided polygon in the light region shown in FIGS. 13A to 13G respectively is rotated at different angles.

The relative light intensity shown in FIG. 14 may refer to a value of Q at the edge position of the light region, where $Q = P \times (1/L_1 + 1/L_2 + \ldots + 1/L_N)$.

In this embodiment of the present disclosure, the rotation of the M-sided polygon at different angles may refer to rotating the M-sided polygon at a certain angle in a certain region where the center of the M-sided polygon is located, for example, a square is rotated at a certain angle in a certain region where the center of the square is located.

The rotation mentioned above may refer to rotating the M-sided polygon clockwise or rotating the M-sided polygon counterclockwise.

A difference between the light region shown in FIGS. 13A to 13G and the light region shown in FIG. 12 is that the included angle between each side of the M-sided polygon and either of the first direction and the second direction is different.

Figure 13A:
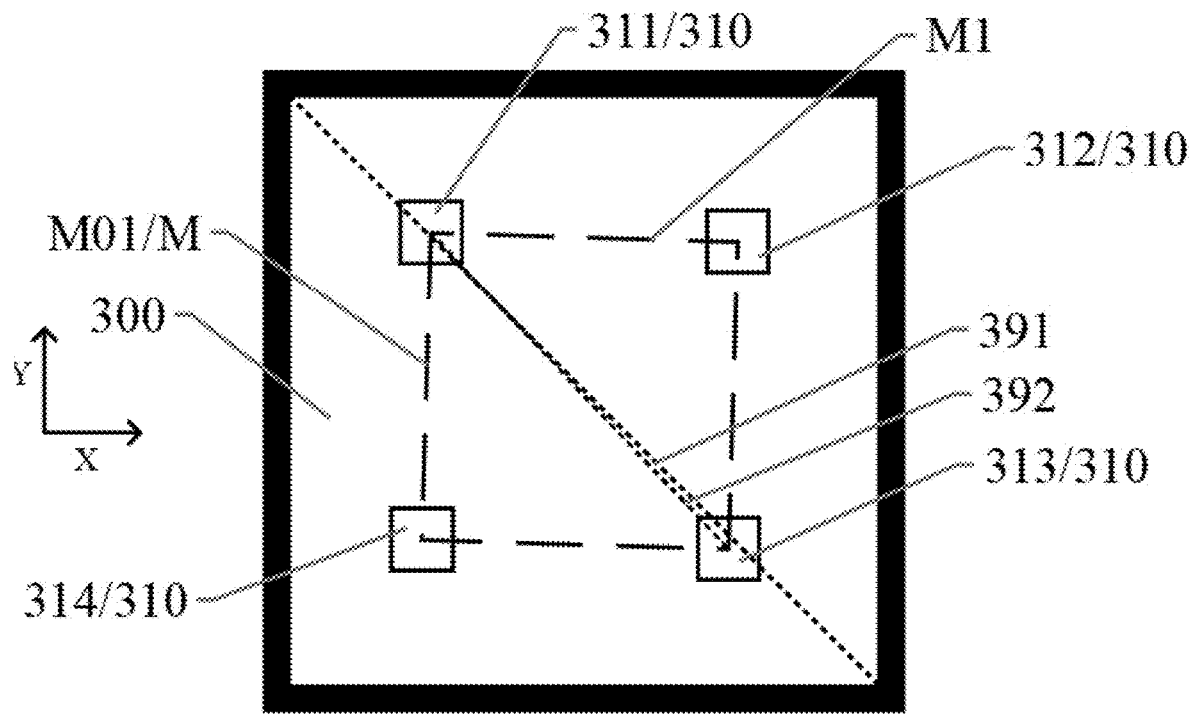
FIGS. 13A to 13G are schematic diagrams of one light region according to another example of an embodiment of the present disclosure.
Figure 13B:
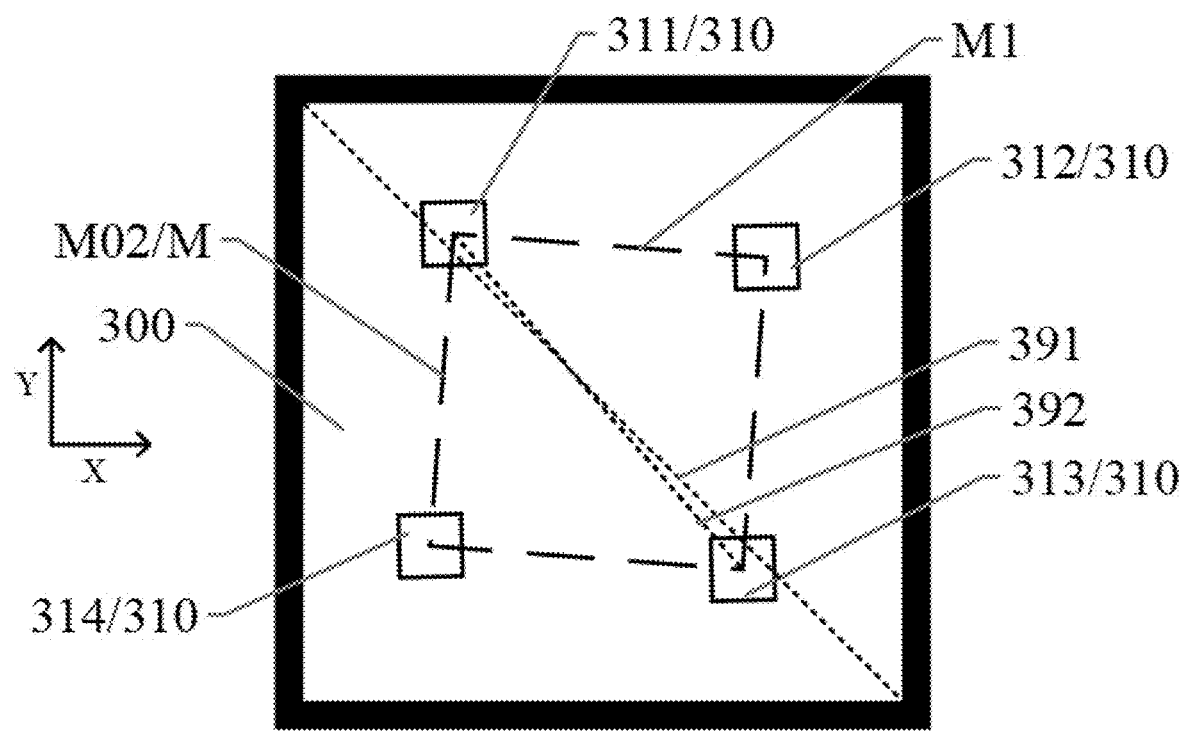
Figure 13C:
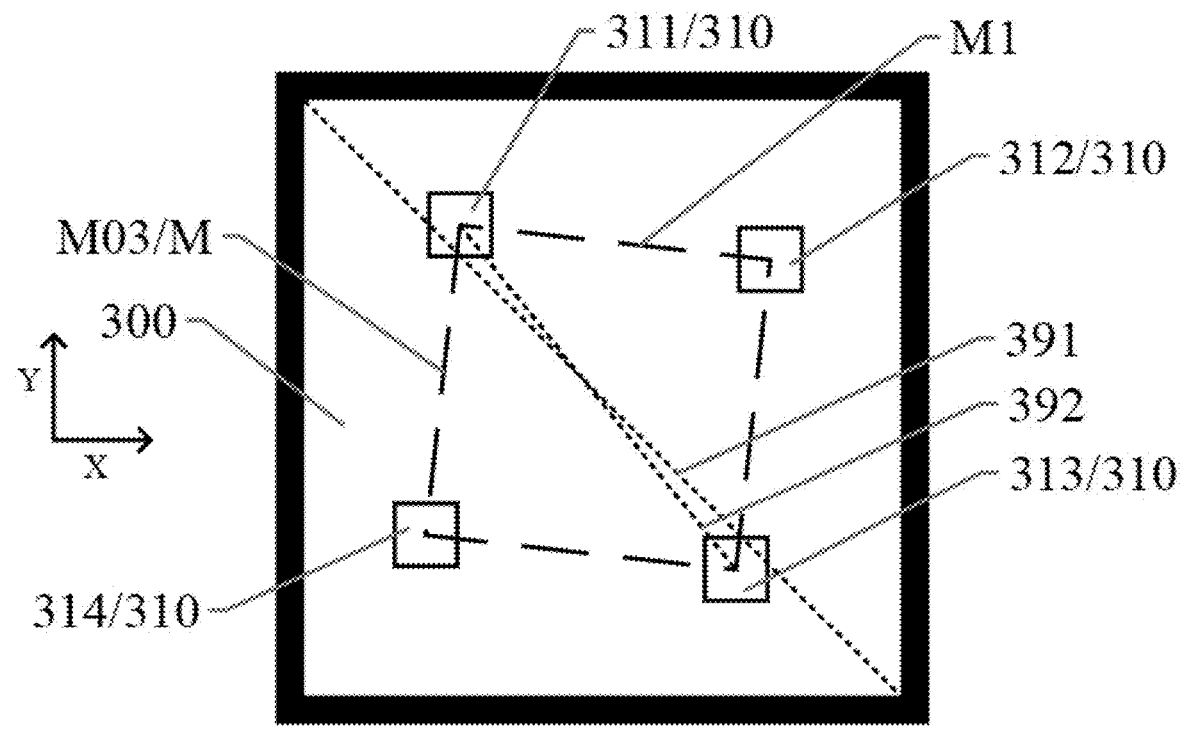
Figure 13D:
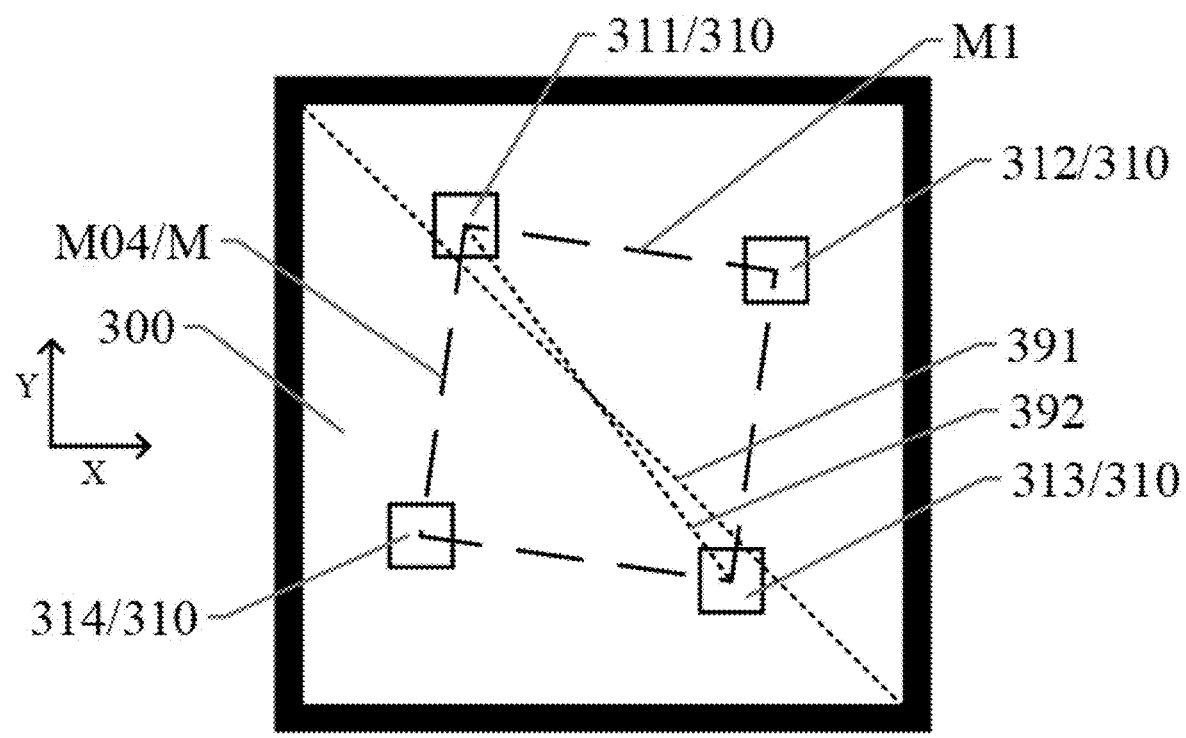
Figure 13E:
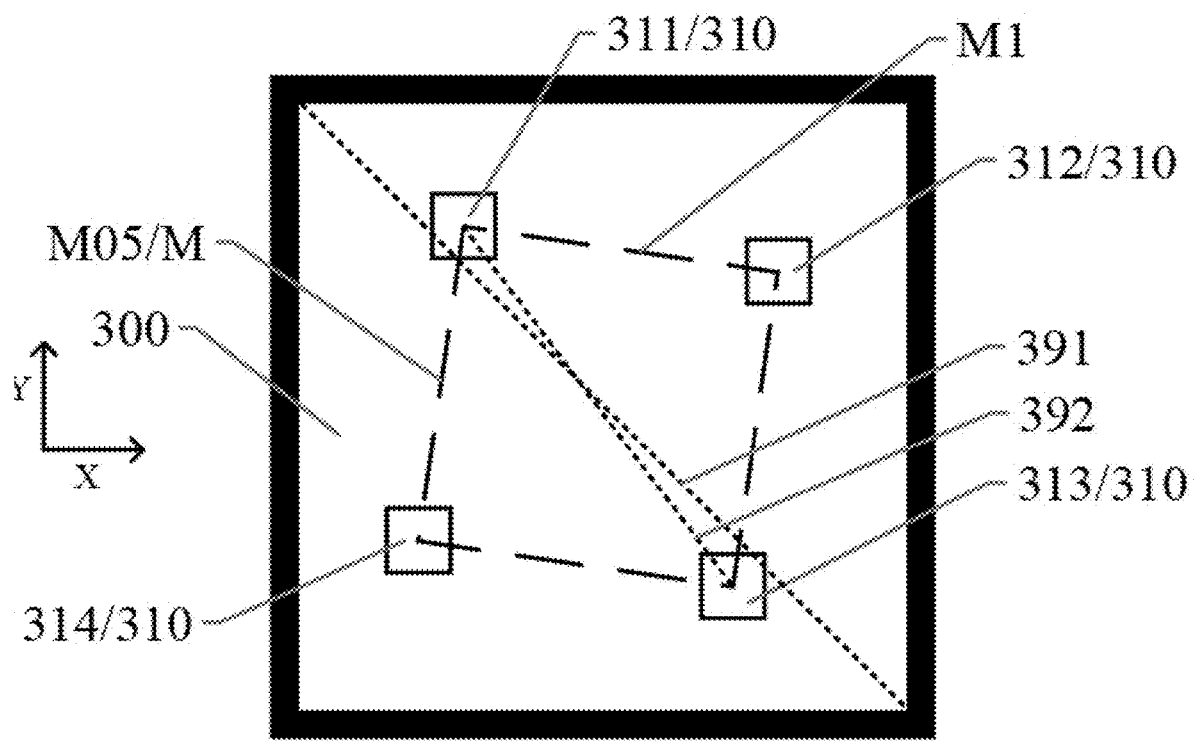
Figure 13F:
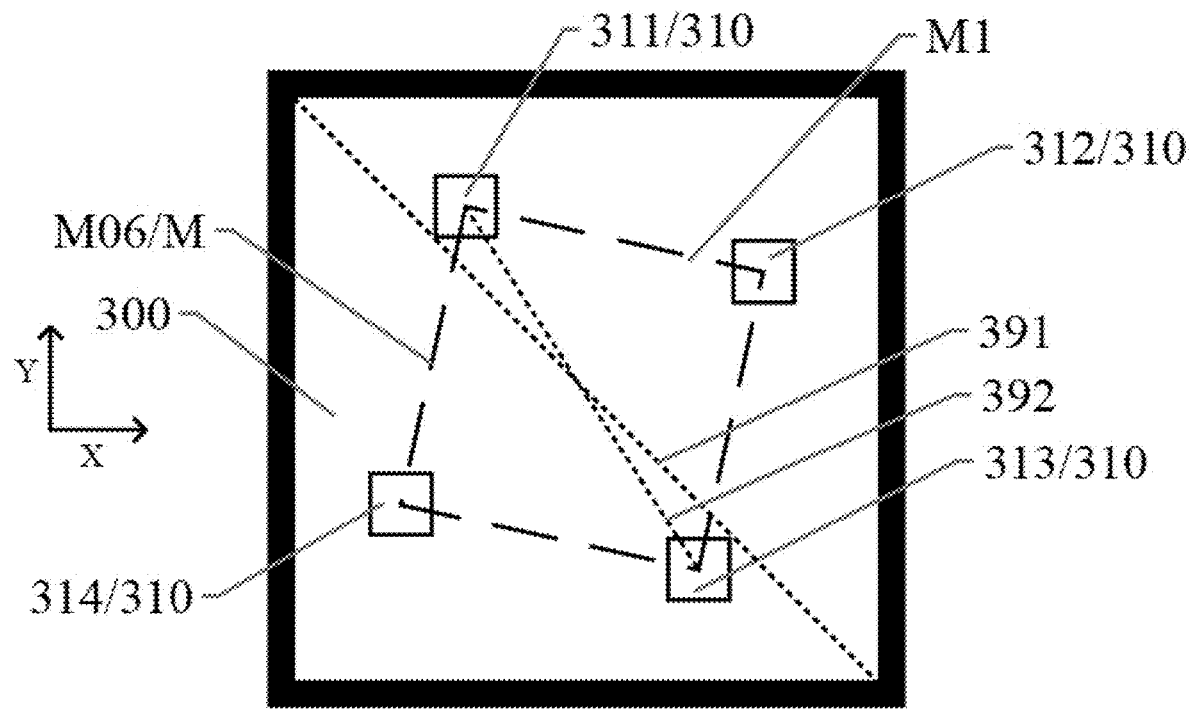
Figure 13G:
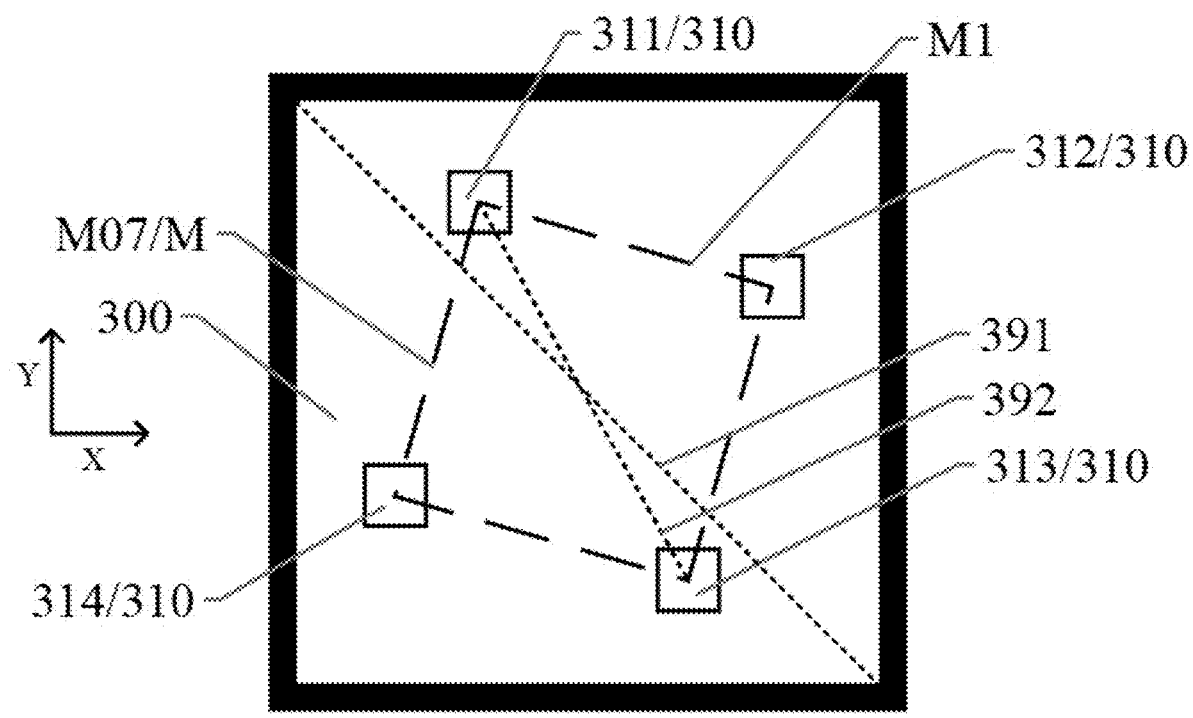
Figure 14:
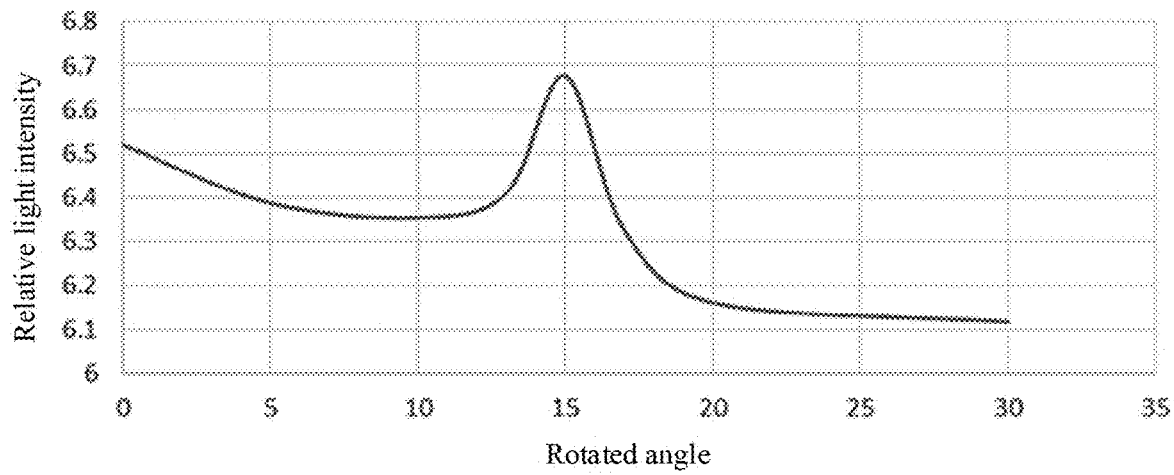
FIG. 14 is a relationship diagram of relative light intensity at the edge position of the light region after an M-sided polygon in the light region shown in FIGS. 13A to 13G respectively is rotated at different angles.

For example, an included angle between a side M1 of an M-sided polygon M01 and the first direction shown in FIG. 13A may be 5 degrees; an included angle between a side M1 of an M-sided polygon M02 and the first direction shown in FIG. 13B may be 10 degrees; an included angle between a side M1 of an M-sided polygon M03 and the first direction shown in FIG. 13C may be 13 degrees; an included angle between a side M1 of an M-sided polygon M04 and the first direction shown in FIG. 13D may be 15 degrees; an included angle between a side M1 of an M-sided polygon M05 and the first direction shown in FIG. 13E may be 17 degrees; an included angle between a side M1 of an M-sided polygon M06 and the first direction shown in FIG. 13F may be 20 degrees; and an included angle between a side M1 of an M-sided polygon M07 and the first direction shown in FIG. 13G may be 30 degrees.

For example, an included angle between a diagonal 392 of the second square M01 and a diagonal 391 of the first square shown in FIG. 13A may be 5 degrees; an included angle between a diagonal 392 of the second square M02 and the diagonal 391 of the first square shown in FIG. 13B may be 10 degrees; an included angle between a diagonal 392 of the second square M03 and the diagonal 391 of the first square shown in FIG. 13C may be 13 degrees; an included angle between a diagonal 392 of the second square M04 and the diagonal 391 of the first square shown in FIG. 13D may be 15 degrees; an included angle between a diagonal 392 of the second square M05 and the diagonal 391 of the first square shown in FIG. 13E may be 17 degrees; an included angle between a diagonal 392 of the second square M06 and the diagonal 391 of the first square shown in FIG. 13F may be 20 degrees; and an included angle between a diagonal 392 of the second square M07 and the diagonal 391 of the first square shown in FIG. 13G may be 30 degrees.

Certainly, this embodiment of the present disclosure is not limited to rotating the M-shaped polygon at the degrees described above, and degrees of rotation of the M-sided polygon may be selected according to the product requirements.

In some examples, as shown in FIGS. 13A to 13G and 14, each light region 300 of the at least some of the light regions 300 includes at least four light-emitting units 310, the at least four light-emitting units 310 are arranged to form an M-sided polygon, and an included angle between one of the first direction and the second direction and at least one side of the M-sided polygon is 12 to 18 degrees.

In some examples, as shown in FIGS. 13A to 13G, and FIG. 14, each light region 300 of the at least some of the light regions 300 is in the shape of the first square, each light region 300 of the at least some of the light region 300 includes at least four light-emitting units 310, and the centers of the four light-emitting units 310, closest to four vertex angles of the light region 300, among the at least four light-emitting units 310 are sequentially connected to form the second square, and an included angle between a diagonal of the first square and a diagonal of the second square is 12 to 18 degrees.

For example, as shown in FIGS. 13A to 13G, and FIG. 14, each light region 300 of the at least some of the light regions 300 includes four light-emitting units 311, 312, 313, and 314, the four light-emitting units 311, 312, 313, and 314 are arranged to form a quadrilateral, and an included angle between one of the first direction and the second direction and at least one side of the quadrilateral is 12 to 18 degrees.

For example, as shown in FIGS. 13A to 13G, the light region 300 is in the shape of a first square, centers of the four light-emitting units 310 included in the light region 300 are sequentially connected to form a second square, and an included angle between a diagonal of the first square and a diagonal of the second square may be 5 degrees, 10 degrees, 13 degrees, 15 degrees, 17 degrees, 20 degrees, or 30 degrees. Certainly, this embodiment of the present disclosure is not limited to the included angle between the diagonal of the first square and the diagonal of the second square being the above-mentioned degrees, and the included angle between the diagonal of the first square and the diagonal of the second square may be selected according to the product requirements.

For example, as shown in FIGS. 13A to 13G, a ratio of the pitch of the light region 300 to a side length of the second square is 1.7 to 2.3. For example, the ratio of the pitch of the light region 300 to the side length of the second square is 1.65 to 2.25. For example, the ratio of the pitch of the light region 300 to the side length of the second square is 1.7 to 2.2. For example, the ratio of the pitch of the light region 300 to the side length of the second square is 1.75 to 2.15. For example, the ratio of the pitch of the light region 300 to the side length of the second square is 1.8 to 2.1. For example, the ratio of the pitch of the light region 300 to the side length of the second square is 1.85 to 2.05. For example, the ratio of the pitch of the light region 300 to the side length of the second square is 1.9 to 2.

For example, as shown in FIGS. 13A to 13G, the light intensity at the edge of the light region 300, such as a corner area, satisfies $I_1=I_0\times m\times h\times(1/L)+1/L_2+\ldots+1/L_N)$, where a distance from the center of an i-th light-emitting unit 310 to a vertex angle of the light region 300 is $L_i$, the pitch P of the light region 300, and the number N of light-emitting units 310 satisfies: $8.5\geq P\times(1/L)+1/L_2+\ldots+1/L_N)\geq 6.3$.

For example, as shown in FIGS. 13A to 13G, $Q=P\times(1/L_1+1/L_2+1/L_3+1/L_4)$, $8.5\geq Q\geq 6.3$.

For example, as shown in FIGS. 13A to 13G, the size of the light-emitting unit 310 may be 0.219 mm×0.219 mm.

For example, as shown in FIG. 13A to FIG. 13G and FIG. 14, for example, taking the pitch of the light region 300 as 4.8 mm, the pitch of the light-emitting unit 310 as 2.6 mm, the side length of the M-sided polygon as 2.6 mm as an example, the included angle between the side M1 of the second square and the first direction, i.e., when the included angle between the diagonal of the first square and the diagonal of the second square is 0 degrees, Q=6.521148; when the included angle between the side M1 of the second square and the first direction is 5 degrees, Q=6.386526; when the included angle between the side M1 of the second square and the first direction is 10 degrees, Q=6.353103; when the included angle between the side M1 of the second square and the first direction is 13 degrees, Q=6.409105; when the included angle between the side M1 of the second square and the first direction is 15 degrees, Q=6.677322; when the included angle between the side M1 of the second square and the first direction is 17 degrees, Q=6.325694; when the included angle between the side M1 of the second square and the first direction is 20 degrees, Q=6.161672; and when the included angle between the side M1 of the second square and the first direction is 30 degrees, Q=6.117308. Thus, the relative light intensity at the edge position of the light region becomes first larger and then smaller as the angle increases after the M-sided polygon is rotated at different angles.

For example, as shown in FIG. 14, when the M-sided polygon, e.g., the second square, is rotated at an angle of 12 to 18 degrees, the value of the relative light intensity Q at the edge position of the light region is larger.

In the backlight structure provided in the embodiment of the present disclosure, by adjusting the angle of the M-sided polygon formed by the arrangement of light-emitting units in the light region to a certain range, e.g., 12 to 18 degrees, and by setting the pitch of the light region and the side length of the M-sided polygon, improvement of the light intensity at the edge of the light region is facilitated, thereby improving the light emitting uniformity of the light region.

For example, the included angle between the diagonal of the first square and the diagonal of the second square is 13 to 17 degrees. For example, the included angle between the diagonal of the first square and the diagonal of the second square is 14.5 to 16.5 degrees. For example, the included angle between the diagonal of the first square and the diagonal of the second square is 15 to 16 degrees.

For example, as shown in FIGS. 13A to 13G, the ratio of the light intensity at the edge position of the light region 300, such as a vertex angle area, to the light intensity at the center position of the light region 300 is not less than 0.5.

For example, the ratio of the light intensity at the edge position of the light region 300 to the light intensity at the center position of the light region 300 is not less than 0.55. For example, the ratio of the light intensity at the edge position of the light region 300 to the light intensity at the center position of the light region 300 is not less than 0.6. For example, the ratio of the light intensity at the edge position of the light region 300 to the light intensity at the center position of the light region 300 is not less than 0.65. For example, the ratio of the light intensity at the edge position of the light region 300 to the light intensity at the center position of the light region 300 is not less than 0.7. For example, the ratio of the light intensity at the edge position of the light region 300 to the light intensity at the center position of the light region 300 is not less than 0.75. For example, the ratio of the light intensity at the edge position of the light region 300 to the light intensity at the center position of the light region 300 is not less than 0.8. For example, the ratio of the light intensity at the edge position of the light region 300 to the light intensity at the center position of the light region 300 is not less than 0.85. For example, the ratio of the light intensity at the edge position of the light region 300 to the light intensity at the center position of the light region 300 is not less than 0.9.

FIGS. 15A to 15G are schematic diagrams of one light region according to another example of an embodiment of the present disclosure. FIG. 16 is a relationship diagram of relative light intensity at the edge position of the light region after an M-sided polygon in the light region shown in FIGS. 15A to 15G respectively is rotated at different angles.

Figure 15A:
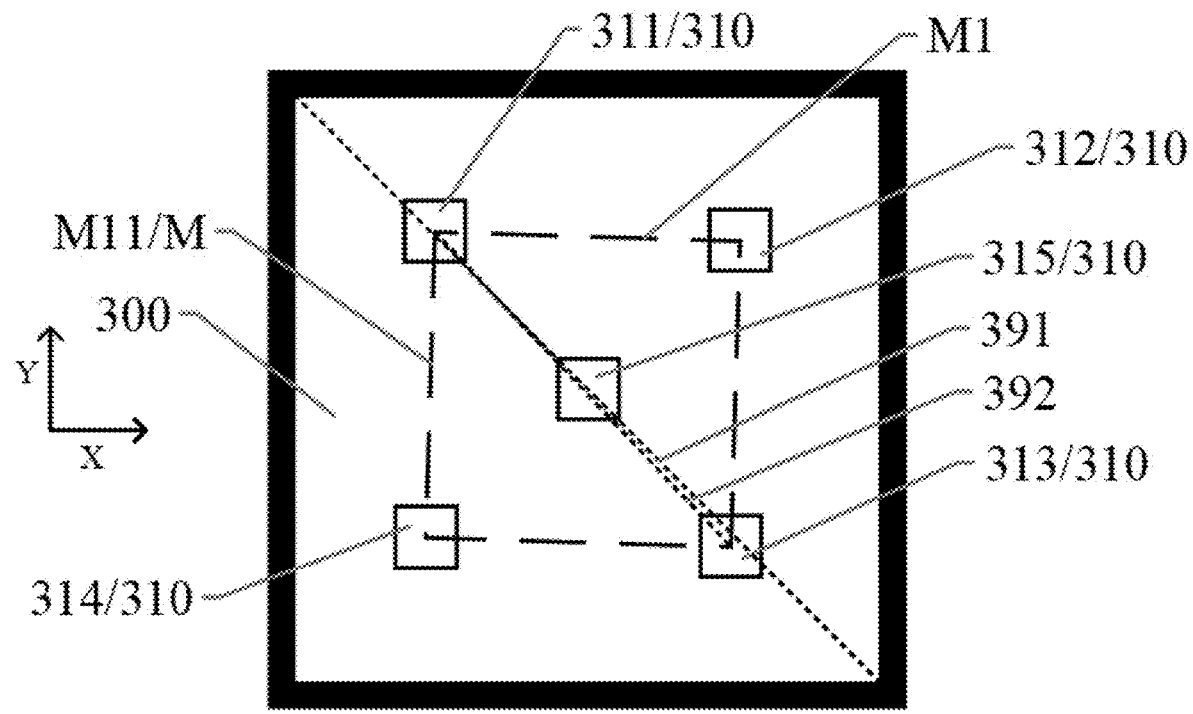
FIGS. 15A to 15G are schematic diagrams of one light region according to another example of an embodiment of the present disclosure.
Figure 15B:
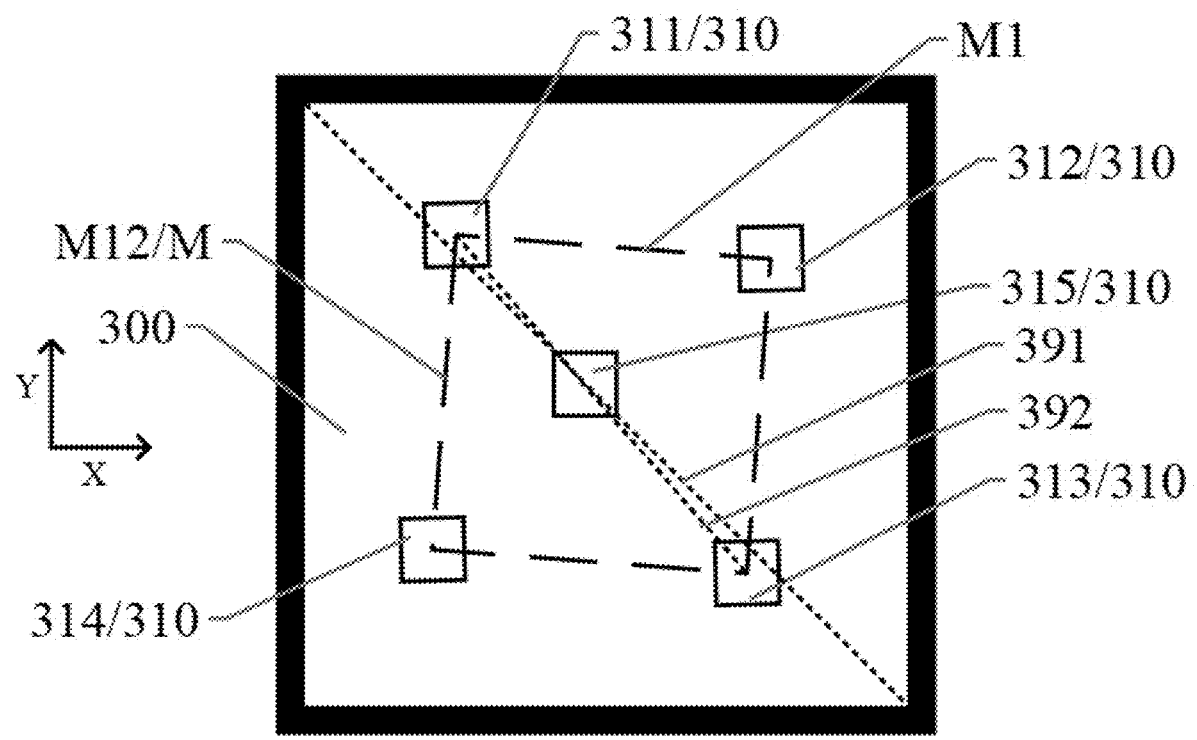
Figure 15C:
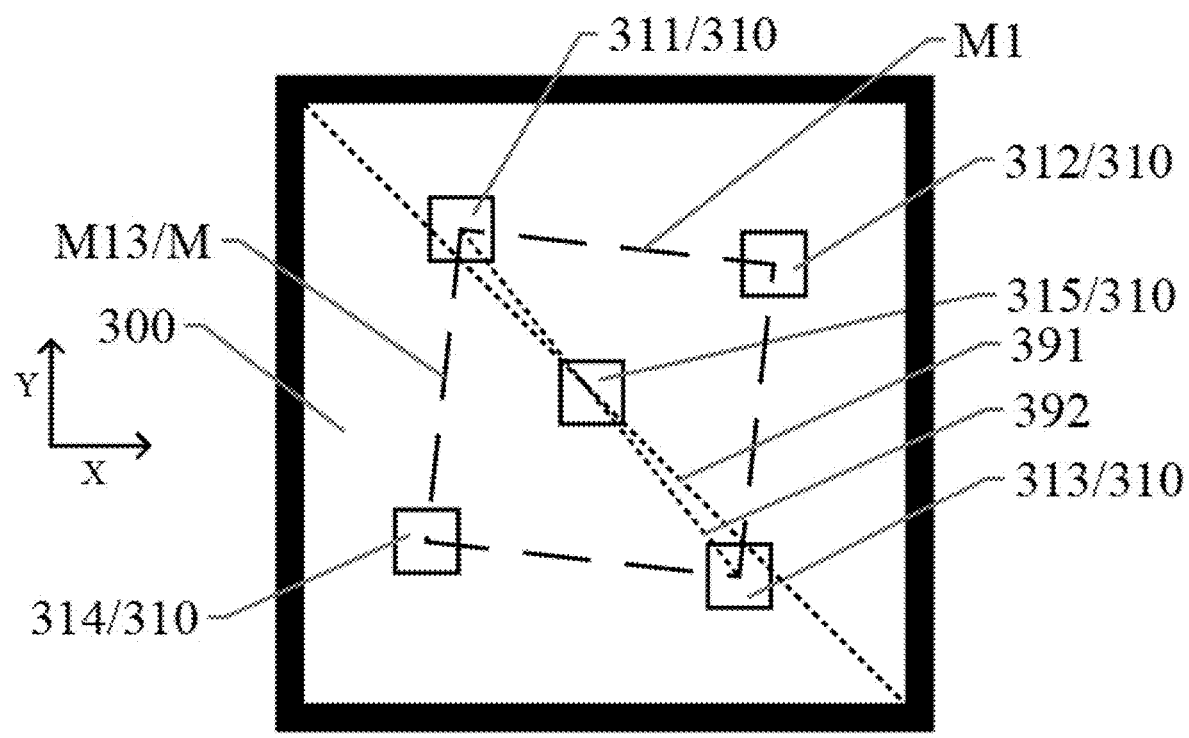
Figure 15D:
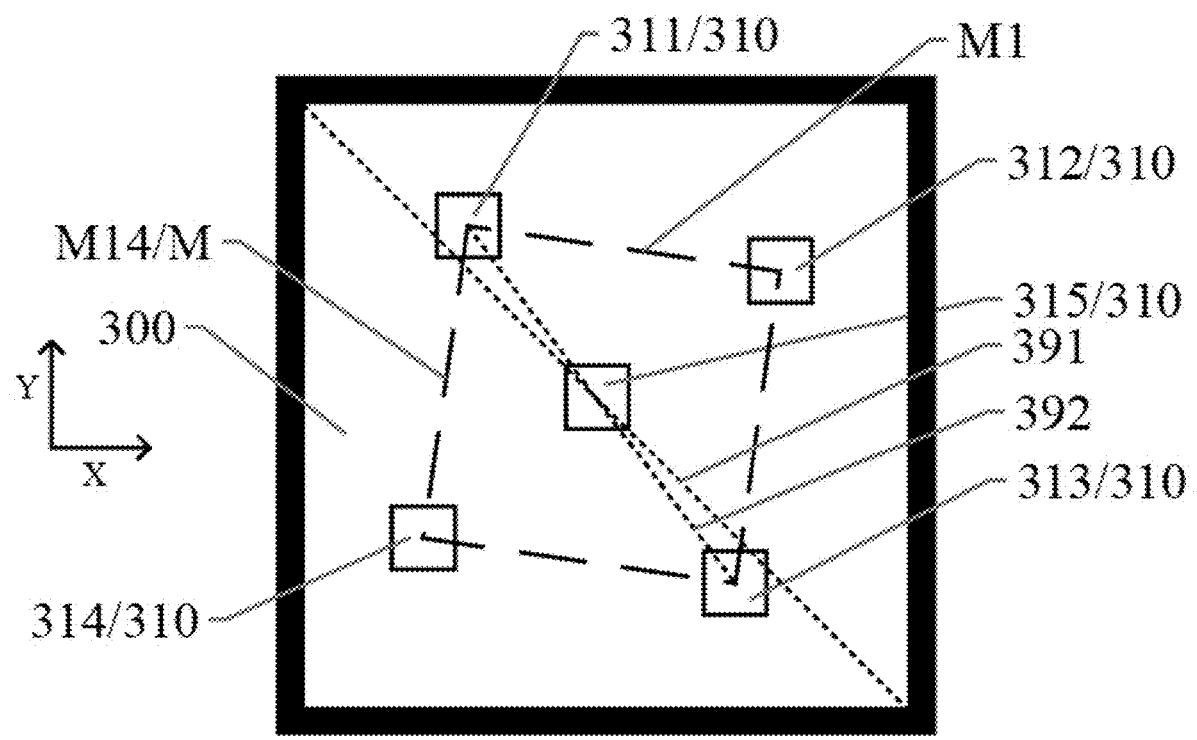
Figure 15E:
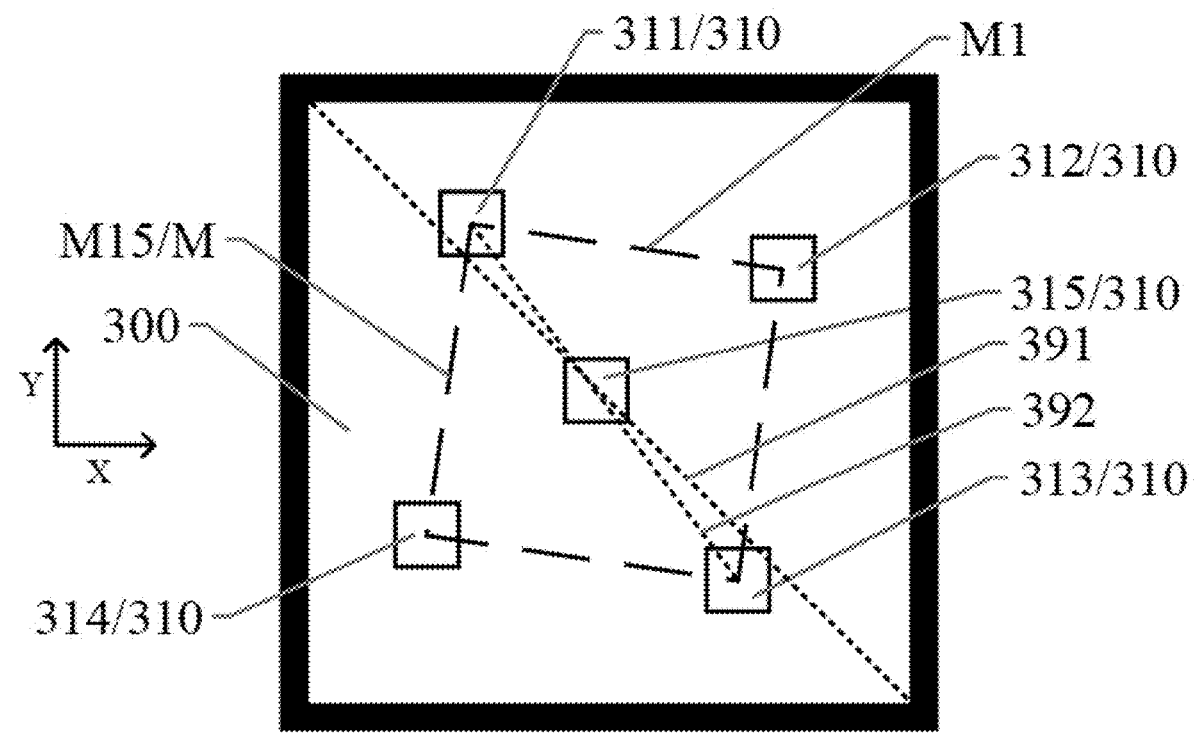
Figure 15F:
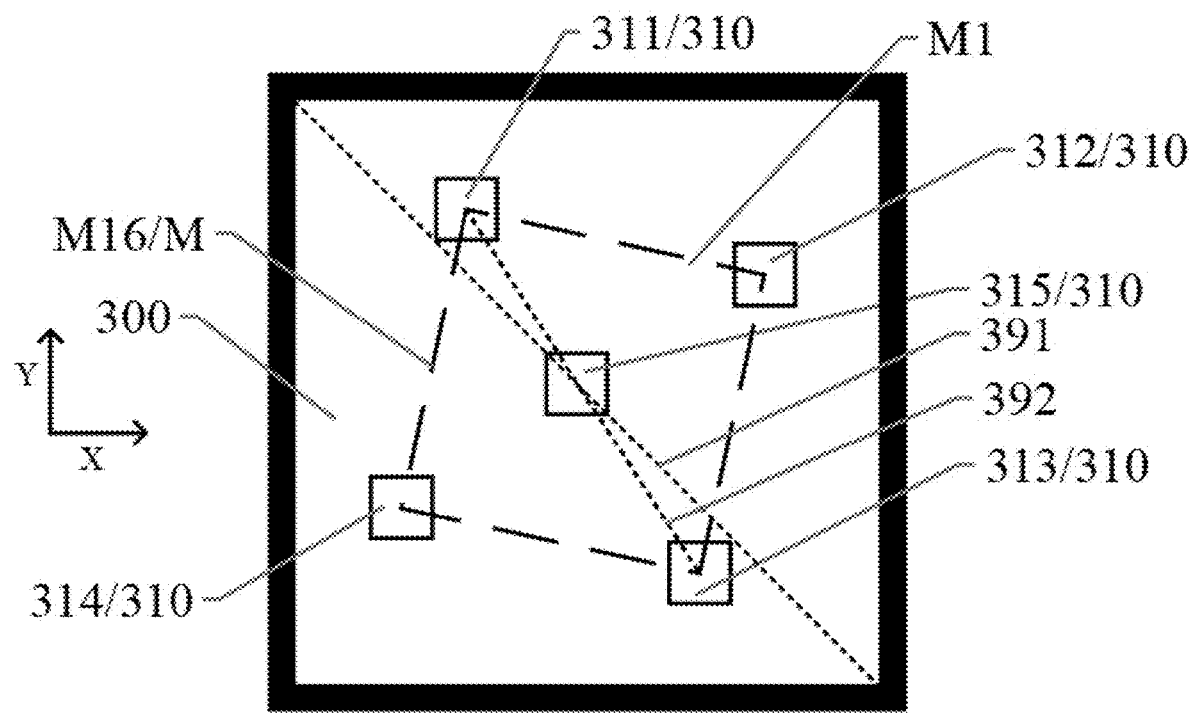
Figure 15G:
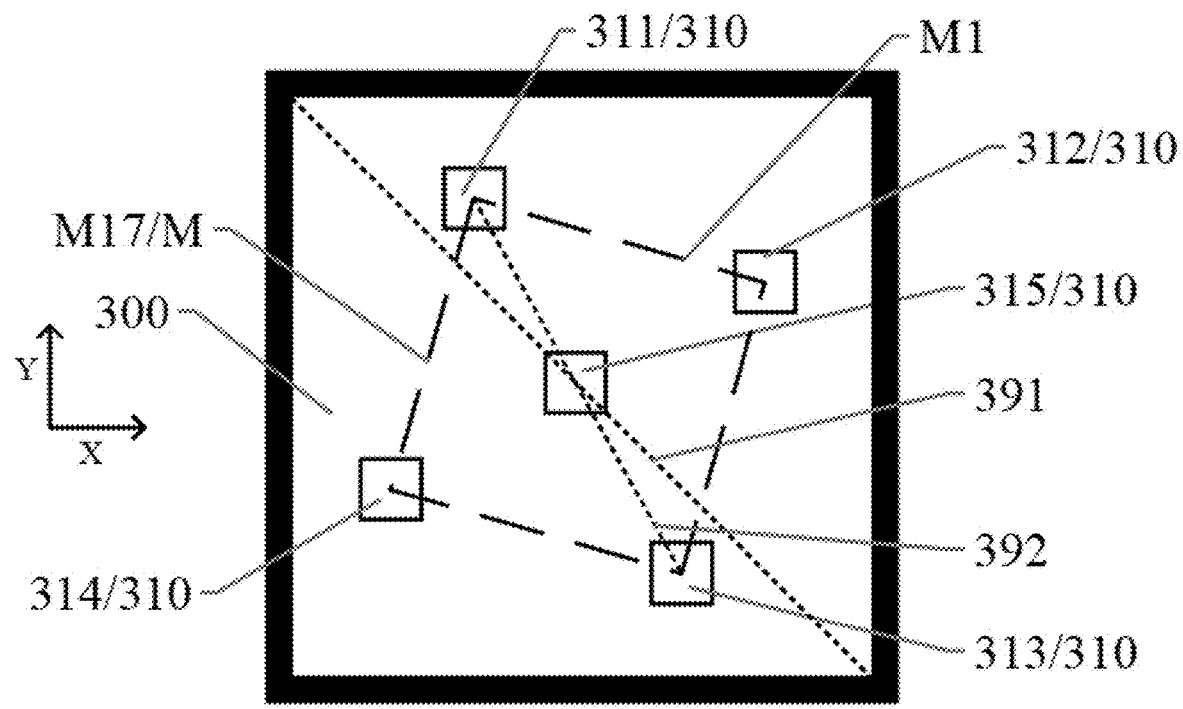
Figure 16:
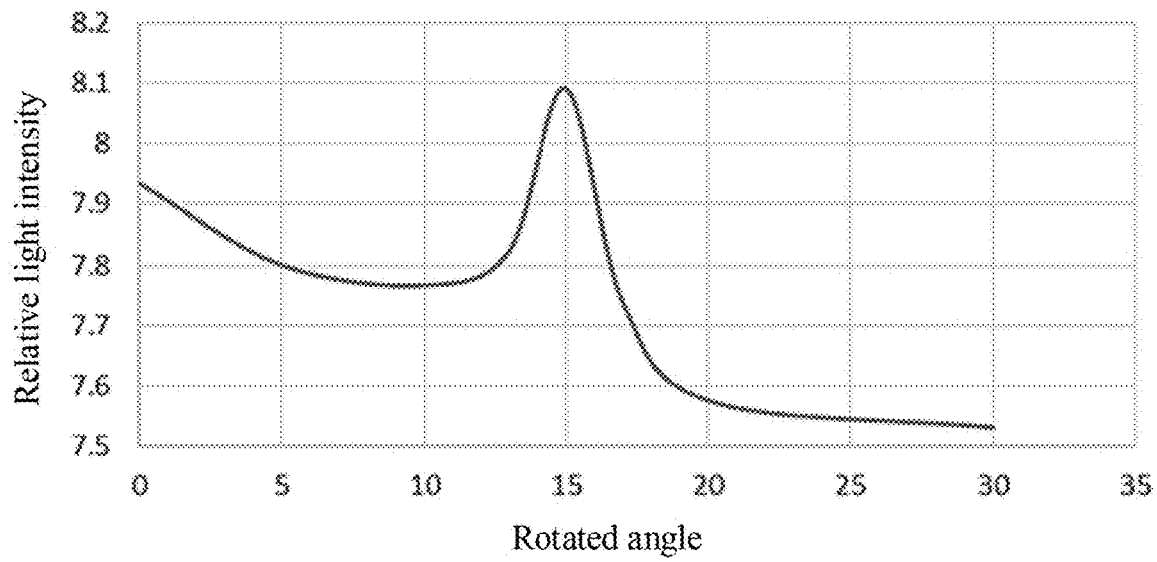
FIG. 16 is a relationship diagram of relative light intensity at the edge position of a light region after an M-sided polygon in the light region shown in FIGS. 15A to 15G respectively is rotated at different angles.

For example, an included angle between a side M1 of an M-sided polygon M11 and a first direction shown in FIG. 15A may be 5 degrees, an included angle between a side M1 of an M-sided polygon M12 and the first direction shown in FIG. 15B may be 10 degrees, an included angle between a side M1 of an M-sided polygon M13 and the first direction shown in FIG. 15C may be 13 degrees, an included angle between a side M1 of an M-sided polygon M14 and the first direction shown in FIG. 15D may be 15 degrees, an included angle between a side M1 of an M-sided polygon M15 and the first direction shown in FIG. 15E may be 17 degrees, an included angle between a side M1 of an M-sided polygon M16 and the first direction shown in FIG. 15F may be 20 degrees, and an included angle between a side M1 of an M-sided polygon M17 and the first direction shown in FIG. 15G may be 30 degrees.

For example, an included angle between a diagonal 392 of the second square M11 and a diagonal 391 of the first square shown in FIG. 15A may be 5 degrees, an included angle between a diagonal 392 of the second square M12 and the diagonal 391 of the first square shown in FIG. 15B may be 10 degrees, an included angle between a diagonal 392 of the second square M13 and the diagonal 391 of the first square shown in FIG. 15C may be 13 degrees, an included angle between a diagonal 392 of the second square M14 and the diagonal 391 of the first square shown in FIG. 15D may be 15 degrees, an included angle between a diagonal 392 of the second square M15 and the diagonal 391 of the first square shown in FIG. 15E may be 17 degrees, an included angle between a diagonal 392 of the second square M16 and the diagonal 391 of the first square shown in FIG. 15F may be 20 degrees, and an included angle between a diagonal 392 of the second square M17 and the diagonal 391 of the first square may be 30 degrees.

The relative light intensity shown in FIGS. 15A to 15G may refer to a value of Q at the edge position of the light region, where $Q=P\times(1/L_1+1/L_2+\ldots+1/L_N)$.

In this embodiment of the present disclosure, the rotation of the M-sided polygon at different angles may refer to rotating the M-sided polygon at a certain angle in a certain area where the center of the M-sided polygon is located, for example, a square is rotated at a certain angle in a certain area where the center of the square is located.

The rotation mentioned above may refer to rotating the M-sided polygon clockwise or rotating the M-sided polygon counterclockwise.

A difference between the light region shown in FIGS. 15A to 15G and the light region shown in FIGS. 13A to 13G includes a difference in the number of light-emitting units included in the light region, for example, the light region 300 shown in FIGS. 15A to 15G may include five light-emitting units 310, e.g., $Q=P\times(1/L_1+1/L_2+1/L_3+1/L_4+1/L_5)$.

In some examples, as shown in FIGS. 15A to 15G and 16, each of the at least some of the light regions 300 includes at least four light-emitting units 310, the at least four light-emitting units 310 are arranged to form an M-sided polygon, and an included angle between one of the first direction and the second direction and at least one side of the M-sided polygon is 12 to 18 degrees.

In some examples, as shown in FIGS. 15A to 15G, and FIG. 16, each light region 300 of the at least some of the light regions 300 is in the shape of a first square, each light region 300 of the at least some of the light region 300 includes at least four light-emitting units 310, and centers of the four light-emitting units 310, closest to four vertex angles of the light region 300, among the at least four light-emitting units 310 are sequentially connected to form a second square, and an included angle between a diagonal of the first square and a diagonal of the second square is 12 to 18 degrees.

For example, the quadrilateral formed by arranging the four light-emitting units 310 as shown in FIGS. 13A to 13G and the quadrilateral formed by arranging the five light-emitting units 310 as shown in FIGS. 15A to 15G may have the same shape and size, but without limitation, at least one of the two parameters, i.e., the shape and size, of the two may be different.

In some examples, as shown in FIGS. 15A to 15G, the at least four light-emitting units 310 include five light-emitting units 310, and centers of four light-emitting units 310, located at the utmost edge, among the five light-emitting units 310 are sequentially connected to form the second square.

For example, as shown in FIGS. 15A to 15G, each light region 300 of the at least some of the light regions 300 includes five light-emitting units 311, 312, 313, 314 and 315, the five light-emitting units 311, 312, 313, 314 and 315 are arranged to form a quadrilateral, and an included angle between one of the first direction and the second direction and at least one side of the quadrilateral is 12 to 18 degrees.

For example, as shown in FIGS. 15A to 15G, the four light-emitting units 311, 312, 313, and 314 are arranged to form a quadrilateral, and the light-emitting unit 315 is located in the center of the four light-emitting units 311, 312, 313, and 314.

For example, as shown in FIGS. 15A to 15G and 16, the light region 300 is in the shape of the first square, centers of the four light-emitting units 310 among the five light-emitting units 310 that are located at the utmost edge and included in the light region 300 are sequentially connected to form the second square, and an included angle between a diagonal of the first square and a diagonal of the second square may be 5 degrees, 10 degrees, 13 degrees, 15 degrees, 17 degrees, 20 degrees, or 30 degrees. Certainly, this embodiment of the present disclosure is not limited to the included angle between the diagonal of the first square and the diagonal of the second square being the above-mentioned degrees, and the included angle between the diagonal of the first square and the diagonal of the second square may be selected according to the product requirements.

For example, as shown in FIGS. 15A to 15G, a ratio of the pitch of the light region 300 to a side length of the second square is 1.7 to 2.3. For example, the ratio of the pitch of the light region 300 to the side length of the second square is 1.65 to 2.25. For example, the ratio of the pitch of the light region 300 to the side length of the second square is 1.7 to 2.2. For example, the ratio of the pitch of the light region 300 to the side length of the second square is 1.75 to 2.15. For example, the ratio of the pitch of the light region 300 to the side length of the second square is 1.8 to 2.1. For example, the ratio of the pitch of the light region 300 to the side length of the second square is 1.85 to 2.05. For example, the ratio of the pitch of the light region 300 to the side length of the second square is 1.9 to 2.

For example, as shown in FIGS. 15A to 15G, the light intensity at the edge of the light region 300, such as a corner area, satisfies $I_1=I_0\times m\times h\times(1/L_1+1/L_2+\ldots+1/L_N)$, where a distance from the center of an i-th light-emitting unit 310 to a vertex angle of the light region 300 is $L_i$, the pitch P of the light region 300, and the number N of light-emitting units 310 satisfies: $8.5\geq P\times(1/L_1+1/L_2+\ldots+1/L_N)\geq 6.3$.

For example, as shown in FIGS. 15A to 15G, $Q=P\times(1/L_1+1/L_2+1/L_3+1/L_4+1/L_5)$, $8.5\geq Q\geq 6.3$.

For example, as shown in FIGS. 15A to 15G, the size of the light-emitting unit 310 may be 0.219 mm×0.219 mm.

For example, as shown in FIG. 15A to FIG. 15G and FIG. 16, for example, taking the pitch of the light region 300 as 4.8 mm, the pitch of the light-emitting unit 310 as 2.6 mm, the side length of the M-sided polygon as 2.6 mm as an example, the included angle between the side M1 of the second square and the first direction, i.e., when the included angle between the diagonal of the first square and the diagonal of the second square is 0 degrees, Q=7.935362; when the included angle between the side M1 of the second square and the first direction is 5 degrees, Q=7.80074; when the included angle between the side M1 of the second square and the first direction is 10 degrees, Q=7.767317; when the included angle between the side M1 of the second square and the first direction is 13 degrees, Q=7.823319; when the included angle between the side M1 of the second square and the first direction is 15 degrees, Q=8.091537; when the included angle between the side M1 of the second square and the first direction is 17 degrees, Q=7.739908; when the included angle between the side M1 of the second square and the first direction is 20 degrees, Q=7.575887; and when the included angle between the side M1 of the second square and the first direction is 30 degrees, Q=7.531522. Thus, the relative light intensity at the edge position of the light region becomes first larger and then smaller as the angle increases after the M-sided polygon is rotated at different angles.

For example, as shown in FIG. 16, when the M-sided polygon, e.g., the second square, is rotated at an angle of 12 to 18 degrees, the value of the relative light intensity Q at the edge position of the light region is larger.

In the backlight structure provided in the embodiment of the present disclosure, by adjusting the angle of the M-sided polygon formed by the arrangement of light-emitting units in the light region to a certain range, e.g., 12 to 18 degrees, and by setting the number of the light-emitting units in the light region, the pitch of the light region and the side length of the M-sided polygon, improvement of the light intensity at the edge of the light region is facilitated, thereby improving the light emitting uniformity of the light region.

For example, as shown in FIGS. 14 and 16, when the number of light-emitting units 310 disposed in the light region 300 is five, the light intensity at the edge position of the light region 300, such as the vertex angle position, is greater than the light intensity at the edge position of the light region 300 when the number of light-emitting units 310 in the light region 300 is four.

For example, the included angle between the diagonal of the first square and the diagonal of the second square is 13 to 17 degrees. For example, the included angle between the diagonal of the first square and the diagonal of the second square is 14.5 to 16.5 degrees. For example, the included angle between the diagonal of the first square and the diagonal of the second square is 15 to 16 degrees.

For example, as shown in FIGS. 15A to 15G, the ratio of the light intensity at the edge position of the light region 300, such as a vertex angle area, to the light intensity at the center position of the light region 300 is not less than 0.5. For example, the ratio of the light intensity at the edge position of the light region 300 to the light intensity at the center position of the light region 300 is not less than 0.55. For example, the ratio of the light intensity at the edge position of the light region 300 to the light intensity at the center position of the light region 300 is not less than 0.6. For example, the ratio of the light intensity at the edge position of the light region 300 to the light intensity at the center position of the light region 300 is not less than 0.65. For example, the ratio of the light intensity at the edge position of the light region 300 to the light intensity at the center position of the light region 300 is not less than 0.7. For example, the ratio of the light intensity at the edge position of the light region 300 to the light intensity at the center position of the light region 300 is not less than 0.75. For example, the ratio of the light intensity at the edge position of the light region 300 to the light intensity at the center position of the light region 300 is not less than 0.8. For example, the ratio of the light intensity at the edge position of the light region 300 to the light intensity at the center position of the light region 300 is not less than 0.85. For example, the ratio of the light intensity at the edge position of the light region 300 to the light intensity at the center position of the light region 300 is not less than 0.9.

For example, the size, material and other parameters of the barrier wall in the example shown in FIGS. 15A to 15G may be the same as the corresponding parameters in the above example and will not be repeated herein.

FIGS. 17A to 17G are schematic diagrams of one light region according to another example of an embodiment of the present disclosure. FIG. 18 is a relationship diagram of relative light intensity at the edge position of a light region after an M-sided polygon in the light region shown in FIGS. 17A to 17G respectively is rotated at different angles.

Figure 17A:
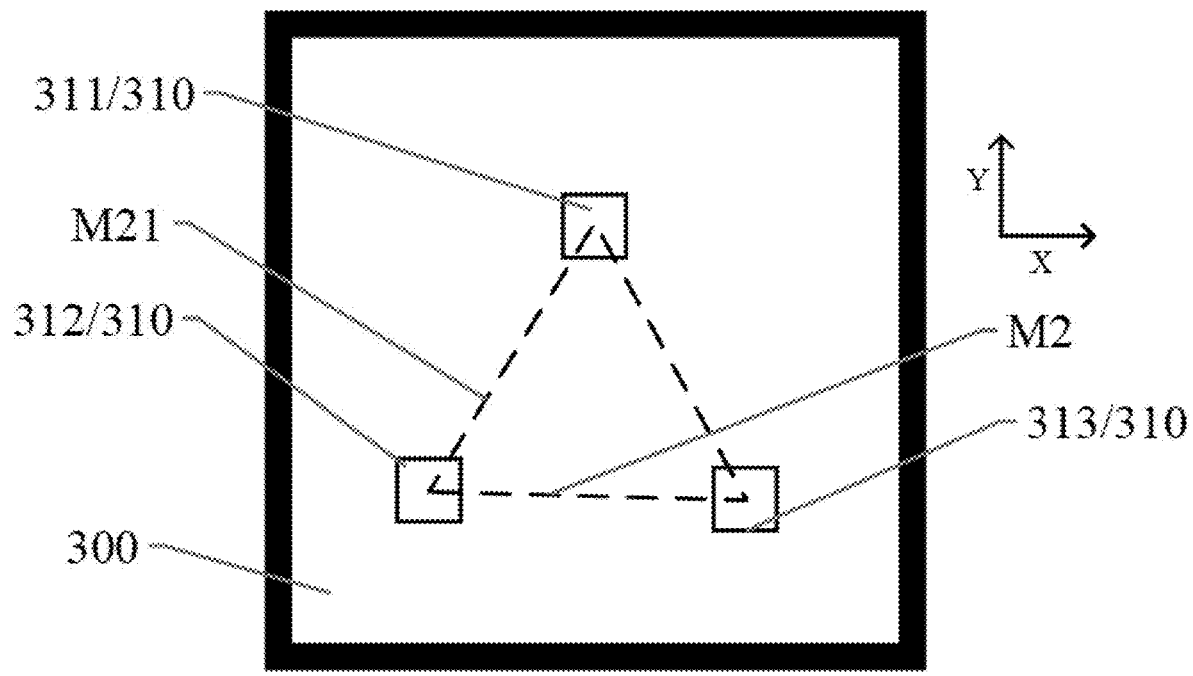
FIGS. 17A to 17G are schematic diagrams of one light region according to another example of an embodiment of the present disclosure.
Figure 17B:
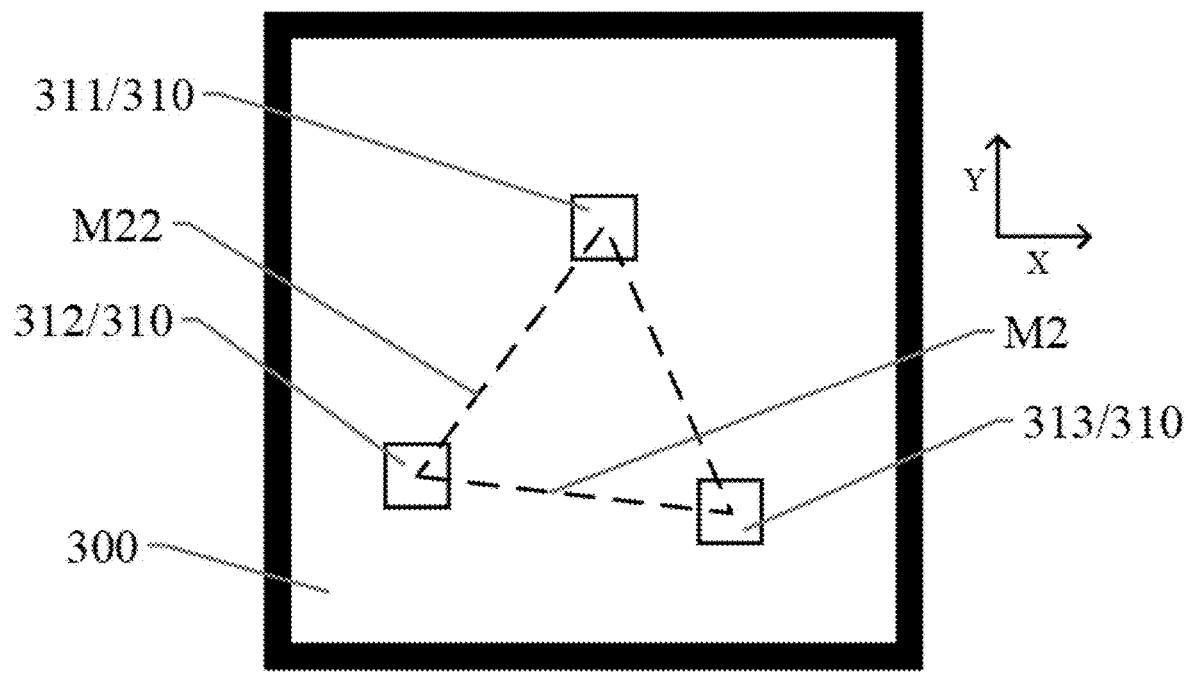
Figure 17C:
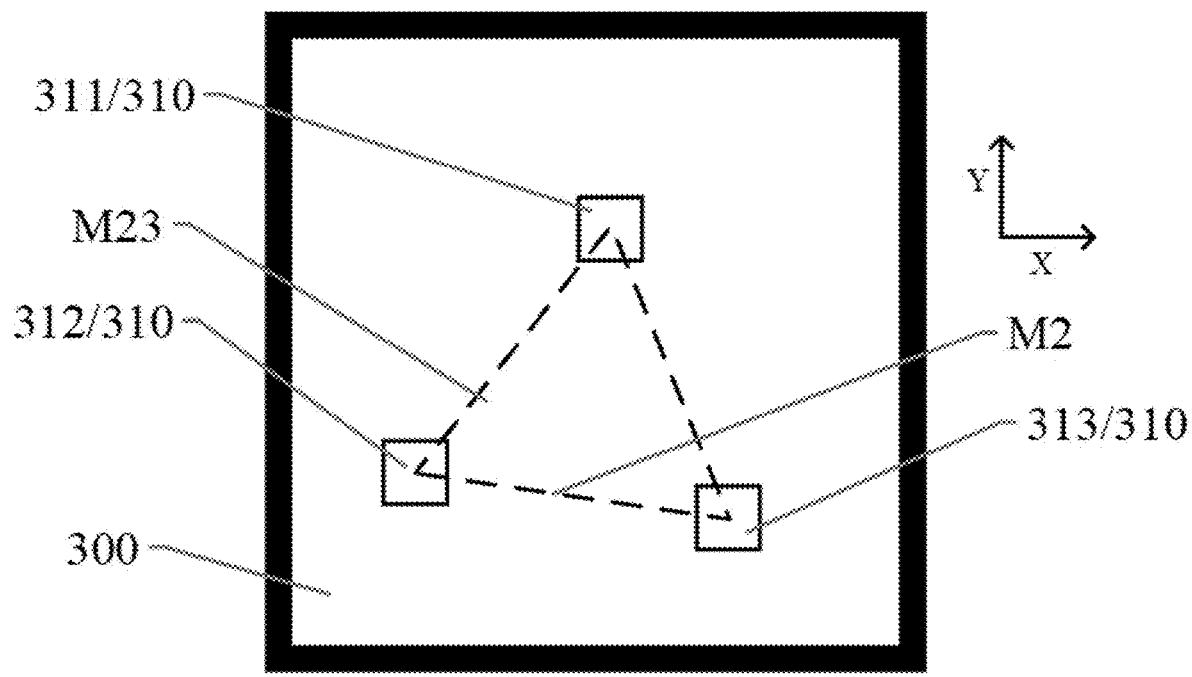
Figure 17D:
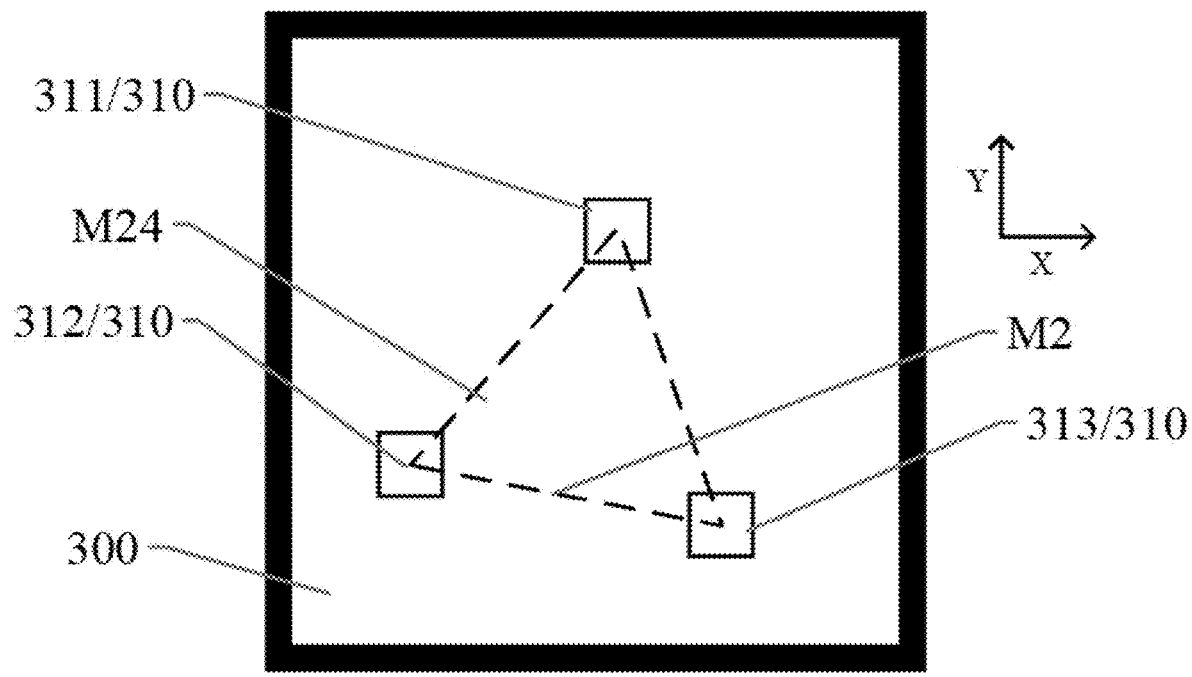
Figure 17E:
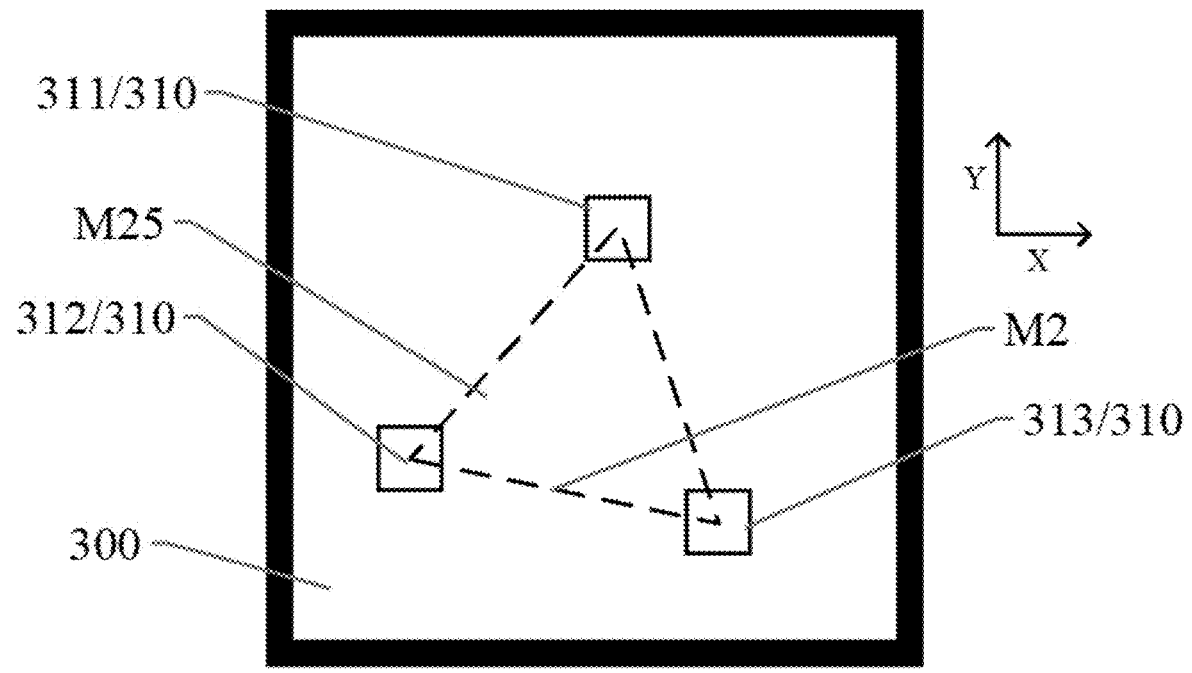
Figure 17F:
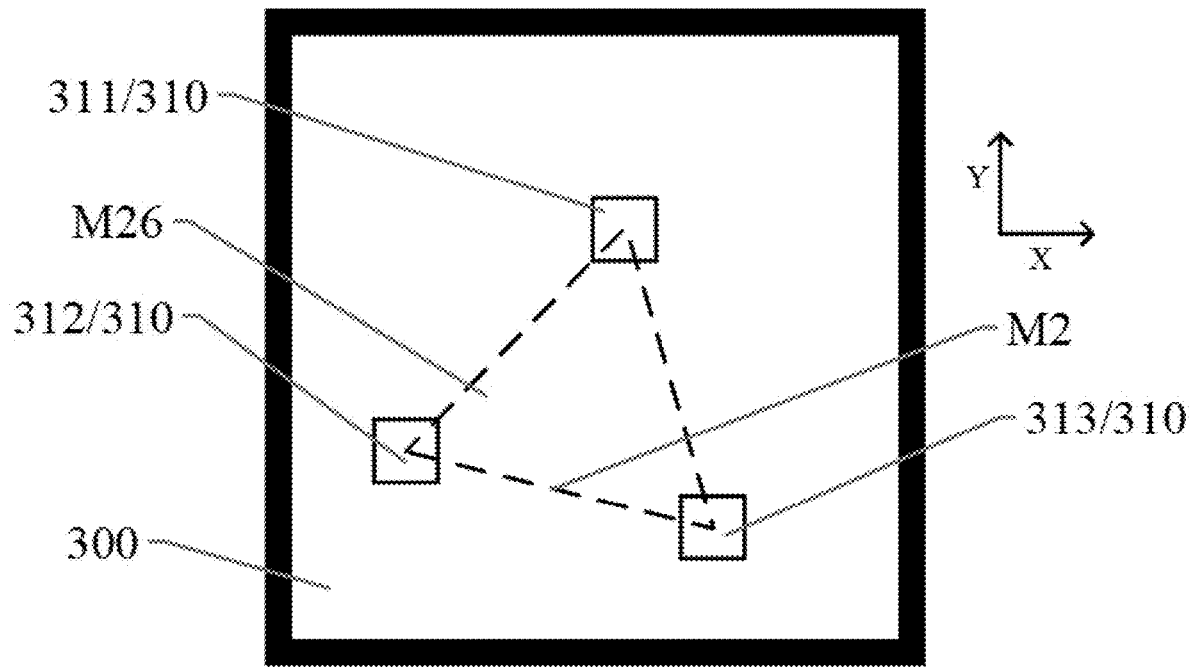
Figure 17G:
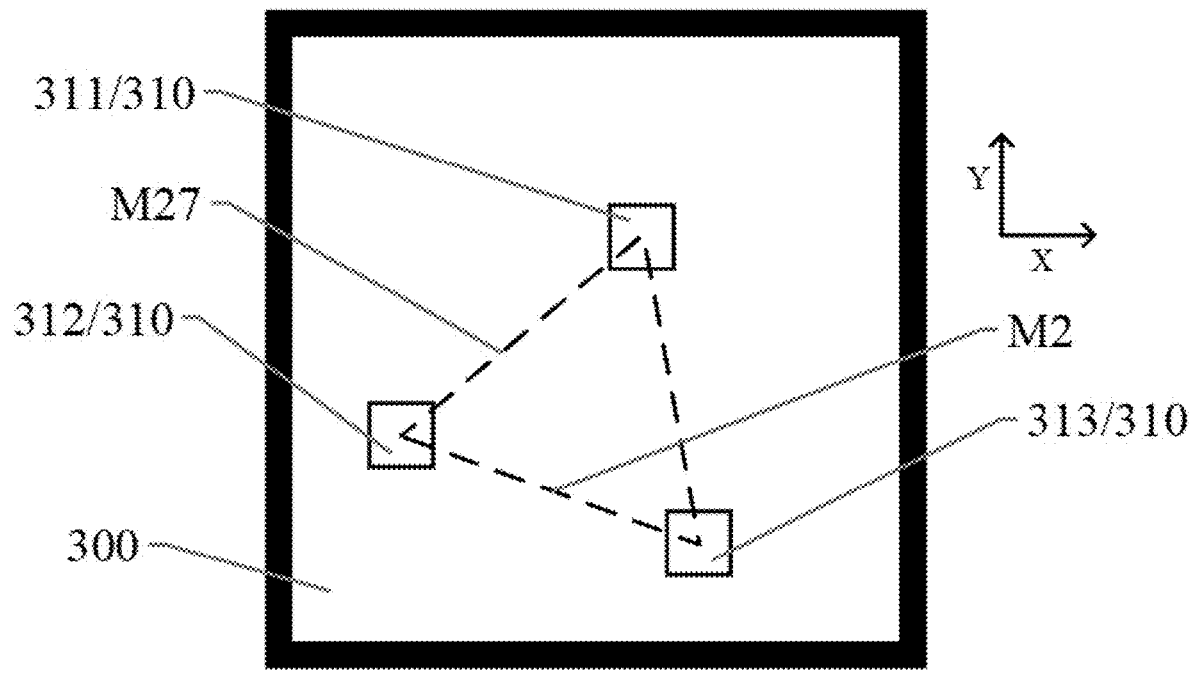
Figure 18:
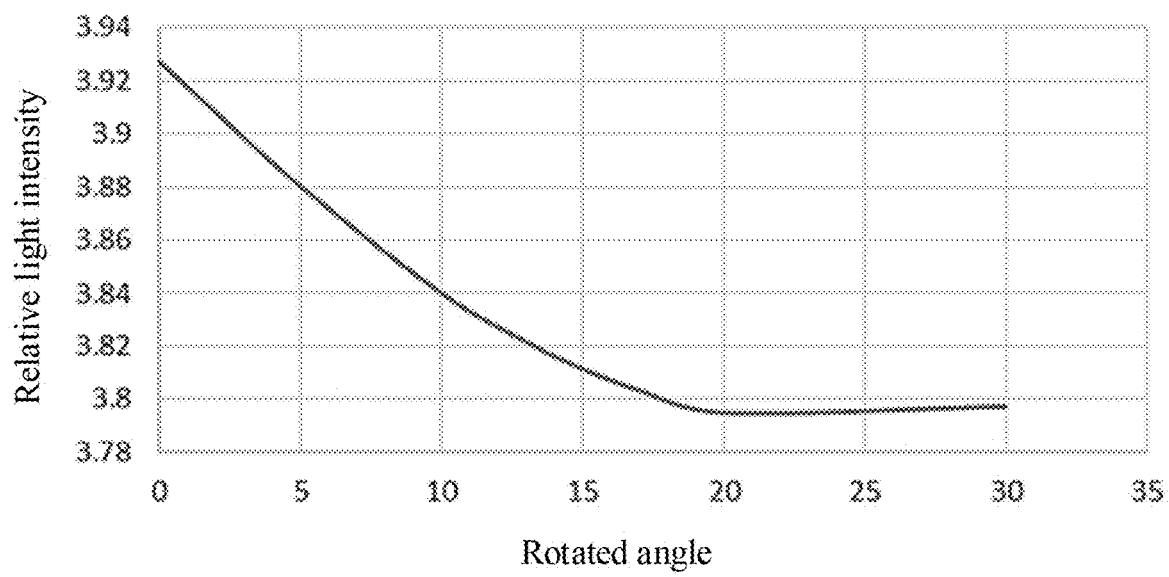
FIG. 18 is a relationship diagram of relative light intensity at the edge position of a light region after an M-sided polygon in the light region respectively shown in FIGS. 17A to 17G is rotated at different angles.

For example, an included angle between a side M2 of a triangle M21 and a first direction shown in FIG. 17A may be 5 degrees, an included angle between a side M2 of a triangle M22 and the first direction shown in FIG. 17B may be 10 degrees, an included angle between a side M2 of a triangle M23 and the first direction shown in FIG. 17C may be 13 degrees, an included angle between a side M2 of a triangle M24 and the first direction shown in FIG. 17D may be 15 degrees, an included angle between a side M2 of a triangle M25 and the first direction shown in FIG. 17E may be 17 degrees, an included angle between a side M2 of a triangle M26 and the first direction shown in FIG. 17F may be 20 degrees, and an included angle between a side M2 of a triangle M27 and the first direction shown in FIG. 17G may be 30 degrees. Certainly, this embodiment of the present disclosure is not limited to the included angle between one side of the triangle and the first direction being the above mentioned degrees, and the included angle between the side of the triangle and the first direction may be selected according to the product requirements.

The relative light intensity shown in FIGS. 17A to 17G may refer to the value of Q at the edge position of the light region, where $Q = P \times (1/L_1 + 1/L_2 + \ldots + 1/L_N)$.

In this embodiment of the present disclosure, the rotation of the M-sided polygon at different angles may refer to rotating the M-sided polygon at a certain angle in a certain area where the center of the triangle is located, for example, a triangle is rotated by a certain angle in a certain area where the center of the triangle is located.

The rotation mentioned above may refer to rotating the M-sided polygon clockwise or rotating the M-sided polygon counterclockwise.

A difference between the light region shown in FIG. 17A to FIG. 17G and the light region shown in FIG. 13A to FIG. 13G and FIG. 15A to FIG. 15G is that the M-sided polygons are different in shape, e.g., the M-sided polygon shown in FIG. 17A to FIG. 17G may be a triangle.

In some examples, as shown in FIGS. 17A to 17G, each light region 300 of at least some of the light regions 300 includes three light-emitting units 311, 312, and 313, centers of the three light-emitting units 311, 312, and 313 are sequentially connected to form a triangle, and an included angle between one of the first direction and the second direction and one side M2 of the triangle is less than 5 degrees.

For example, as shown in FIGS. 17A to 17G, a ratio of the pitch of the light region 300 to a side length of the triangle is 1.7 to 2.3. For example, the ratio of the pitch of the light region 300 to the side length of the triangle is 1.65 to 2.25. For example, the ratio of the pitch of the light region 300 to the side length of the triangle is 1.7 to 2.2. For example, the ratio of the pitch of the light region 300 to the side length of the triangle is 1.75 to 2.15. For example, the ratio of the pitch of the light region 300 to the side length of the triangle is 1.8 to 2.1. For example, the ratio of the pitch of the light region 300 to the side length of the triangle is 1.85 to 2.05. For example, the ratio of the pitch of the light region 300 to the side length of the triangle is 1.9 to 2.

For example, as shown in FIGS. 17A to 17G, the light intensity at the edge of the light region 300, such as a corner area, satisfies $I_1 = I_0 \times m \times h \times (1/L_1 + 1/L_2 + \ldots + 1/L_N)$, where a distance from the center of an i-th light-emitting unit 310 to a vertex angle of the light region 300 is $L_i$, the pitch P of the light region 300, and the number N of light-emitting units 310 satisfies: $8.5 \geq P \times (1/L_1 + 1/L_2 + \ldots + 1/L_N) \geq 6.3$.

For example, as shown in FIGS. 17A to 17G, $Q = P \times (1/L_1 + 1/L_2 + 1/L_3)$, $8.5 \geq Q \geq 6.3$.

For example, as shown in FIGS. 17A to 17G, the size of the light-emitting unit 310 may be 0.219 mm×0.219 mm.

For example, as shown in FIGS. 17A to 17G and FIG. 18, taking the pitch of the light region 300 as 4.8 mm, the pitch of the light-emitting unit 310 as 2.6 mm, and the side length of the M-sided polygon as 2.6 mm as an example, when the included angle between the side M2 of the triangle and the first direction is 0 degrees, Q=3.926995; when the included angle between the side M2 of the triangle and the first direction is 5 degrees, Q=3.880136; when the included angle between side M2 of the triangle and the first direction is 10 degrees, Q=3.840027; when the included angle between side M2 of the triangle and the first direction is 13 degrees, Q=3.82151; when the included angle between side M2 of the triangle and the first direction is 15 degrees, Q=3.811524; when the included angle between side M2 of the triangle and the first direction is 17 degrees, Q=3.803458 degrees; when the included angle between side M2 of the triangle and the first direction is 20 degrees, Q=3.794941; and when the included angle between side M2 of the triangle and the first direction is 30 degrees, Q=3.797286. Thus, the relative light intensity at the edge position of the light region is reduced gradually as the angle increases after the M-sided polygon is rotated at different angles.

The included angle between one of the first direction and the second direction and one side M2 of the triangle is set to be small, which is conducive to increasing the light intensity at the edge position of the light region, thereby improving the light emitting uniformity of the light region.

For example, as shown in FIGS. 17A to 17G, the included angle between the first direction or the second direction and the side M2 of the triangle is less than 4.5 degrees. For example, the included angle between the first direction or the second direction and the side M2 of the triangle is less than 4 degrees. For example, the included angle between the first direction or the second direction and the side M2 of the triangle is less than 3.5 degrees. For example, the included angle between the first direction or the second direction and the side M2 of the triangle is less than 3 degrees. For example, the included angle between the first direction or the second direction and the side M2 of the triangle is less than 2.5 degrees. For example, the included angle between the first direction or the second direction and the side M2 of the triangle is less than 2 degrees. For example, the included angle between the first direction or the second direction and the side M2 of the triangle is less than 1.5 degrees. For example, the included angle between the first direction or the second direction and the side M2 of the triangle is less than 1 degree. For example, the included angle between the first direction or the second direction and the side M2 of the triangle is less than 0.5 degrees.

For example, as shown in FIGS. 17A to 17G, the ratio of the light intensity at the edge position of the light region 300, such as a vertex angle area, to the light intensity at the center position of the light region 300 is not less than 0.5.

For example, the ratio of the light intensity at the edge position of the light region 300 to the light intensity at the center position of the light region 300 is not less than 0.55. For example, the ratio of the light intensity at the edge position of the light region 300 to the light intensity at the center position of the light region 300 is not less than 0.6. For example, the ratio of the light intensity at the edge position of the light region 300 to the light intensity at the center position of the light region 300 is not less than 0.65. For example, the ratio of the light intensity at the edge position of the light region 300 to the light intensity at the center position of the light region 300 is not less than 0.7. For example, the ratio of the light intensity at the edge position of the light region 300 to the light intensity at the center position of the light region 300 is not less than 0.75. For example, the ratio of the light intensity at the edge position of the light region 300 to the light intensity at the center position of the light region 300 is not less than 0.8. For example, the ratio of the light intensity at the edge position of the light region 300 to the light intensity at the center position of the light region 300 is not less than 0.85. For example, the ratio of the light intensity at the edge position of the light region 300 to the light intensity at the center position of the light region 300 is not less than 0.9.

For example, the size, material and other parameters of the barrier wall in the example shown in FIGS. 17A to 17G may be the same as the corresponding parameters in the above example and will not be repeated herein.

Figure 19:
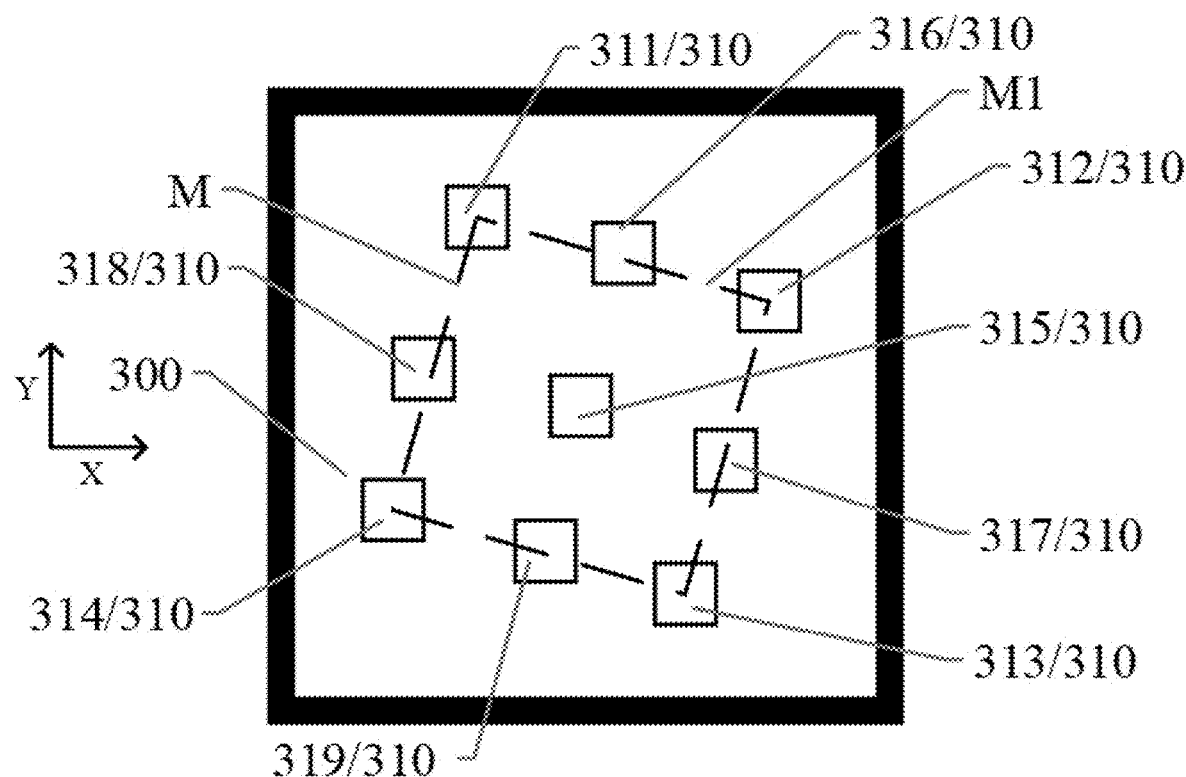
FIG. 19 is a schematic diagram of the distribution of light-emitting units in one light region in different examples of an embodiment of the present disclosure.

FIG. 19 is a schematic diagram of the distribution of light-emitting units in one light region in different examples of an embodiment of the present disclosure.

For example, the at least one light region 300 in the example shown in FIG. 19 includes nine light-emitting units 311, 312, 313, 314, 315, 316, 317, 318, and 319, centers of the four light-emitting units 311, 312, 313, and 314 among them are sequentially connected to form a quadrilateral, or the nine light-emitting units 311, 312, 313, 314, 315, 316, 317, 318, and 319 are arranged to form a quadrilateral, and an included angle between at least one of the first direction and the second direction and at least one side of the quadrilateral is 0 degrees.

The four light-emitting units 311, 312, 313, and 314 may be the four light-emitting units located outermost, or may be the four light-emitting units closest to vertex angles of the light region.

For example, as shown in FIG. 19, the included angle between the first direction and each side of the M-sided polygon as well as between the second direction and each side of the M-sided polygon is greater than 0.5 degrees. For example, the included angle between the first direction and each side of the M-sided polygon as well as between the second direction and each side of the M-sided polygon is greater than 1 degree. For example, the included angle between the first direction and each side of the M-sided polygon as well as between the second direction and each side of the M-sided polygon is greater than 2 degrees. For example, the included angle between the first direction and each side of the M-sided polygon as well as between the second direction and each side of the M-sided polygon is greater than 3 degrees. For example, the included angle between the first direction and each side of the M-sided polygon as well as between the second direction and each side of the M-sided polygon is greater than 4 degrees. For example, the included angle between the first direction and each side of the M-sided polygon as well as between the second direction and each side of the M-sided polygon is greater than 5 degrees. For example, the included angle between the first direction and each side of the M-sided polygon as well as between the second direction and each side of the M-sided polygon is greater than 5.5 degrees. For example, the included angle between the first direction and each side of the M-sided polygon as well as between the second direction and each side of the M-sided polygon is greater than 6 degrees. For example, the included angle between the first direction and each side of the M-sided polygon as well as between the second direction and each side of the M-sided polygon is greater than 6.5 degrees. For example, the included angle between the first direction and each side of the M-sided polygon as well as between the second direction and each side of the M-sided polygon is greater than 7 degrees. For example, the included angle between the first direction and each side of the M-sided polygon as well as between the second direction and each side of the M-sided polygon is greater than 8 degrees. For example, the included angle between the first direction and each side of the M-sided polygon as well as between the second direction and each side of the M-sided polygon is greater than 9 degrees. For example, the included angle between the first direction and each side of the M-sided polygon as well as between the second direction and each side of the M-sided polygon is greater than 10 degrees. For example, the included angle between the first direction and each side of the M-sided polygon as well as between the second direction and each side of the M-sided polygon is greater than 10.5 degrees. For example, the included angle between the first direction and each side of the M-sided polygon as well as between the second direction and each side of the M-sided polygon is greater than 11 degrees. For example, the included angle between the first direction and each side of the M-sided polygon as well as between the second direction and each side of the M-sided polygon is greater than 12 degrees.

For example, as shown in FIG. 19, the included angle between a side M1 of the M-sided polygon and the first direction is 12 to 18 degrees. For example, the included angle between the side M1 of the M-sided polygon and the first direction is 12.5 to 17.5 degrees. For example, the included angle between the side M1 of the M-sided polygon and the first direction is 13 to 17 degrees. For example, the included angle between the side M1 of the M-sided polygon and the first direction is 13.5 to 16.5 degrees. For example, the included angle between the side M1 of the M-sided polygon and the first direction is 14 to 16 degrees. For example, the included angle between the side M1 of the M-sided polygon and the first direction is 14.5 to 15 degrees.

For example, as shown in FIG. 19, the light region 300 includes nine light-emitting units, and a distance from the center of an i-th light-emitting unit 310 to a vertex angle of the light region 300 is $L_i$, where i takes a value in the range of 1 to 9, and $L_i$, P, and N satisfy: $8.5 \geq P \times (1/L_1 + 1/L_2 + 1/L_3 + 1/L_4 + 1/L_5 + 1/L_6 + 1/L_7 + 1/L_8 + 1/L_9) \geq 6.3$.

For example, $8.3 \geq P \times (1/L_1 + 1/L_2 + 1/L_3 + 1/L_4 + 1/L_5 + 1/L_6 + 1/L_7 + 1/L_8 + 1/L_9) \geq 6.5$.

For example, $8.1 \geq P \times (1/L_1 + 1/L_2 + 1/L_3 + 1/L_4 + 1/L_5 + 1/L_6 + 1/L_7 + 1/L_8 + 1/L_9) \geq 6.6$.

For example, $8.2 \geq P \times (1/L_1 + 1/L_2 + 1/L_3 + 1/L_4 + 1/L_5 + 1/L_6 + 1/L_7 + 1/L_8 + 1/L_9) \geq 6.7$.

For example, $8 \geq P \times (1/L_1 + 1/L_2 + 1/L_3 + 1/L_4 + 1/L_5 + 1/L_6 + 1/L_7 + 1/L_8 + 1/L_9) \geq 6$.

For example, $7.9 \geq P \times (1/L_1 + 1/L_2 + 1/L_3 + 1/L_4 + 1/L_5 + 1/L_6 + 1/L_7 + 1/L_8 + 1/L_9) \geq 6.9$.

For example, $7.8 \geq P \times (1/L_1 + 1/L_2 + 1/L_3 + 1/L_4 + 1/L_5 + 1/L_6 + 1/L_7 + 1/L_8 + 1/L_9) \geq 7$.

For example, $7.7 \geq P \times (1/L_1 + 1/L_2 + 1/L_3 + 1/L_4 + 1/L_5 + 1/L_6 + 1/L_7 + 1/L_8 + 1/L_9) \geq 6.8$.

For example, $7.5 \geq P \times (1/L_1 + 1/L_2 + 1/L_3 + 1/L_4 + 1/L_5 + 1/L_6 + 1/L_7 + 1/L_8 + 1/L_9) \geq 7.1$.

For example, $7.6 \geq P \times (1/L_1 + 1/L_2 + 1/L_3 + 1/L_4 + 1/L_5 + 1/L_6 + 1/L_7 + 1/L_8 + 1/L_9) \geq 7.2$.

For example, $7.4 \geq P \times (1/L_1 + 1/L_2 + 1/L_3 + 1/L_4 + 1/L_5 + 1/L_6 + 1/L_7 + 1/L_8 + 1/L_9) \geq 7.3$.

For example, as shown in FIG. 19, a ratio of the pitch of the light region 300 to a side length of the quadrilateral is 1.7 to 2.3. For example, the ratio of the pitch of the light region 300 to the side length of the quadrilateral is 1.65 to 2.25. For example, the ratio of the pitch of the light region 300 to the side length of the quadrilateral is 1.7 to 2.2. For example, the ratio of the pitch of the light region 300 to the side length of the quadrilateral is 1.75 to 2.15. For example, the ratio of the pitch of the light region 300 to the side length of the quadrilateral is 1.8 to 2.1. For example, the ratio of the pitch of the light region 300 to the side length of the quadrilateral is 1.85 to 2.05. For example, the ratio of the pitch of the light region 300 to the side length of the quadrilateral is 1.9 to 2.

For example, as shown in FIG. 19, the nine light-emitting units 311, 312, 313, 314, 315, 316, 317, 318, and 319 may be evenly distributed.

For example, the light-emitting unit 315 may be located in the center of the quadrilateral formed by the four light-emitting units 311, 312, 313, and 314.

For example, as shown in FIG. 19, the light-emitting unit 318 may be located between the light-emitting unit 311 and the light-emitting unit 314, the light-emitting unit 319 may be located between the light-emitting unit 313 and the light-emitting unit 314, the light-emitting unit 317 may be located between the light-emitting unit 313 and the light-emitting unit 312, and the light-emitting unit 316 may be located between the light-emitting unit 312 and the light-emitting unit 311.

For example, four sides of the quadrilateral pass through the centers of the light-emitting units 318, 319, 317, and 316, respectively.

For example, the centers of the light-emitting units 318, 319, 317, and 316 may be the centers of the four sides of the quadrilateral, respectively.

For example, as shown in FIG. 19, the quadrilateral formed by connecting the centers of the four light-emitting units 311, 312, 313, and 314 sequentially may be a rectangle.

For example, the quadrilateral formed by connecting the centers of the four light-emitting units 311, 312, 313, and 314 sequentially may be a square.

For example, an included angle between each of two sides of the quadrilateral and the first direction is greater than 0 degrees, and an included angle between each of the other two sides of the quadrilateral and the second direction is greater than 0 degrees.

For example, as shown in FIG. 7, the light region 300 is in the shape of the first square, the quadrilateral formed by connecting the centers of the four light-emitting units 311, 312, 313, and 314 sequentially may be the second square, and the included angle between a diagonal of the first square and a diagonal of the second square is greater than 0 degrees.

For example, as shown in FIG. 19, the ratio of the light intensity at the edge position of the light region 300, such as a vertex angle area, to the light intensity at the center position of the light region 300 is not less than 0.5.

For example, the ratio of the light intensity at the edge position of the light region 300 to the light intensity at the center position of the light region 300 is not less than 0.55. For example, the ratio of the light intensity at the edge position of the light region 300 to the light intensity at the center position of the light region 300 is not less than 0.6. For example, the ratio of the light intensity at the edge position of the light region 300 to the light intensity at the center position of the light region 300 is not less than 0.65. For example, the ratio of the light intensity at the edge position of the light region 300 to the light intensity at the center position of the light region 300 is not less than 0.7. For example, the ratio of the light intensity at the edge position of the light region 300 to the light intensity at the center position of the light region 300 is not less than 0.75. For example, the ratio of the light intensity at the edge position of the light region 300 to the light intensity at the center position of the light region 300 is not less than 0.8. For example, the ratio of the light intensity at the edge position of the light region 300 to the light intensity at the center position of the light region 300 is not less than 0.85. For example, the ratio of the light intensity at the edge position of the light region 300 to the light intensity at the center position of the light region 300 is not less than 0.9.

For example, parameters such as the size and material of the barrier wall and the size of the light-emitting units in the example shown in FIG. 19 may be the same as the corresponding parameters in the above example and will not be repeated herein.

This embodiment of the present disclosure is not limited to the shape of the light region being the rectangle as shown in FIGS. 1 to 19. For example, the shape of the light region may be designed according to the needs of a display panel corresponding to the backlight structure. For example, the light region may be in the shape of a hexagon or octagon or the like.

This embodiment of the present disclosure is not limited to the number of light-emitting units in the light region being three, four, five, seven, or nine as shown in FIGS. 1 to 19. The number can be set according to the position and size of the light-emitting units, for example, the number of light-emitting units in the light region may be six, eight, ten, eleven, twelve, etc.

In the backlight structure provided in the embodiment of the present disclosure, the number of light-emitting units in the light region, the side length of the M-sided polygon, the pitch of the light region, and the included angle between the side of the M-sided polygon and the first direction or the second direction are set in a coordinated manner, which is conducive to increasing the light intensity at the edge position of the light region, thereby improving the light emitting uniformity of the light region.

Figure 20:
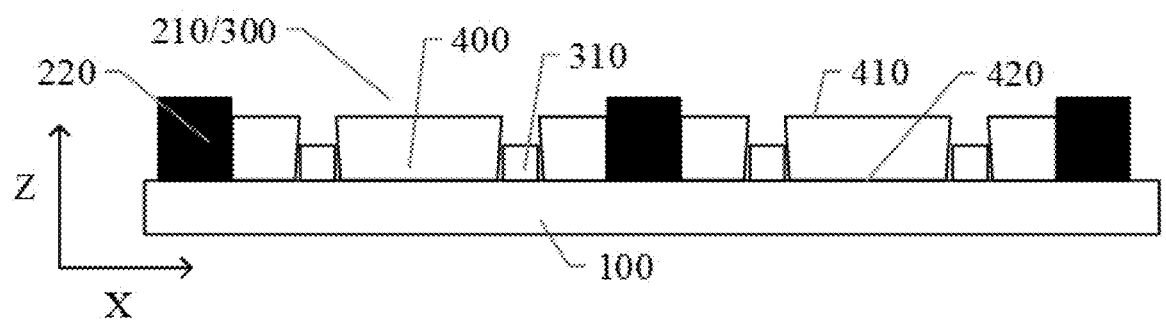
FIG. 20 is a schematic diagram of a partial cross-section cut along line AA' shown in FIG. 1 according to another example of an embodiment of the present disclosure.
Figure 21:
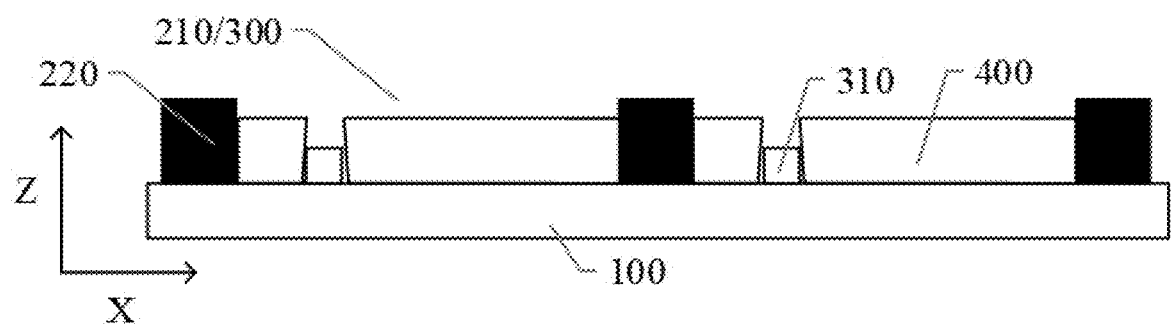
FIG. 21 is a schematic diagram of a partial cross-section cut along line BB' shown in FIG. 10 according to another example of an embodiment of the present disclosure.

FIG. 20 is a schematic diagram of a partial cross-section cut along line AA' shown in FIG. 1 according to another example of an embodiment of the present disclosure. FIG. 21 is a schematic diagram of a partial cross-section cut along line BB' shown in FIG. 10 according to another example of an embodiment of the present disclosure.

In some examples, as shown in FIGS. 20 and 21, the backlight structure further includes a flat adhesive 400 located between a barrier wall 220 and each light-emitting unit 310, and between two adjacent light-emitting units 310. A thickness of the flat adhesive 400 is not less than a height of the light-emitting unit 310 and is less than a thickness of the barrier wall 220. An orthographic projection, on the substrate 100, of a surface of one side of the flat adhesive 400 close to the substrate 100 is completely located in an orthographic projection, on the substrate 100, of a surface of one side of the flat adhesive 400 away from the substrate 100.

For example, as shown in FIGS. 20 and 21, the flat adhesive 400 may fill at least a portion of a gap between the barrier wall 220 and the light-emitting unit 310, and at least a portion of a gap between adjacent light-emitting units 310.

For example, as shown in FIGS. 20 and 21, the thickness of the flat adhesive 400 may be greater than or equal to the height of the light-emitting unit 310.

For example, as shown in FIGS. 20 and 21, the flat adhesive 400 may be made of white oil. For example, the thickness of the flat adhesive 400 may be 50 μm. For example, the thickness of the flat adhesive 400 may be greater than 90 μm. For example, the thickness of the flat glue 400 may be less than 250 μm. For example, the thickness of the flat glue 400 may be less than 200 μm. For example, the thickness of the flat glue 400 may be less than 180 μm. For example, the thickness of the flat glue 400 may be less than 150 μm. For example, the thickness of the flat glue 400 may be less than 120 μm. For example, the thickness of the flat glue 400 may be less than 100 μm.

In some examples, as shown in FIGS. 20 and 21, the cross section of the flat adhesive 400 intercepted by a plane (e.g. plane XZ) where a line connecting centers of the two adjacent light-emitting units 310 is located is in the shape of a trapezoid, a length of a first base side 410 of the trapezoid away from the substrate 100 is greater than a length of a second base side 420 of the trapezoid close to the substrate 100, a distance between endpoints, close to each other, of an orthographic projection of the first base side 410 and an orthographic projection of the second base side 420 on the substrate 100 is 17 to 32 μm, and the plane where the line connecting centers of the two adjacent light-emitting units 310 is located is perpendicular to the substrate 100.

For example, as shown in FIGS. 20 and 21, the line connecting centers of the first base side 410 and the second base side 420 is perpendicular to the substrate 100. For example, a length difference between the first base side 410 and the second base side 420 on one side of the center line, perpendicular to the substrate 100, of the trapezoid may be 17 to 32 μm.

For example, a difference in thickness of the flat adhesive 400 at different positions may be less than 10% of the maximum thickness of the flat adhesive 400. For example, the difference in thickness of the flat adhesive 400 at different positions may be less than 8% of the maximum thickness of the flat adhesive 400.

For example, the thickness of the flat adhesive 400 is 49.79 μm, the length difference between the first base side 410 and the second base side 420 on one side of the center line, perpendicular to the substrate 100, of the trapezoid may be 28.93 μm, and the length difference between the first base side 410 and the second base side 420 on the other side of the center line, perpendicular to the substrate 100, of the trapezoid may be 30.9 μm.

For example, the thickness of the flat adhesive 400 is 47.29 μm, the length difference between the first base side 410 and the second base side 420 on one side of the center line, perpendicular to the substrate 100, of the trapezoid may be 26.3 μm, and the length difference between the first base side 410 and the second base side 420 on the other side of the center line, perpendicular to the substrate 100, of the trapezoid may be 29.59 μm.

For example, the thickness of the flat adhesive 400 is 51.28 μm, the length difference between the first base side 410 and the second base side 420 on one side of the center line, perpendicular to the substrate 100, of the trapezoid may be 18.41 μm, and the length difference between the first base side 410 and the second base side 420 on the other side of the center line, perpendicular to the substrate 100, of the trapezoid may be 26.96 μm.

For example, the thickness of the flat adhesive 400 is 51.94 μm, the length difference between the first base side 410 and the second base side 420 on one side of the center line, perpendicular to the substrate 100, of the trapezoid may be 26.3 μm, and the length difference between the first base side 410 and the second base side 420 on the other side of the center line, perpendicular to the substrate 100, of the trapezoid may be 27.61 μm.

In the backlight structure of the present disclosure, the cross-section of the flat adhesive is set to be a trapezoid, such as an undercut structure, so it is possible to prevent the flat adhesive from eroding the pad electrically connected to the light-emitting unit (e.g., the pad 321 shown in FIG. 2A) when the flat adhesive is subjected to heat extension, and moreover, it is possible to prevent changes in light emitting characteristics due to different refractive indexes caused when light rays emitted by the light-emitting unit exit through the flat adhesive.

Figure 22:
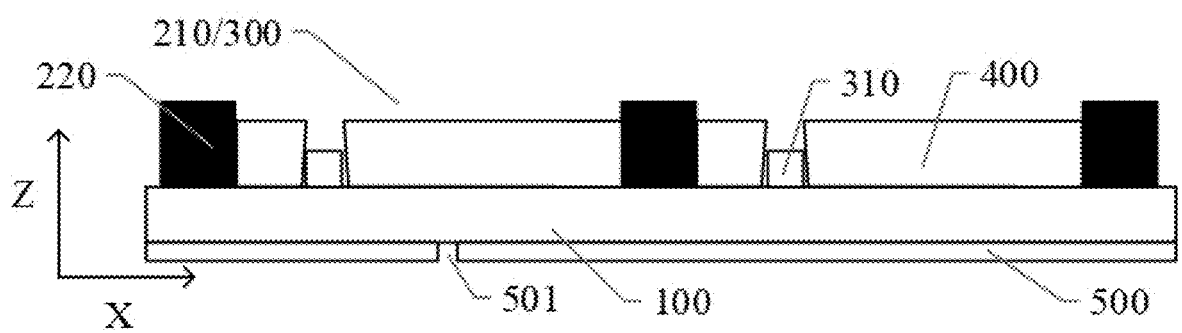
FIG. 22 is a schematic diagram of a partial cross-sectional structure cut along line BB' shown in FIG. 10 according to another example of an embodiment of the present disclosure.

FIG. 22 is a schematic diagram of a partial cross-sectional structure cut along line BB' shown in FIG. 10 according to another example of an embodiment of the present disclosure.

In some examples, as shown in FIG. 22, the substrate 100 is provided with a thermally conductive adhesive 500 on one side of the substrate 100 away from the light-emitting units 310, and the thermally conductive adhesive 500 is provided with at least one hole 501.

For example, as shown in FIG. 22, the black thermally conductive adhesive having a thickness of less than 1 μm is adhered to the entire side of the substrate 100 away from the light-emitting units 310 to play a role in heat dissipation.

For example, as shown in FIG. 22, the hole 501 may have a diameter of 1.5 mm. For example, the number of holes 501 may be greater than 100, such as 29*18. The holes are provided in the thermally conductive adhesive, which helps to exhaust when the thermally conductive adhesive adheres to the substrate to prevent the thermally conductive adhesive from wrinkling.

For example, the side of the substrate 100 away from the light-emitting unit 310 may also be provided with a grounding conductor, such as a copper conductor. For example, the copper conductor may have a length of 0.45 mm.

For example, the side of the substrate 100 facing the light-emitting units 310 may also be provided with a flat adhesive having a thickness of 0.3 μm. For example, a white dam may be provided at the periphery of each light region, e.g., the white dam may have a width of 0.5 mm and a height of 0.25 mm, in order to play a role in increasing the brightness and improving the halo effect.

Figure 23:
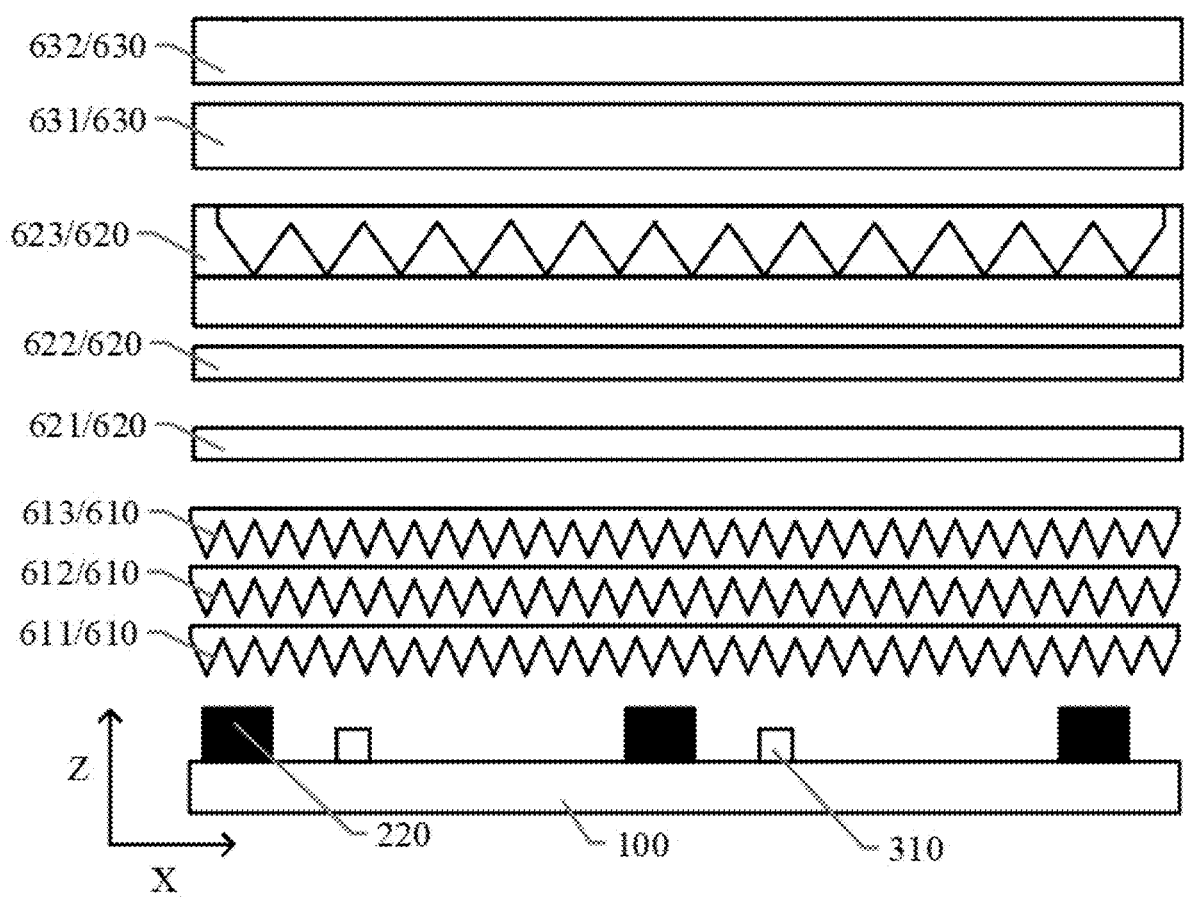
FIG. 23 is a schematic diagram of a partial cross-section of the backlight structure including the substrate, the barrier wall, and light-emitting units shown in FIG. 11.

FIG. 23 is a schematic diagram of a partial cross-section of the backlight structure including the substrate, the barrier wall, and light-emitting units shown in FIG. 11.

In some examples, as shown in FIG. 23, the backlight structure further includes a light diffusion structure 610 located on a side of the light-emitting unit 310 away from the substrate 100. The light diffusion structure 610 includes at least one layer of diffusion film. For example, the light diffusion structure 610 includes three layers of diffusion films 611, 612, and 613, each of which has a thickness of 0.05 to 0.2 mm.

For example, the different diffusion films may have the same or different thickness.

For example, as shown in FIG. 23, the thickness of the diffusion film 611 is 0.12 mm, the thickness of the diffusion film 612 is 0.13 mm, and the thickness of the diffusion film 613 is 0.13 mm. For example, the thickness of the diffusion film 611 is 0.085 mm, the thickness of the diffusion film 612 is 0.19 mm, and the thickness of the diffusion film 613 is 0.14 mm. For example, the three diffusion films 611, 612, and 613 may all have a thickness of 0.19 mm. For example, the weight of the diffusion film may be 14.7 g. For example, the weight of the diffusion film 611 is 10.25 g, the weight of the diffusion film 612 is 14.31 g, and the weight of the diffusion film 613 is 20.5 g.

In some embodiments, as shown in FIG. 23, the backlight structure further includes a color conversion structure 620 located on a side of the light diffusion structure 610 away from the light-emitting unit 310. The color conversion structure 620 includes a color conversion film 622 configured to convert first color light into second color light, the first color light includes blue light, and the second color light includes at least one of red light and green light. For example, the color conversion film converts the blue light to the red light. For example, the color conversion film converts the blue light to the green light.

In some examples, as shown in FIG. 23, the color conversion structure 620 further includes a prism 623 located on a side of the color conversion film 622 away from the light-emitting units 310.

For example, the prism 623 may have a total thickness of 0.2 mm, and the prism 623 includes a plurality of sub-prisms. Each sub-prism may have a length of 39 μm, a width of 39 μm, and a height of 17 μm.

For example, a ratio of the pitch of the sub-prisms to the pitch of the light-emitting units is greater than 100 and less than 150.

For example, as shown in FIG. 23, the color conversion structure 620 further includes a fluorescent powder composite film 621 located on a side of the color conversion film 622 close to the substrate 100.

For example, as shown in FIG. 23, a thickness of the color conversion structure 620 may be 0.2 to 0.4 mm. For example, the thickness of the color conversion structure 620 may be 0.21 mm. For example, the thickness of the color conversion structure 620 may be 0.27 mm. For example, the thickness of the color conversion structure 620 may be 0.308 mm. For example, the weight of the color conversion structure 620 may be 27 g. For example, the weight of the color conversion structure 620 may be 30.78 g.

In some examples, as shown in FIG. 23, the backlight structure further includes a prism structure 630 located on a side of the color conversion structure 620 away from the light-emitting units 310. The prism structure 630 includes at least one prism layer, and the prism layer has a thickness of 0.05 to 0.2 mm.

For example, as shown in FIG. 23, the prism structure 630 includes a prism layer 631 and a prism layer 632. For example, the thicknesses of the prism layer 631 and the prism layer 632 may be the same or different.

For example, as shown in FIG. 23, the prism layer 631 may have a thickness of 0.1 mm and the prism layer 632 may have a thickness of 0.11 mm. For example, the thickness of the prism layer 631 may be 0.09 mm and the thickness of the prism layer 632 may be 0.24 mm.

For example, the prism structure 630 may further include only one prism layer. The prism layer may have a thickness of 0.16 mm.

For example, the backlight structure may further include a diffusion plate (not shown in the figure) located on a side of the prism structure 630 away from the substrate 100.

Figure 24:
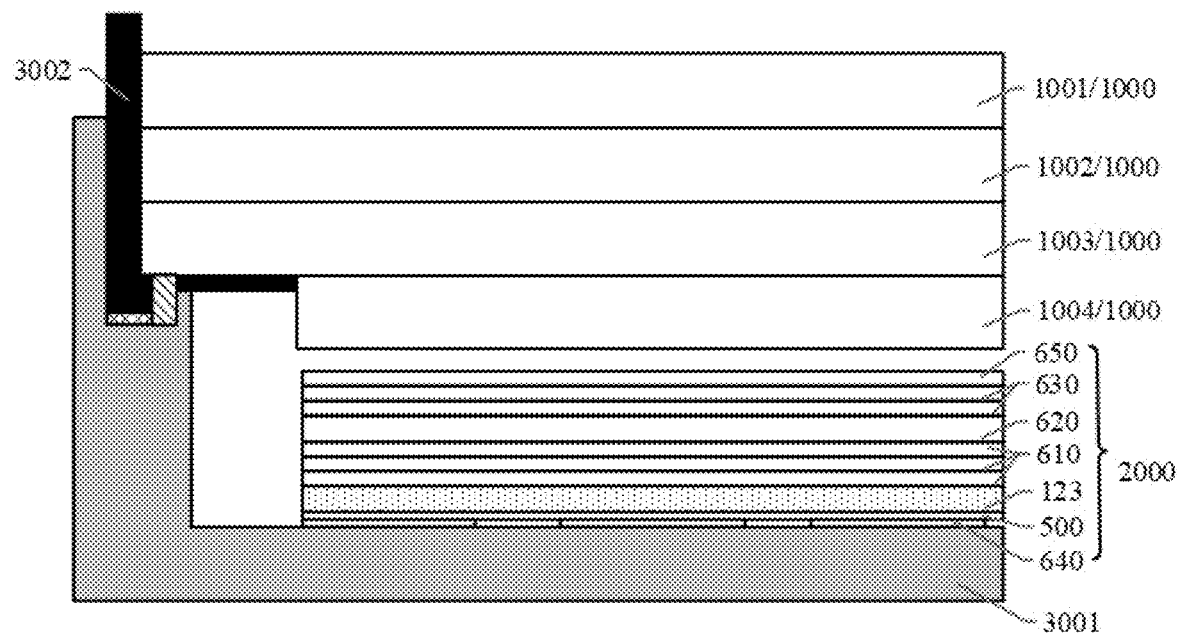
FIG. 24 is a schematic diagram of a partial cross-sectional structure of a display device according to another embodiment of the present disclosure.

FIG. 24 is a schematic diagram of a partial cross-sectional structure of a display device according to another embodiment of the present disclosure. As shown in FIG. 24, the display device includes a display panel 1000 and a backlight structure 2000, and the display panel 1000 is located on a light exit side of the backlight structure 2000.

The backlight structure in the display device provided in the present disclosure may be any of the backlight structures provided in the above embodiments, the number of light-emitting units in the light region, the side length of the M-sided polygon, the pitch of the light region, and the included angle between the side of the M-sided polygon and the first direction or the second direction are set in a coordinated manner, which is conducive to increasing the light intensity at the edge position of the light region, thereby improving the light emitting uniformity of the light region.

For example, as shown in FIG. 24, the backlight structure 2000 further includes a diffusion plate 650 located on a side of the prism structure 630 away from the substrate 100. For example, the diffusion plate 650 may have a thickness of 0.24 mm. For example, the diffusion plate 650 may have a weight of 15.2 g.

For example, as shown in FIG. 24, the display panel 1000 may be a liquid crystal display panel. The liquid crystal display panel may include an array substrate 1003, an opposite substrate 1002, and a liquid crystal layer (not shown) located between the array substrate 1003 and the opposite substrate 1002.

For example, one side of the array substrate 1003 facing toward the opposite substrate 1002 may include a plurality of gate lines extending in one direction and a plurality of data lines extending in another direction. The plurality of gate lines and the plurality of data lines intersect to define a plurality of pixel units in an array arrangement. The plurality of pixel units may be arranged as a pixel array. Each pixel unit may include a pixel electrode and a thin-film transistor. The gate lines are connected to gates of the thin-film transistors to control on or off of the thin-film transistors. The pixel electrode is connected to one of source and drain electrodes of the thin-film transistor. The data line is connected to the other of the source and drain electrodes of the thin-film transistor. The data lines input voltage signals required for image displaying to the pixel electrode through the thin-film transistor to realize displaying of the array substrate.

For example, the opposite substrate 1002 may be a color film substrate, and a color film layer corresponding to the pixel units and a black matrix covering the structures such as the gate lines and the data lines that are located in a non-display area may be provided on a side of the color film substrate facing toward the array substrate 1003. For example, a common electrode disposed opposite the pixel electrode may also be provided on the side of the color film substrate facing toward the array substrate 1003. The common electrode is configured to apply a common voltage to generate an electric field with the pixel electrode to drive the deflection of liquid crystal molecules in the liquid crystal layer. The liquid crystal molecules are deflected to change the transmittance of the liquid crystal layer, thereby realizing displaying of a desired grayscale image.

For example, as shown in FIG. 24, the display panel 1000 may further include a first polarizer 1004 disposed on a side of the array substrate 1003 away from the opposite substrate 1002 and a second polarizer 1001 disposed on a side of the opposite substrate 1002 away from the array substrate 1003. The first polarizer 1004 includes a light transmission axis extending in a direction DI1 and polarizes backlight incident thereon in the direction DI1. The second polarizer 1001 includes a light transmission axis extending in a direction DI2 and polarizes a light ray incident thereon in the direction DI2. For example, the light transmission axis of the first polarizer 1004 and the light transmission axis of the second polarizer 1001 are perpendicular to each other.

For example, as shown in FIG. 24, the display device further includes a plastic frame 3002. The plastic frame 3002 is used for supporting the display panel 1000.

For example, as shown in FIG. 24, the display device further includes a support frame 3001. The support frame 3001 includes an integrated structure of an outer frame and a back frame. The support frame is used for supporting the plastic frame 3002 and the backlight structure 2000.

For example, as shown in FIG. 24, the display device further includes a fixing adhesive 640 disposed on a side of the thermally conductive adhesive 500 away from a light plate 123 that includes a substrate, light-emitting units, and a barrier wall pattern, and the other structures. The fixing adhesive 640 is used for fixing the backlight structure 2000 to the support frame 3001.

For example, as shown in FIG. 24, a thickness of the second polarizer 1001 may be 0.28 mm. For example, a thickness of the opposite substrate 1002 may be 0.25 mm. For example, a thickness of the array substrate 1003 may be 0.25 mm. For example, a thickness of the first polarizer 1004 may be 0.11 mm. For example, the sum of weights of the second polarizer 1001, the opposite substrate 1002, the array substrate 1003, and the first polarizer 1004 may be 159.3 g.

For example, as shown in FIG. 24, the thickness of the second polarizer 1001 may be 0.122 mm. For example, the thickness of the opposite substrate 1002 may be 0.2 mm. For example, the thickness of the array substrate 1003 may be 0.2 mm. For example, the thickness of the first polarizer 1004 may be 0.087 mm. For example, the sum of the weights of the second polarizer 1001, the opposite substrate 1002, the array substrate 1003, and the first polarizer 1004 may be 105.47 g.

For example, as shown in FIG. 24, the thickness of the light plate 123 may be 0.27 mm, and a light plate protection adhesive is provided between the light plate 123 and the thermally conductive adhesive 500. For example, the thickness of the light plate protection adhesive may be 0.31 mm, and the thickness of the thermally conductive adhesive 500 may be 0.09 mm, and the total weight of the light plate, the light plate protection adhesive, and the thermally conductive adhesive may be 76.6 g.

For example, as shown in FIG. 24, the thickness of the light plate 123 may be 0.25 mm, and the side of the light plate 123 away from the light diffusing structure 610 may be provided with only the light plate protection adhesive, and no longer be provided with the thermally conductive adhesive. For example, the thickness of the light plate protection adhesive may be 0.1 mm, and the total weight of the light plate and the light plate protection adhesive may be 41.41 g.

For example, as shown in FIG. 24, the thickness of the fixing adhesive 640 may be 0.03 mm in the case that the thermally conductive adhesive 500 is provided. For example, in the case that the thermally conductive adhesive 500 is not provided, the thickness of the fixing adhesive 640 may be 0.1 mm.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. The protection scope of the present disclosure should be based on the protection scope of the claims.

The invention claimed is:

1. A backlight structure, comprising:
a substrate;
a barrier wall pattern, located on the substrate, and comprising a plurality of openings arrayed along a first direction and a second direction and a barrier wall surrounding the openings, the plurality of openings being configured to define a plurality of light regions, and the first direction intersecting the second direction; and
a plurality of light-emitting units, located on the substrate, and distributed in the plurality of light regions,
wherein the substrate comprises a central region and an edge region surrounding the central region, each light region at least in the central region is provided with at least three light-emitting units, centers of M light-emitting units, closest to vertex angles of the light region, among the at least three light-emitting units are sequentially connected to form an M-sided polygon, and a distance between a center of the M-sided polygon and a center of the light region is less than 10% of a pitch of the light region, and an included angle between the first direction and each side of the M-sided polygon and an included angle between the second direction and each side of the M-sided polygon are both greater than 0 degrees.

2. The backlight structure according to claim 1, wherein a ratio of lengths of different sides of the M-sided polygon is 0.9 to 1.1, and a ratio of the pitch of the light region to a side length of the M-sided polygon is 1.7 to 2.3.

3. The backlight structure according to claim 2, wherein the pitch of the light region is P, each of at least some of the light regions comprises N light-emitting units, where N≥M, a distance from a center of an i-th light-emitting unit to a vertex angle of the light region is $L_i$, i takes a value in the range from 1 to N, and $L_i$, P, and N satisfy: $8.5 \geq P \times (1/L_1 + 1/L_2 + \ldots + 1/L_N) \geq 6.3$.

4. The backlight structure according to claim 2, wherein a light intensity distribution I of the light-emitting unit satisfies: $I=I_0 \cos m\alpha$, $I_0$ is the light intensity distribution along a direction of a normal perpendicular to a light exit surface of the light-emitting unit, α is an included angle between a light-emitting direction of the light-emitting unit and the normal, $m=(-\ln 2)/(\ln \cos \alpha_{1/2})$, $\alpha_{1/2}$ is an included angle between the light-emitting direction and the normal when the light intensity is reduced to half of the light intensity corresponding to the normal direction, and a light ray emitted by the light-emitting unit has an optical path of h in the normal direction; and each of the at least some of the light regions comprises N light-emitting units, where N≥M, a distance from a center of an i-th light-emitting unit to a vertex angle of the light region is $L_i$, i takes a value in the range from 1 to N, and $L_i$, h, and N satisfy:

$$0.5 \geq \{\cos m \times [(\pi/2)-(h/L_1)] + \cos m \times [(\pi/2)-(h/L_2)] + \ldots + \cos m \times [(\pi/2)-(h/L_N)]\} \geq 0.23.$$

5. The backlight structure according to claim 2, wherein a ratio of a light intensity at an edge position of the light region to a light intensity at a center position of the light region is not less than 0.5.

6. The backlight structure according to claim 2, wherein each of the at least some of the light regions comprises at least four light-emitting units, the at least four light-emitting units are arranged to form the M-sided polygon, and an included angle between one of the first direction and the second direction and at least one side of the M-sided polygon is 12 to 18 degrees.

7. The backlight structure according to claim 6, wherein each of the at least some of the light regions is in a shape of a first square, each of the at least some of the light regions comprises at least four light-emitting units, the M-sided polygon is a second square, and an included angle between a diagonal of the first square and a diagonal of the second square is 12 to 18 degrees.

8. The backlight structure according to claim 1, wherein at least some of the light regions are in a shape of a rectangle, and two adjacent sides of the rectangle extend along the first direction and the second direction, respectively.

9. The backlight structure according to claim 1, wherein the light-emitting units disposed in each light region are electrically connected, and the barrier wall comprises a shading material.

10. The backlight structure according to claim 1, wherein the light-emitting unit comprises a light-emitting diode chip and an encapsulation structure configured to encapsulate the light-emitting diode chip, and there is a spacing between encapsulation structures of adjacent light-emitting units.

11. The backlight structure according to claim 10, wherein a maximum size of the light-emitting unit in a direction parallel to the substrate is not greater than 500 μm.

12. The backlight structure according to claim 7, wherein the at least four light-emitting units comprise four light-emitting units, and centers of the four light-emitting units are sequentially connected to form the second square.

13. The backlight structure according to claim 7, wherein the at least four light-emitting units comprise five light-emitting units, and centers of four light-emitting units, located at outermost edges, of the five light-emitting units are sequentially connected to form the second square.

14. The backlight structure according to claim 2, wherein each of the at least some of the light regions comprises three light-emitting units, centers of the three light-emitting units are sequentially connected to form a triangle, and an included angle between one of the first direction and the second direction and one side of the triangle is less than 5 degrees.

15. A display device, comprising:
a display panel, and
a backlight structure according to claim 1,
wherein the display panel is located on a light exit side of the backlight structure.

16. A backlight structure, comprising:
a substrate;
a barrier wall pattern, located on the substrate, and comprising a plurality of openings arrayed along a first direction and a second direction and a barrier wall surrounding the openings, the plurality of openings being configured to define a plurality of light regions, and the first direction intersecting the second direction; and
a plurality of light-emitting units, located on the substrate, and distributed in the plurality of light regions,
wherein at least three light-emitting units are disposed in each of at least some light regions, centers of M light-emitting units of the at least three light-emitting units closest to vertex angles of the light region are sequentially connected to form an M-sided polygon, a distance between a center of the M-sided polygon and a center of the light region is less than 10% of a pitch of the light region, a ratio of lengths of different sides of the M-sided polygon is 0.9 to 1.1, and a ratio of the pitch of the light region to a side length of the M-sided polygon is 1.7 to 2.3; and
at least one side of the M-sided polygon is parallel to at least one of the first direction and the second direction.

17. The backlight structure according to claim 16, wherein each of the at least some of the light regions comprises N light-emitting units, where N≥M, a distance from a center of an i-th light-emitting unit to a vertex angle of the light region is $L_i$, i takes a value in the range from 1 to N, and $L_i$, P, and N satisfy: $8.5 \geq P \times (1/L_1 + 1/L_2 + \ldots + 1/L_N) \geq 6.3$.

18. The backlight structure according to claim 16, wherein a light intensity distribution I of the light-emitting unit satisfies: $I=I_0 \cos m\alpha$, $I_0$ is the light intensity distribution along a direction of a normal perpendicular to a light exit surface of the light-emitting unit, α is an included angle between a light-emitting direction of the light-emitting unit and the normal, $m=(-\ln 2)/(\ln \cos \alpha_{1/2})$, $\alpha_{1/2}$ is an included angle between the light-emitting direction and the normal when the light intensity is reduced to half of the light intensity corresponding to the normal direction, and a light ray emitted by the light-emitting unit has an optical path of h in the normal direction; and each of the at least some of the light regions comprises N light-emitting units, where N≥M, a distance from a center of an i-th light-emitting unit to a vertex angle of the light region is $L_i$, i takes a value in the range from 1 to N, and $L_i$, h, and N satisfy:

$$0.5 \geq \{\cos m \times [(\pi/2)-(h/L_1)] + \cos m \times [(\pi/2)-(h/L_2)] + \ldots + \cos m \times [(\pi/2)-(h/L_N)]\} \geq 0.23.$$

19. The backlight structure according to claim 16, wherein a ratio of a light intensity at an edge position of the light region to a light intensity at a center position of the light region is not less than 0.5.

20. The backlight structure according to claim 16, wherein each of the at least some of the light regions comprises at least four light-emitting units, the at least four light-emitting units are arranged to form the M-sided polygon, and an included angle between one of the first direction and the second direction and at least one side of the M-sided polygon is 0 degrees;

each of the at least some of the light regions is in a shape of a first square, each of the at least some of the light regions comprises at least four light-emitting units, the M-sided polygon is a second square, and an included angle between a diagonal of the first square and a diagonal of the second square is 0 degrees.

* * * * *